(12) United States Patent
Carden

(10) Patent No.: US 11,070,137 B1
(45) Date of Patent: Jul. 20, 2021

(54) RESONANT CORE POWER SUPPLY

(71) Applicant: Patrick Carden, Moorpark, CA (US)

(72) Inventor: Patrick Carden, Moorpark, CA (US)

( * ) Notice: Subject to any disclaimer, the term of this patent is extended or adjusted under 35 U.S.C. 154(b) by 0 days.

(21) Appl. No.: 17/027,985

(22) Filed: Sep. 22, 2020

Related U.S. Application Data

(63) Continuation of application No. 16/988,621, filed on Aug. 8, 2020.

(51) Int. Cl.
| | |
|---|---|
| *H02M 3/335* | (2006.01) |
| *G01R 19/175* | (2006.01) |
| *H03K 5/24* | (2006.01) |
| *H02M 1/32* | (2007.01) |
| *H02M 1/42* | (2007.01) |
| *H02M 1/00* | (2006.01) |

(52) U.S. Cl.
CPC ...... *H02M 3/33576* (2013.01); *G01R 19/175* (2013.01); *H02M 1/32* (2013.01); *H03K 5/24* (2013.01); *H02M 1/4241* (2013.01); *H02M 2001/0009* (2013.01); *H02M 2001/0025* (2013.01)

(58) Field of Classification Search
CPC ...... H02M 3/33576; H02M 1/32; H02M 1/40; H02M 2001/0009; H02M 2001/0025; H02M 1/4241; G01R 19/175; H03K 5/24; G05F 1/13; G05F 1/32; G05F 7/00; H02P 13/00; H02P 13/12; H02H 9/002

See application file for complete search history.

(56) References Cited

U.S. PATENT DOCUMENTS

| | | | | |
|---|---|---|---|---|
| 3,573,605 | A | * | 4/1971 | Hart ................. G05F 3/06 323/248 |
| 4,400,624 | A | * | 8/1983 | Ebert, Jr. ............. H02J 9/062 307/43 |
| 5,510,692 | A | * | 4/1996 | Kasper .............. H02J 7/022 320/160 |
| 5,804,890 | A | * | 9/1998 | Kakalec .............. H02J 9/062 307/64 |
| 6,112,136 | A | * | 8/2000 | Paul .................. H02J 9/062 700/293 |
| 6,218,744 | B1 | * | 4/2001 | Zahrte, Sr. ........... G16H 10/40 307/64 |
| 6,272,025 | B1 | * | 8/2001 | Riggio ................ H02M 1/14 363/24 |
| 6,348,782 | B1 | * | 2/2002 | Oughton, Jr. ........ H02J 9/062 323/284 |
| 6,594,160 | B2 | | 7/2003 | Wagner |
| 8,618,749 | B2 | | 12/2013 | Kuennen |
| 9,871,459 | B2 | | 1/2018 | Harrison |
| 2005/0269500 | A1 | * | 12/2005 | Potvin ................ H01J 49/022 250/281 |
| 2007/0052397 | A1 | * | 3/2007 | Thompson ........... H02M 5/293 323/223 |
| 2007/0170910 | A1 | * | 7/2007 | Chang ................ H01C 1/16 333/172 |

(Continued)

*Primary Examiner* — Fred E Finch, III
*Assistant Examiner* — Kevin H Sprenger
(74) *Attorney, Agent, or Firm* — Paul D. Chancellor; Ocean Law

(57) ABSTRACT

A resonant core power supply includes a core with excitation, resonant, and load windings where the resonant winding is coupled to a tank circuit and a controller manipulates the phase, amplitude and waveform of an excitation signal applied to the excitation winding.

19 Claims, 29 Drawing Sheets

(56) References Cited

U.S. PATENT DOCUMENTS

| | | | |
|---|---|---|---|
| 2011/0198932 A1* | 8/2011 | Le | H01F 27/40 307/66 |
| 2015/0085535 A1* | 3/2015 | Lin | H02M 1/4241 363/21.02 |
| 2016/0087687 A1* | 3/2016 | Kesler | H04B 5/0037 307/104 |
| 2016/0322907 A1* | 11/2016 | Hwang | H02M 1/4208 |
| 2017/0019031 A1* | 1/2017 | Sagneri | H02M 7/155 |
| 2017/0085183 A1* | 3/2017 | Notsch | H02M 1/12 |
| 2017/0126134 A1* | 5/2017 | Young | H02M 1/44 |
| 2018/0128859 A1* | 5/2018 | Shamir | G01R 15/18 |
| 2018/0323616 A1* | 11/2018 | Sun | H02J 3/382 |
| 2019/0089197 A1* | 3/2019 | Mao | H01F 3/14 |
| 2020/0014243 A1* | 1/2020 | Kim | H02M 3/33569 |
| 2020/0382012 A1* | 12/2020 | Ksiazek | H02M 3/33592 |

* cited by examiner

Phase Angle in Radians

FIGURE 5I not used

RESONANT CORE POWER SUPPLY

PRIORITY CLAIM

This application is a continuation of U.S. patent application Ser. No. 16/988,621 filed Aug. 8, 2020 and titled Resonant Core Power Supply. This application incorporates by reference U.S. Pat. Nos. 8,618,749, 9,871,459, and 6,594,160 including descriptions of resonant devices and tank circuits.

BACKGROUND OF THE INVENTION

Field of the Invention

The invention relates to the field of manufactured electrical power supply devices. More particularly, the present invention relates to a resonant core power supply for use in supplying electric power.

Description of Related Art

Electrical power supplies are commonly available utilizing various technologies. For example, power supply variants include linear power supplies and switching power supplies. Like the present invention, linear supplies do not use switching semiconductors. Unlike known linear supplies, embodiments of the present invention include a primary winding creating flux around a magnetic core that passes through a resonant winding inducing voltage therein and the resonant winding in a tank circuit to create a flux flow around the core.

SUMMARY OF THE INVENTION

A resonant core power supply includes a core with windings for creating core flux flows and for inducing winding voltages. In an embodiment, the resonant core power supply comprises: a core having magnetic properties; excitation, resonant, and load windings on the core; the excitation winding for receiving an excitation signal and creating a first flux flow; the resonant winding connected to one or more capacitors including a resonant capacitor to form a tank circuit having a resonant frequency $F_{RES}$ matched with the excitation signal frequency; the first flux flow passing through the resonant winding and inducing a voltage therein; the resonant winding creating a second flux flow; and, for powering an electrical load, a third flux flow passing through a load winding and inducing a voltage therein; wherein controller feedback derived from the tank circuit influences the phase, amplitude, and waveform of the excitation signal to maintain the phase, amplitude, and waveform of the first flux flow.

In various embodiments the resonant core power supply provides a load with electric power that may be any of stable electric power, conditioned electric power, filtered electric power, and uninterruptable electric power.

BRIEF DESCRIPTION OF THE DRAWINGS

The present invention is described with reference to the accompanying FIG.s. These FIG.s, incorporated herein and forming part of the specification, illustrate embodiments of the invention and, together with the description, further serve to explain its principles enabling a person skilled in the relevant art to make and use the invention. The invention may include some or all of the features illustrated.

FIG. 5I is not used.

DETAILED DESCRIPTION OF THE PREFERRED EMBODIMENTS

The disclosure provided in the following pages describes examples of some embodiments of the invention. The designs, figures, and description are non-limiting examples of the embodiments they disclose. For example, other embodiments of the disclosed device and/or other methods and uses may or may not include the features described herein. Moreover, disclosed advantages and benefits may apply to only certain embodiments of the invention and should not be used to limit the disclosed invention.

As used herein, the term "coupled" includes direct and indirect connections. Moreover, where first and second devices are coupled, intervening devices including active devices may be located therebetween.

1. Description of RCPS Device

Figure 1:
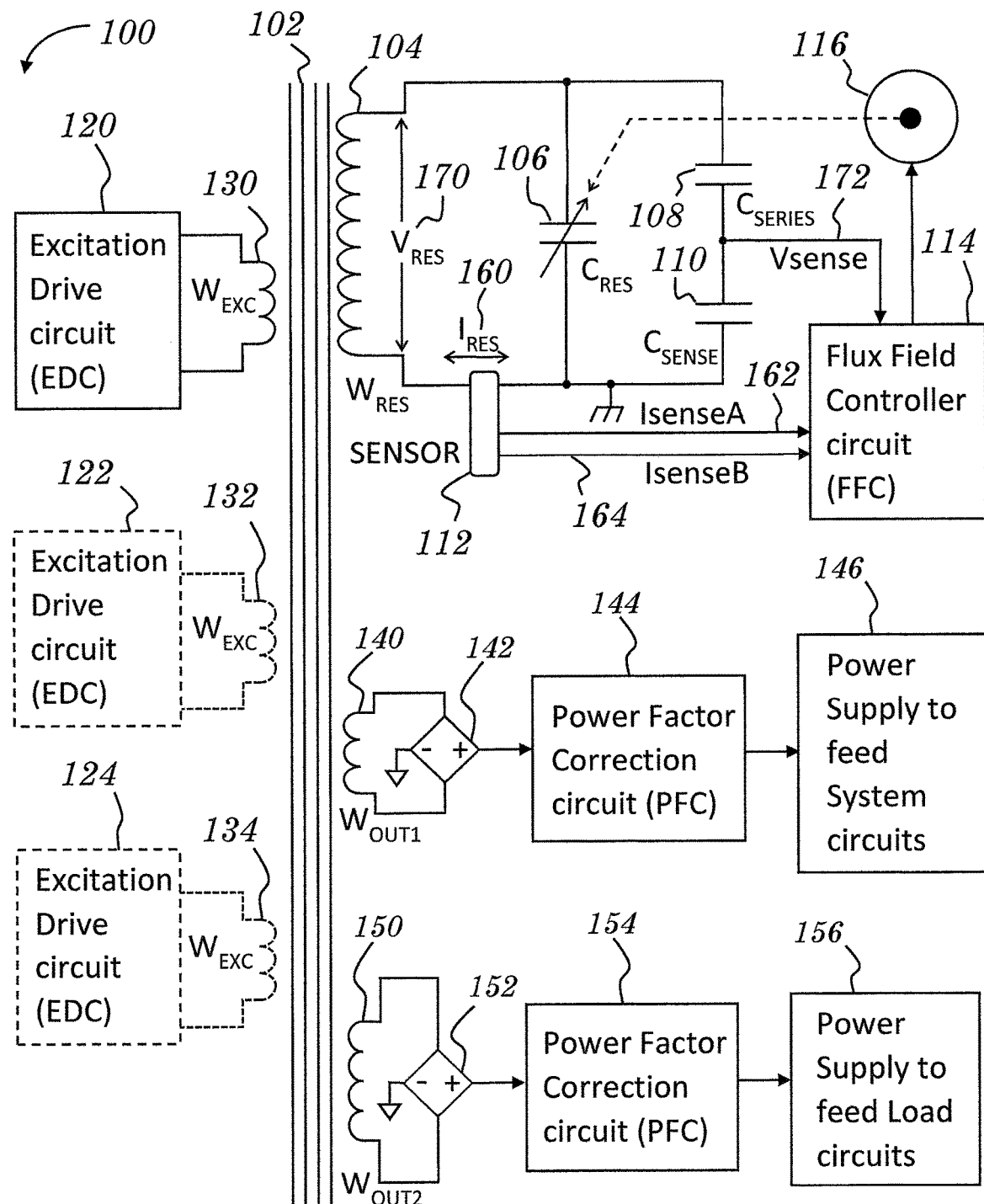
FIG. 1 shows an embodiment of a resonant core power supply.

FIG. 1 shows components 100 which may be included in a Resonant Core Power Supply (RCPS).

The following is an itemized list of basic components that may be used to form a Resonant core power supply (RCPS). Reference numbers correspond to those shown in FIG. 1.

A Resonant Magnetic Core (RCPS core) 102 includes windings 104, 130, 132, 134, 140, 150 wrapped around a magnetic core. A resonating magnetic flux field may be created and contained within this magnetic core.

A Resonant winding ($W_{RES}$) 104 which may have a particular self-inductance value. This winding is connected in parallel with the resonant capacitor 106 to form a resonant LC tank circuit 104, 106, 108, 110 (or 103). Resonant Voltage ($V_{RES}$) 170 across the LC tank circuit 103 consists of voltages across 104, 106, 108, 110. This LC tank circuit may determine the resonant frequency of the flux within the magnetic core 102.

A Resonant Capacitor ($C_{RES}$) 106 may be connected in parallel across resonant winding $W_{RES}$ 104 to form the resonant LC tank circuit 103. The LC tank circuit formed by 104, 106, 108, 110 (or 103) may have a high Q value. The $C_{RES}$ capacitor may require the means to make adjustment for example after leaving the factory. Tuning mechanism 116 is a motorized device used to mechanically adjust $C_{RES}$ automatically (software-controlled procedure) to avoid manual adjustments.

The natural resonant frequency of the LC tank formed by 104, 106, 108, 110 may be adjusted closely to the frequency of the excitation signal $V_{EXC}$ 170 fed into $W_{EXC}$ windings 130, 132, 134 coming from EDC units 120, 122, 124. If the natural resonant frequency of the LC tank circuit 103 differs or differs substantially from the frequency of the excitation signal ($V_{EXC}$) frequency, then the system may not resonate properly.

A voltage divider is comprised of capacitors $C_{SERIES}$ 108 and $C_{SENSE}$ 110 connected in series. The voltage divider may reduce the voltage of $V_{RES}$ 170 across $W_{RES}$ 104 and $C_{RES}$ 106 to provide a safe voltage level feedback signal ($V_{SENSE}$) to FFC 114. The combined capacitance of the two capacitors ($C_{SERIES}$ 108 and $C_{SENSE}$ 110) connected in series may be relatively insignificant compared to $C_{RES}$ 106 such that it has minimal effect in the $C_{RES}$ capacitance value.

To maximize the amount of stored energy held within the RCPS's core 102, the designer may set the nominal operating voltage of $V_{RES}$ 170 to a relatively high voltage (thousands of volts). Without reducing the amplitude of the $V_{RES}$ voltage feedback signal by the divider (108 and 110 connected in series), the $V_{RES}$ 170 voltage level may exceed safe levels for low voltage circuitry. The amplitude of $V_{RES}$ 170 relates to the amplitude of the flux field within the core 102. The voltage feedback signal provided by this divider (108 and 110 connected in series) may have a substantially reduced voltage amplitude while still having a waveform similar to $V_{RES}$ 170 so that the amplitude and frequency of $V_{RES}$ 170 can be determined by the FFC unit 114.

Sensor 112 monitors the LC tank 103 resonant current $I_{RES}$ 160 passing through winding $W_{RES}$ 104 and resonant capacitor $C_{RES}$ 106. The sensor may be a passive current sense transformer, passive current sense resistor monitored by an amplifier, or an active current sensor such as a hall sensor.

Using either a current sense transformer or a hall element sensor provides a galvanically isolated output signal. Using a passive sense resistor provides immunity to magnetic field influences where the magnetic flux within the core might be strong enough to confuse the internal magnetic field that a current transformer or Hall sensor relies upon. The choice may depend upon the proximity to the magnetic core where the sensor is actually located. In some embodiments, the output from the current sensor allows the FFC 114 determine the following.

a. The resonant current level $I_{RES}$ 160.

b. The phase of the resonant flux field may allow FFC 114 to determine the phase of the EXCITATION signal to be fed to the EDC units 107 (or 107) during the next excitation cycle.

c. The stored resonant power (VA) of resonant flux field $P_{RES}$ may be determined by multiplying RMS values of $V_{RES}$ 170 by $I_{RES}$ 160.

d. Detect DC biased remnant flux due to asymmetric excitation in order to perform a remedial procedure by changing the excitation signal's waveform.

The Flux Field Controller (FFC) 114 may determine the timing (phase) and amplitude of the excitation signal. Feedback signals representing the $V_{RES}$ 170 amplitude and waveform are received from voltage divider (108 and 110 connected in series). A differential feedback signal, IsenseA 162 & IsenseB 164 from current sensor 112, represents the $I_{RES}$ LC tank 103 current. Voltage and Current feedback signals may be received by the FFC 114 to infer the following.

a. The magnitude of the stored energy (resonant power) may be based upon the amplitude of the voltage feedback signal, Vsense 172 (representing the $V_{RES}$ 170 amplitude provided by voltage divider (108 and 110 connected in series)) multiplied by the $I_{RES}$ current feedback IsenseA 162 & IsenseB 164 from current sensor 112.

b. The phase of the magnetic flux within the core 102 may be based upon the phase of the differential current feedback signal (IsenseA 162 & IsenseB 164) received by the current sensor 112.

c. The optimal peak voltage amplitude of the signal exciting windings 130, 132 and 134 may be determined by EDC units 120, 122 and 124. This affects or determines the operating amplitude of the resonant flux within the core 102.

d. While monitoring the frequency of $V_{RES}$ 170, it may be determined if frequency of the resonant flux field differs from the intended operating frequency of $F_{RES}$. Note that if the frequency has drifted beyond a certain limit, the FFC unit 114 may perform an automatic readjustment of $C_{RES}$ 106 by controlling the tuning mechanism 116.

e. Whether to perform automatic initial calibration of $C_{RES}$ via the FCC unit controlling the tuning mechanism 116. During initial start-up, the FFC unit 114 determines if the LC tank circuit 103 is set for the correct resonant frequency. In order to determine if the LC tank is tuned correctly, the FFC unit 114 injects a small test signal through one or more EDC units 120, 122 and 124 at the correct resonant frequency. The FFC unit 114 monitors the amplitude of the voltage feedback signal Vsense 172 provided by the voltage divider (108 and 110 connected in series) while simultaneously adjusting $C_{RES}$ 106 using the tuning mechanism 116. When the LC tank circuit resonates with the test signal, the voltage feedback 172 from the voltage divider (108 and 110 connected in series) will dramatically peak. By intentionally overshooting the adjustment, the FFC unit 114 can find when the highest peak amplitude is reached whereupon it backs up the adjustment to stop at the highest amplitude. This establishes the correct resonant frequency of the LC tank circuit 104, 106, and divider (108 in series with 110), connected in parallel.

f. The presence of DC biased remnant flux with monitoring and detection such that corrective action can be taken. For example, to correct or compensate for the presence of remnant flux, the FFC 114 modifies the waveform of the excitation signal by changing the excitation signal's duty cycle.

The RCPS may include a Motorized $C_{RES}$ tuning mechanism 116. Where voltage $V_{RES}$ 170 across $C_{RES}$ is high enough to present a safety threat to human life, manual adjustment of $C_{RES}$ during RCPS operation by be by a skilled technician of it may be avoided by an automated variable capacitor. The automated variable capacitor, for example a motorized variable capacitor, may provide advantages including the following.

a. Locating high voltage areas such as around the RCPS core 102 and $C_{RES}$ 106 in a sealed chassis, which would have a safety lock-out switch to shut down the RCPS if the chassis is opened. This would prevent anyone having access to the high voltage areas whenever the RCPS is operating.

b. Automated tuning performed by tuning mechanism 116 controlled by software inside the FFC 114 avoids the need to train anyone to make adjustments.

c. LC tank circuit drift correction. Whenever the FFC 114 has determined that the resonant frequency of the LC tank circuit 104, 106, 108, 110 (or 103) has drifted due to temperature or component aging, automatic re-adjustment can be performed without interfering with the RCPS unit's operation. This would happen in the background without requiring anyone to take action.

d. No need for training on adjustment of $C_{RES}$ 106. Since there would be no need to provide access to make manual adjustments, the threat of someone maliciously tampering with the adjustment would be prevented by blocking off all access unless the RCPS is shut down and disassembled.

e. $C_{RES}$ readjustment notice. Upon start-up, the FFC 114 determines if $C_{RES}$ 106 needs readjustment, and if needed then adjusts $C_{RES}$ 106 to the correct setting before allowing the RCPS to proceed with full operation.

An Excitation Drive Circuit (EDC) 120 amplifies the excitation signal $V_{EXC}$ created by the FFC 114. It then applies this voltage across the excitation winding that is connected to, in this case an excitation winding 130. There may be more than one EDC unit within an RCPS system. FIG. 1 shows three EDC units installed 107 along with associated $W_{EXC}$ windings 130, 132, 134. There can be many more EDC units installed with associated excitation windings. All of the EDC units shall be driven with the same or identical excitation $V_{EXC}$ signals in order to avoid having their individual flux fields buck against each other inside the resonant core 102. Listed below are some considerations that may be included when selecting how many EDC units 120 should be used.

a. Circuitry inside the EDC 120 must provide in-rush current limiting to tolerate the low impedance load of the $W_{EXC}$ winding 130 that it drives when the LC tank circuit 103 is not fully charged. By having more than one EDC unit 120 and associated excitation winding ($W_{EXC}$ 130), each EDC unit can have a lower in-rush current limit setting by allowing sibling EDC units 122 and 124 share the load. It is intended that all of the EDC units installed, no matter how many employed, would simultaneously drive $V_{EXC}$ signals having identical phase into the resonant core 102 through each EDC's individually associated $W_{EXC}$ winding 130, 132 and 134. By having each excitation winding 130, 132 and 134 separate from each other also provides redundancy.

b. If an EDC unit 120, 122, and 124 (or 107) fails, circuit status monitoring circuitry can inform the FFC 114 to shut down the faulty unit while allowing the remaining units to operate. By shutting down one or more faulty EDC units the remaining units still operate, allowing the RCPS to continue operation, although it may diminish performance or output power capacity. If extra EDC units 120, 122 or 124 along with associated $W_{EXC}$ windings 130, 132 or 134 are installed, additional safety margin is provided to reduce the stress on the EDC units when one EDC unit fails. Should an EDC unit such as 120 fail, the RCPS may then be able to perform normally. An indicator on the unit may inform the user that repair is required while the RCPS continues to operate during a repair period.

c. In the case of implementation of a high power RCPS, the wire size/diameter of the $W_{EXC}$ windings 130, 132 and 134 may be smaller if multiple EDC units 120, 122, 124 share the combined load. Advantages may include wire size and wire cost, while improving the utilization of the conductor's cross section area due to smaller diameter wires having lower skin effect losses.

d. In the case of a high power RCPS, the output devices, such as transistors/MOSFETs/IGBTs, used in the EDC 120, 122 and 124 can use less expensive lower current rated devices that typically switch faster, which reduces switching losses. Heat from each output device is lower since the other EDC units share the combined current, Heat dissipated by each output device is physically located away from the devices in the other EDC units, this divides the heat created among several locations instead of concentrating the heat in only one location.

A Redundant (optional) EDC unit 122 may be included. This unit is shown in FIG. 1 driving $W_{EXC}$ winding 132. Refer to 120.

A Redundant (optional) EDC unit 124 may be included. This unit is shown in FIG. 1 driving $W_{EXC}$ winding 134. Refer to 120.

An Excitation Winding ($W_{EXC}$) 130 which is fed by an EDC module 120 to induce a magnetic flux field within the magnetic core 102. The FFC 114 creates an excitation signal ($V_{EXC}$) which is fed into and amplified by the EDC 120. The amplified $V_{EXC}$ signal from EDC 120 is applied across this excitation winding creating magnetic flux in the magnetic core 102.

A Redundant (optional) $W_{EXC}$ winding 132 may be included. Refer to 130.

A Redundant (optional) $W_{EXC}$ winding 134 may be included. Refer to 130.

Load winding 1 ($W_{OUT1}$) 140 absorbs some flux from the magnetic core 102 and creates electrical power to feed internal system circuits. AC voltage induced across $W_{OUT1}$ 140 powers rectifier circuit 142 which converts the AC voltage into a full wave pulsating DC voltage. The rectified voltage is presented to a power factor correction circuit 144 which creates a filtered DC voltage. This filtered DC voltage is fed into a power supply 146 which has one or more output voltages. Power outputs from 146 are then fed to various internal circuits. Circuits that may be fed by power supply 146 include; FFC 114, Sensor 112, Tuning Mechanism 116, EDC units 120, 122 & 124 and any other internal circuits used for basic operation.

A bridge rectifier circuit 142 can be a passive diode bridge rectifier or an active transistor or MOSFET bridge circuit. Use of an active rectifier circuit adds cost and complication as opposed to a simple diode bridge circuit. However, when the output current becomes high, the series forward diode voltage drop may cause significant power efficiency loss and heat dissipation. This decision may be made on the merits of an active bridge circuit versus a low-cost passive diode bridge circuit and the particular application of the RCPS unit.

A Power Factor Correction (PFC) Circuit 144 may be powered by $W_{OUT1}$ 140 through bridge rectifier circuit 142. Here, a power factor correction circuit removes the reactive nature of the load applied to the RCPS core. Without a PFC added here, the diode bridge output would typically be fed into a filter capacitor to create a DC voltage with less ripple, causing the load on $W_{OUT1}$ 140 to appear capacitive. In the process, the RCPS core then sees the $W_{OUT1}$ filter capacitance in parallel with $C_{RES}$ 106. The capacitance value of $C_{RES}$ 106 may be in the range of nano Farads, while the filter capacitor may likely be in the range of many microfarads. This results in $C_{RES}$ 106 appearing as if it were many times larger, which effectively causes the resonant frequency of the LC tank circuit 103 to drop to a value below what may be an intended design frequency. Here, the excitation signal's frequency will not match the intended natural resonant frequency of the LC tank circuit due to the filter capacitor.

A power supply 146 may provide regulated DC power to various circuits inside the RCPS unit to maintain operation. Depending upon the individual needs of each circuit being fed, this power supply may need to provide more than one output voltage.

Load winding 2 ($W_{OUT2}$) 150 may draw a dominant portion of the resonant flux from the magnetic core 102 to create electrical power to feed external load circuits (not shown) which are devices independent of the RCPS unit. AC voltage induced across $W_{OUT2}$ is rectified by rectifier circuit 152 which converts the voltage into a full wave pulsating DC voltage. The rectified voltage is presented to a power factor correction circuit 154 which creates a filtered DC voltage. This DC voltage is fed into a power supply 156 for supplying external loads (not shown) such as a battery charging system, an AC power inverter and/or other devices such as machinery.

A bridge rectifier circuit 152 may rectify the AC voltage induced across $W_{OUT2}$ winding 150. This circuit can be a passive diode bridge rectifier or an active transistor or MOSFET bridge circuit. See above for guidance on choices.

A Power Factor Correction (PFC) Circuit 154 may be supplied by $W_{OUT2}$ 150 through bridge rectifier circuit 152. A power factor correction circuit removes the reactive nature of the load applied to the RCPS core. Without a PFC added here, the diode bridge output would typically be fed into a filter capacitor to create a filtered DC voltage, causing the load on $W_{OUT2}$ 150 to appear capacitive. In the process, the RCPS core then sees the $W_{OUT2}$ capacitance in parallel with $C_{RES}$ 106. The capacitance value of $C_{RES}$ 106 may be in the range of tens of nano Farads, while the filter capacitor may be in the range of many microfarads. See above for effects on $C_{RES}$ 106.

A power supply 156 may provide regulated DC power to feed load circuits external to the RCPS unit. Depending upon the individual needs of the intended load application, this power supply may need to provide more than one output voltage. The external load could be any electrical device such as a specific motor, an AC power inverter or large battery charger for electric vehicles. For heavy external loads, multiple duplicate 150, 152, 154 and 156 can be employed to share large heavy loads. Likewise, if the intended external load is relatively small, such as powering small devices such as flashlights, cell phones, hand held power tools, power supply 156 along with associated items 150, 152 and 154 can be eliminated and the small external load would then be fed by 146 instead of 156.

A Resonant Current $I_{RES}$ 160 flows through the resonant winding ($W_{RES}$, 104). Sensor 112 monitors this current and produces a differential feedback signal composed of IsenseA 162 and IsenseB 164. A positive polarity signal half (IsenseA) 162 of the differential pair Current Feedback Signal is created by the current sensor 112. A negative polarity signal half (IsenseB) 164 of the differential pair Current Feedback Signal is created by the current sensor 112.

A Voltage Feedback Signal (Vsense) 172 may be created by the capacitive voltage divider formed by $C_{SERIES}$ 108 connected in series with $C_{SENSE}$ 110. This signal has a reduced or greatly reduced amplitude with respect to $V_{RES}$ 170 while maintaining the same waveform as $V_{RES}$ 170.

2. Description of Operation

Referring to FIG. 1, an excitation signal voltage is applied across the Excitation winding $W_{EXC}$ 130. The magnetic flux field produced induces a magnetic flux within the magnetic core 102. An LC tank circuit 103 formed by the resonant winding $W_{RES}$ 104, connected in parallel with a dedicated resonant capacitor $C_{RES}$ 106, may be calibrated to resonate at a specific frequency ($F_{RES}$), which intentionally matches the frequency of the excitation signal applied the $W_{EXC}$ winding 130. The capacitive voltage divider (formed by $C_{SERIES}$ 108 connected in series with $C_{SENSE}$ 110) is also in parallel with $C_{RES}$ 106, and therefore should be considered when determining the capacitance of $C_{RES}$ 106. The natural resonant frequency ($F_{RES}$) of the LC tank circuit is determined by $$F_{RES} = \frac{1}{2\pi \sqrt{L_{RES} \times C_{RES}}} H_z \qquad \text{eq. 2.1}$$

Where $F_{RES}$=natural resonant frequency of LC tank circuit 103; (Hz)

$L_{RES}$=Self inductance value of resonant winding $W_{RES}$ 104; (Henrys)

CRES=capacitance value of (CRES [106]//([108] in series with [110]); Farads

Voltage is induced across the $W_{OUT1}$ winding 140 by the resonating flux within the core 102, that is by core flux. The voltage across $W_{OUT1}$ 140 is fed across bridge rectifier 142, which converts the AC voltage across the $W_{OUT1}$ winding 140 into a pulsating DC voltage. This pulsating DC voltage is fed into a Power Factor Correction circuit (PFC) 144. The PFC 144 is made to appear as a non-reactive (resistive) load across winding $W_{OUT1}$ 140. This may be important because if the pulsating voltage were to be filtered by simply adding a filter capacitor across it, the load seen by the $W_{OUT1}$ winding 140 would appear capacitive. Note the LC tank circuit 103, comprising the inductance $L_{RES}$ of $W_{RES}$ winding 104 connected in parallel with $C_{RES}$ 106, would react as if the filter capacitor was connected in parallel with $C_{RES}$ 106 in addition to $W_{RES}$ winding 104. Here, the LC tank's natural resonant frequency $F_{RES}$ would be changed, reducing the resonant frequency of the LC tank circuit to a frequency that may not allow it to resonate at all when excited by the intended $F_{RES}$ frequency fed across the excitation winding, $W_{EXC}$ 130.

Note that the PFC 144 circuit creates the illusion that the load attached to $W_{OUT1}$ winding 140 is a non-reactive load (resistive). This dampens the Q of the LC tank while allowing the LC tank's resonant frequency to be determined primarily by the values of $L_{RES}$ of $W_{RES}$ 104 and $C_{RES}$ 106. The PFC 144 produces a DC voltage that is slightly above the peak AC voltage across $W_{OUT1}$ 140. This DC voltage may have some AC ripple which is partially filtered by a filter capacitor incorporated within the PFC 144 which is isolated from $W_{OUT1}$ 140 by PFC 144. Under normal operation, the flux level within the core 102 will fluctuate according to the load applied to $W_{OUT1}$ 140 in addition to any load applied to other windings such as $W_{OUT2}$ winding 150. As the core flux level fluctuates under load, so does the induced voltages across each secondary winding 140 and 150 fluctuate.

Electronic circuits generally operate best if the power supply from which they are fed maintains a relatively steady voltage level. By feeding the output of PFC 144 to a power supply that creates a regulated DC output voltage, circuitry may be operated more reliably. The Regulated Power Supply 146 may have more than one regulated DC output so that circuits being fed by it that require different voltage levels can be served.

Power for Flux Field Controller (FFC) 114 and the Excitation Drive Circuits (EDC's) 107 are provided by the Regulated DC Power Supply 146. The FFC 114 creates the excitation signal waveform and timing (phase) that will be presented to the EDC units 107 which in turn drive the excitation windings 130, 132 and 134. The waveform, phase, frequency, and duty cycle of the excitation signal affects the accumulation of flux within the core 102.

A rectangular box 112 shown in FIG. 1 is a current sensor that provides a differential current feedback signal (comprised of IsenseA 162 and IsenseB 164) which relates to the $I_{RES}$ current 160 flowing through the $W_{RES}$ winding 104 and has the same waveform as $I_{RES}$ 160. The FFC 114 uses this differential current feedback signal (IsenseA 162 and IsenseB 164) to determine the phase of the flux flowing through the magnetic core 102. Once the FFC 114 knows the phase of the flux accumulated within the magnetic core 102, it can determine when to begin the next excitation signal that will be fed by the EDC units 120, 122 & 124.

The following paragraphs describe RCPS embodiments including various ones of the components described above and various means of configuring/using these components.

Figure 2A:
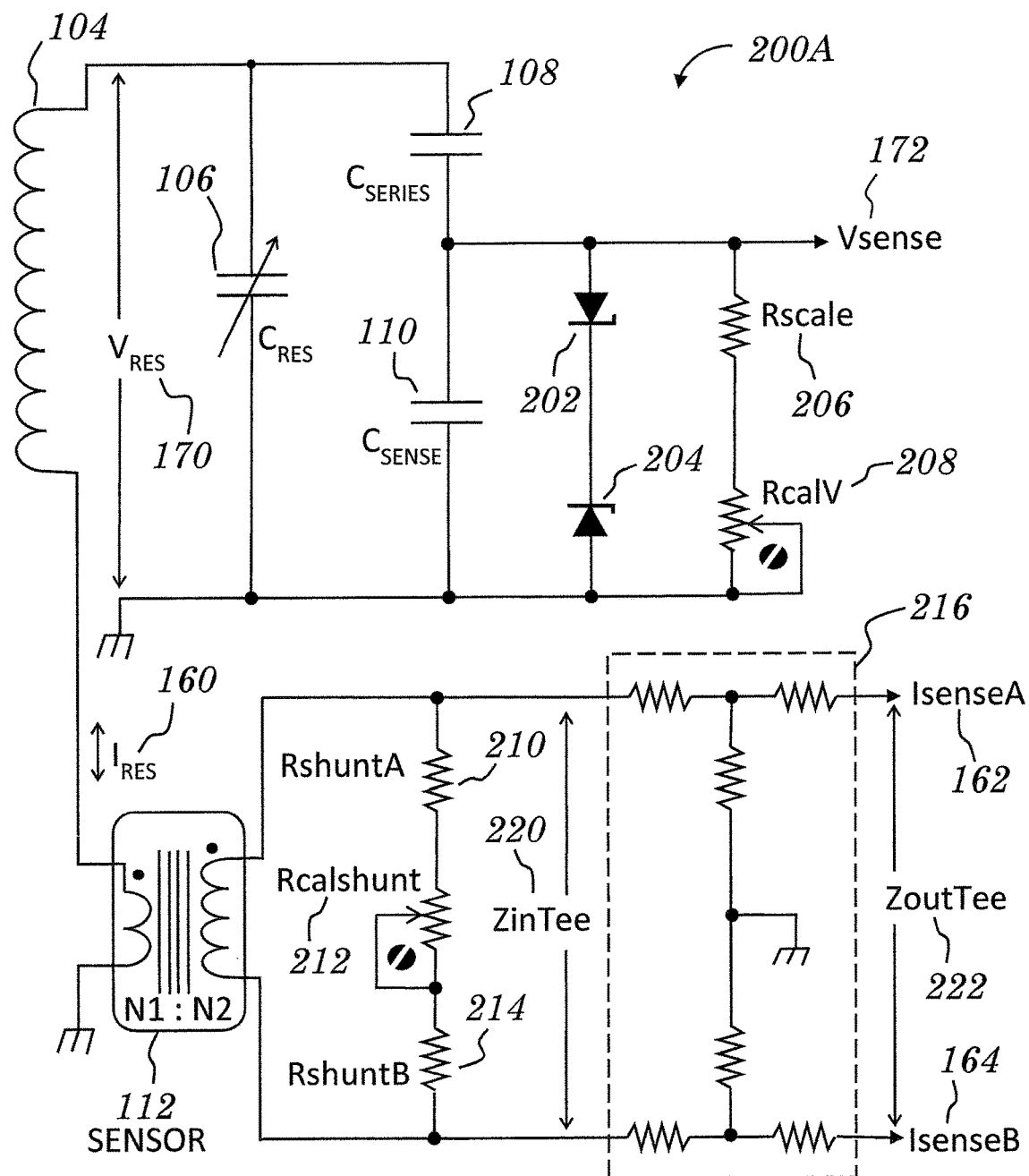
FIG. 2A shows tank circuit feedback signals of the resonant core power supply of FIG. 1.

Referring to FIG. 2A. An LC tank circuit is shown comprising the resonant capacitor $C_{RES}$ 106 in parallel with $W_{RES}$ 104 having an inductance of $L_{RES}$. Also shown in parallel with $C_{RES}$ 106 are a pair of series capacitors, $C_{SERIES}$ 108 and $C_{SENSE}$ 110. Capacitors $C_{SERIES}$ 108 and $C_{SENSE}$ 110 form an AC voltage divider to reduce the Vsense feedback signal 172 to a safer level. If $V_{RES}$ 170 operates at a high or very high voltage (such as several thousand volts, such as 2K to 10K volts), then cable insulation, connector voltage ratings and components involved in the Vsense signal 172 could become over-stressed.

The two Transient Voltage Suppressor (TVS) diodes (202 and 204) form a dual polarity voltage clamp which could be facilitated by a monolithic dual device. These diodes protect against potential damage to the circuitry downstream that are connected to Vsense 172 in case $C_{SENSE}$ 110 fails for example by becoming open due to mechanical damage or electrical failure. These clamp diodes also protect against damage caused if $C_{SERIES}$ 108 becomes shorted, for example where Vsense rises to a level endangering human life.

The amplitude of the voltage feedback signal, Vsense 172 is reduced greatly from the amplitude of the resonant voltage $V_{RES}$ 170 maintained across the LC tank circuit 103. The amplitude of the feedback voltage, Vsense 172 may likely be around a few volts whereas the resonant voltage $V_{RES}$ 170 across the LC tank circuit may likely be much higher, perhaps hundreds or thousands of volts.

The voltage divider formed by $C_{SERIES}$ 108 and $C_{SENSE}$ 110 reduces the amplitude of $V_{RES}$ 170 while maintaining a waveform similar to that of $V_{RES}$ 170. Series resistors Rscale 206 and RcalV 208 are connected in parallel to the voltage divider output across $C_{SENSE}$ 110.

By adjusting the RcalV 208 trim pot, the amplitude reduction value of the divider consisting of $C_{SERIES}$ 108 and $C_{SENSE}$ 110 can be calibrated to yield a desired voltage ratio of Vsense 172 divided by $V_{RES}$ 170. The ratio such as an ideal ratio may be set to allow the peak amplitude of Vsense 172 to remain just below the clamp voltage set by 202 in series with 204 when $V_{RES}$ 170 is at the maximum safe operating level of $V_{RES}$ 170 (along with some safety margin added), which is dictated by the insulation breakdown voltage of the wire insulation of $W_{RES}$ 104 winding and the dielectric breakdown voltage of the dielectric material of $C_{RES}$ 106, $C_{SERIES}$ 108 and $C_{SENSE}$ 110.

The "SENSOR" 112 shown in FIG. 1 may be a current sense device such as a current sense transformer as shown in FIG. 2A. The current sense transformer 112 monitors the resonant current $I_{RES}$ 160 passing through its primary winding (N1), typically a single turn. The secondary winding (N2) has many turns in relation to the primary winding (N1). A current reduction is provided by the current sense transformer 112 equal to the turn's ratio, $(N_1/N_2)$, and ideally produces the same waveform as that of the input signal fed into the primary winding, $I_{RES}$ 160.

The load impedance across the secondary (N2) determines what voltage relates to the current level passing through the primary winding, $I_{RES}$ 160. The shunt resistors, RshuntA 210, RshuntB 214 and Rcalshunt 212 combined in series, are connected in parallel with the differential TEE pad network 216 comprised of resistors. Therefore, the parallel combination of the input impedance, ZinTEE 220 of the TEE pad network 216 and the series shunt resistors 210, 212 and 214 will determine the voltage per ampere ratio applied across the input of the TEE pad network 216. To adjust and/or calibrate the output voltage to correspond to a certain voltage per ampere scaling factor of the $I_{RES}$ 160 current passing through the primary of current sense transformer "SENSOR" 112, the Rcalshunt trim pot 212 is adjusted.

The TEE pad network 216 provides an impedance match between the current transformer's 112 secondary $(N_2)$ in parallel with the shunt resistors 210, 212 and 214 versus the impedance of the particular current feedback cable that will connect to the FFC unit 114. The TEE pad network is designed to have an output impedance, ZoutTEE 222 equal to the impedance of the shielded twisted pair cable that will be used to carry the differential current feedback signal comprised of IsenseA 162 and IsenseB 162 to the FFC 114.

The TEE pad network 216 also provides a stable attenuation. Standing Wave Voltage (VSWR) cable reflections caused by any impedance mismatch are reduced by twice the attenuation value of the TEE pad network. The current feedback cable will be attached to carry a portion of the current sense transformer's 112 output current and be terminated with a termination resistor inside the FFC 114.

Applicant notes that hysteresis includes phenomenon where the value of a physical property lags behind changes in the effect causing it. Further, evidence of magnetic hysteresis may be found where magnetic induction lags behind the magnetizing force. For example, fully developed magnetization of a core occurs some time after a primary winding is energized.

Circuitry inside the FFC 114 may measure the time delay caused by the magnetic core's 102 hysteresis and/or compensate for this delay by starting the excitation signal early by an amount equal to the hysteresis time delay (phase delay) inherent to the specific properties including material properties of the magnetic core 102. This early start for the excitation is similar to a "spark advance" ("timing advance") in an internal combustion engine. In an internal combustion engine, "spark advance" begins the spark just before the piston reaches the "top dead center" position to allow time for the spark to fully ignite the fuel just as the piston reaches the maximum peak of its motion. Automobile mechanics adjust this timing every time the engine is "tuned-up". An automatic mechanical advance adjustment is provided by a spring-loaded counter-weight system to change the amount of timing advance as the engine speed increases, which optimizes the advance in real time during operation. More modern automobiles automatically control this spark advance by software running inside the engine control computer in real time as the engine is operating.

By providing "timing advance" to the excitation signal, extra time is provided to cancel the hysteresis time delay. After the time delay caused by the magnetic core 102 hysteresis has passed, the phase of the flux just created by the excitation signal applied to the excitation windings 130, 132 and 134 then coincides with the phase of the flux already accumulated within the core 102. By monitoring the hysteresis delay in real time, optimal phase compensation can be maintained.

Figure 2B:
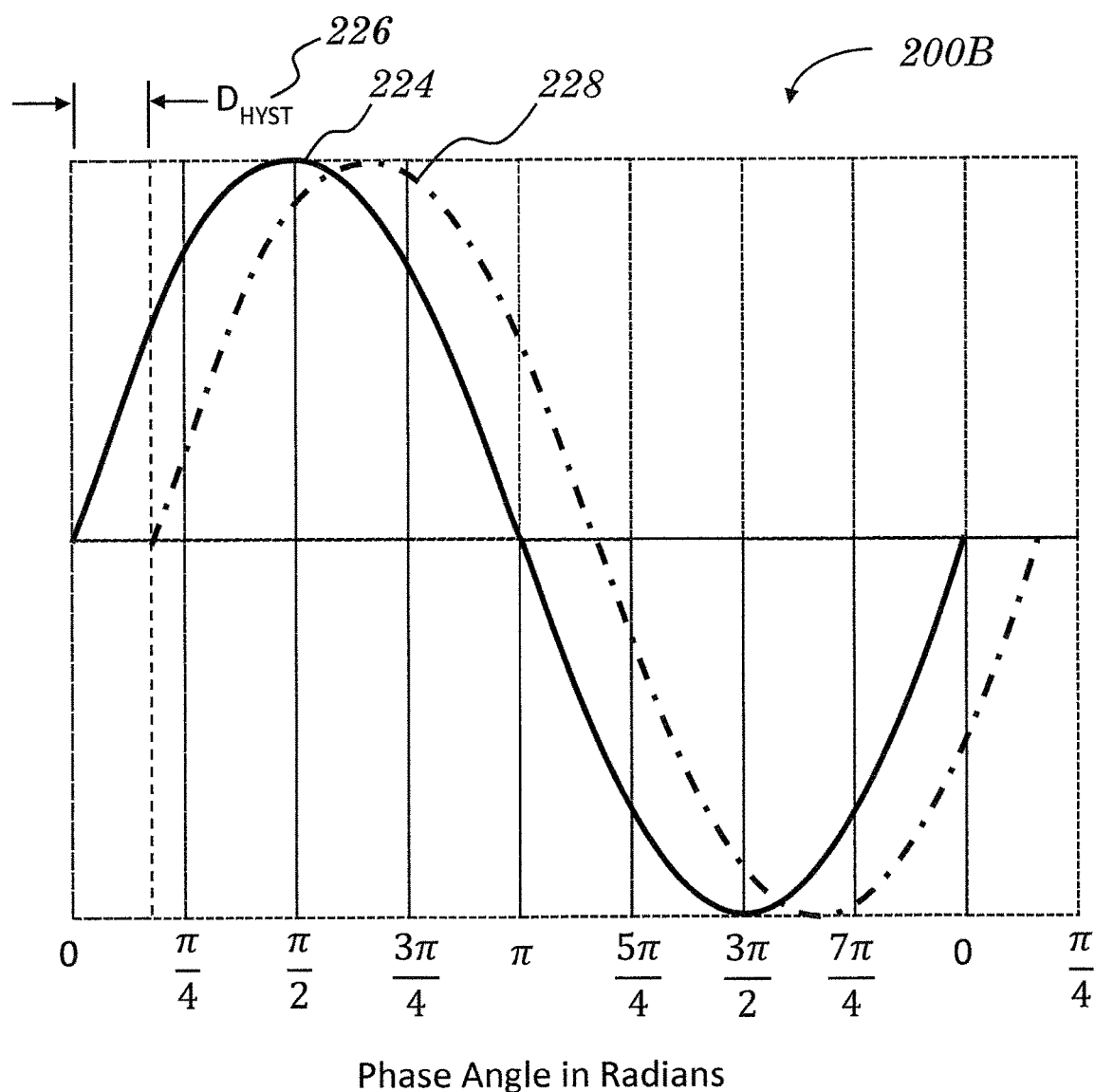
FIG. 2B shows hysteresis delay on excitation flux of the resonant core power supply of FIG. 1.

FIG. 2B demonstrates how the hysteresis of a core such as core 102 affects core flux accumulation. The solid trace 224 represents an excitation signal applied to the excitation winding $W_{EXC}$ 130. Notice that this trace 224 crosses zero at the origin (0 radians), representing a zero-degree phase shift. The dot-dashed trace 228 represents the sinusoidal flux already accumulated within the core 102. This dot-dashed trace 228 has been shifted towards the right due to the hysteresis delay of the core 102, $D_{HST}$ 226. For demonstration purposes, an arbitrary value of $D_{HST}$ 226 has been selected to represent the hysteresis delay caused by the core 102.

Therefore, the flux (dot-dashed trace 228), being accumulated within the core 102 shown in FIG. 2B is delayed by the hysteresis delay $D_{HYST}$ 226, offset towards the right from the excitation signal (solid trace 224 shown in FIG. 2B) which originally created the flux. To add flux from another excitation signal to the existing flux, the next excitation signal must occur earlier than the flux already accumulated in the core 102 instead of being applied in phase with the existing flux.

Figure 2C:
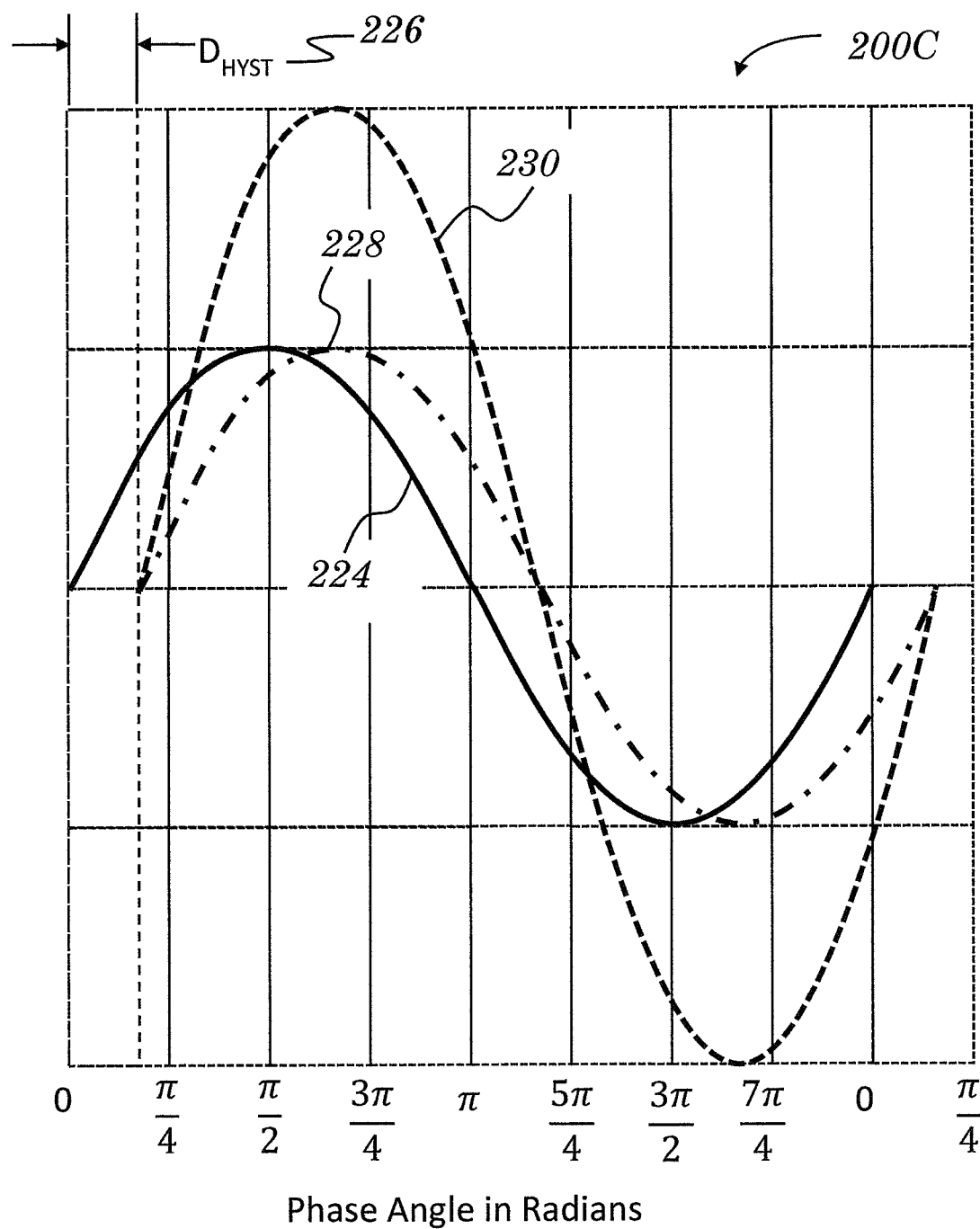
FIG. 2C shows combinations of flux of the resonant core power supply of FIG. 1.

FIG. 2C shows how the flux created by an advanced excitation signal (solid trace 224) after the hysteresis delay 226 combines with the existing flux (dot-dashed trace 228) to accumulate twice the flux within the core (dashed trace 230). Since the amount of advance timing has been set to equal that of the hysteresis delay $D_{HYST}$ 226, the phase of the delayed excitation flux created by 224 and the existing flux 228 coincide, allowing both flux fields to combine to yield twice the flux level, dashed trace 230.

As the RCPS device drives a heavy load, the FFC 114 servos the flux level to maintain an optimum (nominal) operating flux level stored within the core 102. If the load is relatively steady, the operating flux level will accumulate flux until reaching its nominal level as the load continues being fed by $W_{OUT2}$ 150 through PFC 154 and power supply 156.

However, if a heavy load is suddenly dropped, such as shutting off the power switch of a large machine tool being driven by the RCPS, the accumulated flux level within the core 102 may overshoot the desired flux level. This excess flux level may result in an excessive $V_{RES}$ 170 voltage level across the LC tank circuit 103. This causes $V_{RES}$ 170 to experience a voltage level above the original design level. The increased voltage may actually spike substantially. If the excessive level increases high enough to approach the dielectric breakdown voltage of either $C_{RES}$ 106 or that $W_{RES}$ 104 wire insulation, permanent damage may occur. To absorb any surge or spike of the resonant voltage $V_{RES}$ 170 the FFC 114 can apply a Braking procedure.

Figure 2D:
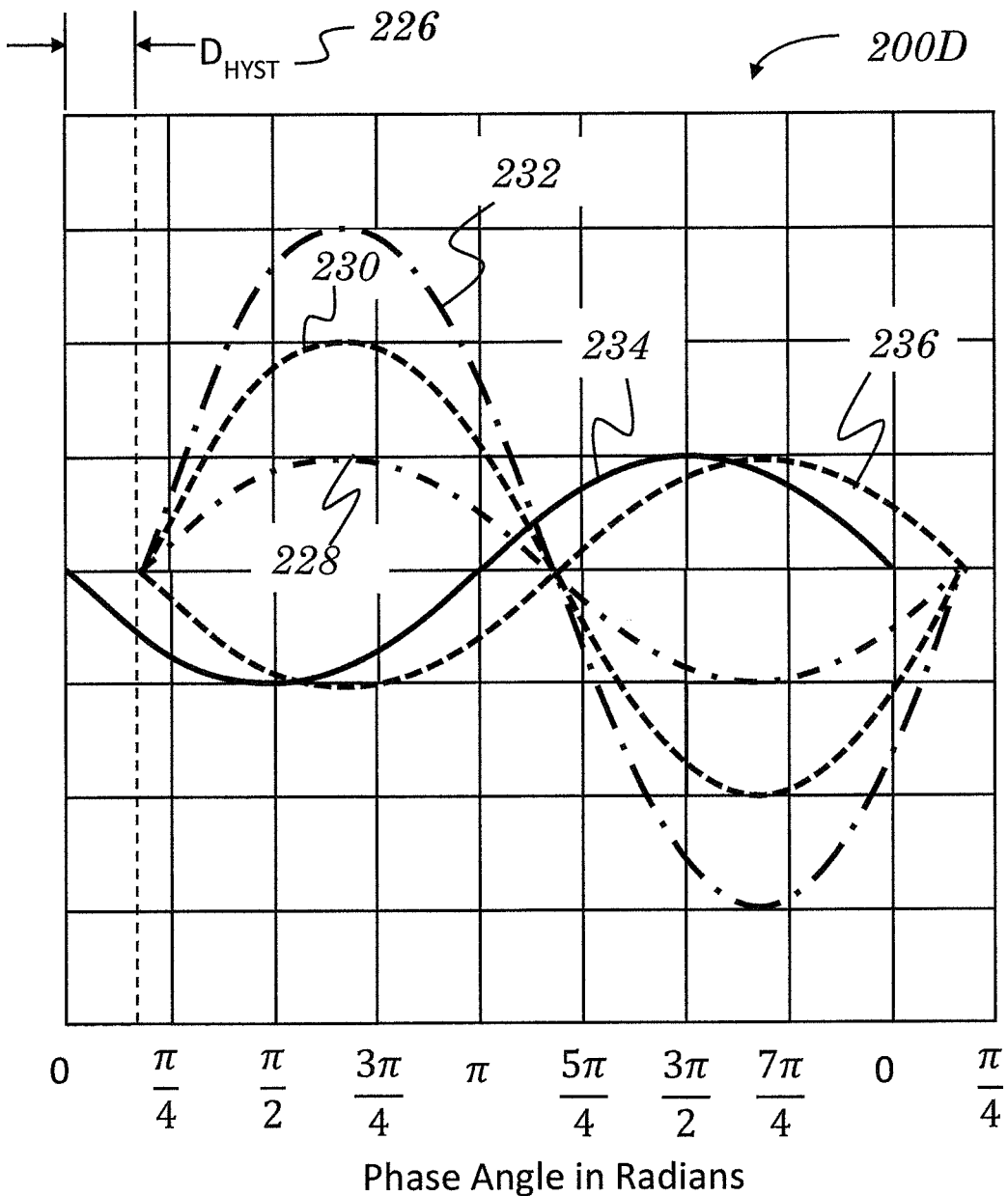
FIG. 2D shows a brake cycle of the resonant core power supply of FIG. 1.

FIG. 2D demonstrates the effect of adding a "Brake" cycle. Solid trace 234 represents a "Brake" excitation cycle without timing advance. The Brake cycle 234 is similar to the advanced excitation signal 224 shown previously in FIG. 2C, however it is shifted by π radians (180 degrees), causing it to appear upside-down. Flux created by the Brake cycle (dashed trace 236) is delayed by $D_{HYST}$ 226, causing the "Brake" flux 236 to align with the existing flux within the core 102 but having the opposite polarity.

The dot-dashed trace 228 is shown as a reference to represent what the flux created by a non-inverted normal excitation signal with timing advance creates after hysteresis delay 226 compared to the flux created by a "Brake" cycle 236.

For demonstration, dot-dashed trace 232 having the equivalent amplitude of three times the amplitude of flux created by a single excitation signal represents an excessive flux level. The resulting flux level 230 of combining the existing excessive flux 232 with the flux created by one "Brake" cycle 236 yields a lower flux level. The excessive flux 232 has now been diminished by an amount equivalent to that normally created by a single excitation signal 228, resulting in a new level shown as dashed trace 230.

Since each Brake cycle is shifted by π radians (180 degrees), when combined with existing flux results in cancelling one excitation cycle's worth of flux from the existing accumulated flux. Trace 232 being equivalent to three cycles of accumulated flux, is reduced to a combined flux level 230 equivalent to two cycles of accumulated flux. Adding "Brake Cycles" allows the FFC 114 to compensate for excess flux level without affecting the phase of the existing flux.

Normally, the flux within the core 102 accumulates over many cycles. The amount of flux created by each excitation cycle depends upon the in-rush current limit setting of each EDC unit 120, 122 and 124 and the number of EDC units working in tandem. The nominal operating flux is determined by the turn's ratio between the resonant winding 104 divided by the number of turns in each excitation winding 130, 132 and 134 times the peak voltage of the excitation signal. Therefore, for the drawing to be more accurate, the amplitude of the existing flux 230 when representing the nominal operating flux level should be shown as being many times the amplitude of one excitation cycle's worth of flux 228.

3. Current Feedback Signal to Flux Field Controller (FFC)

The magnetic core's hysteresis delay depends mainly upon the magnetic core material used to build the magnetic core 102. The exact hysteresis delay caused by any one specific core is difficult to predict, but it can be measured. The flux already accumulated within the core 102 is related to the differential $I_{SENSE}$ feedback signal comprised of IsenseA 162 and IsenseB 164. The phase shift caused by the magnetic core's hysteresis delay is determined by measuring the phase difference between the last excitation signal applied versus the phase of the flux already within the core 102.

The FFC 114 receives the differential current feedback signal from the current sensor 112.

Figure 3:
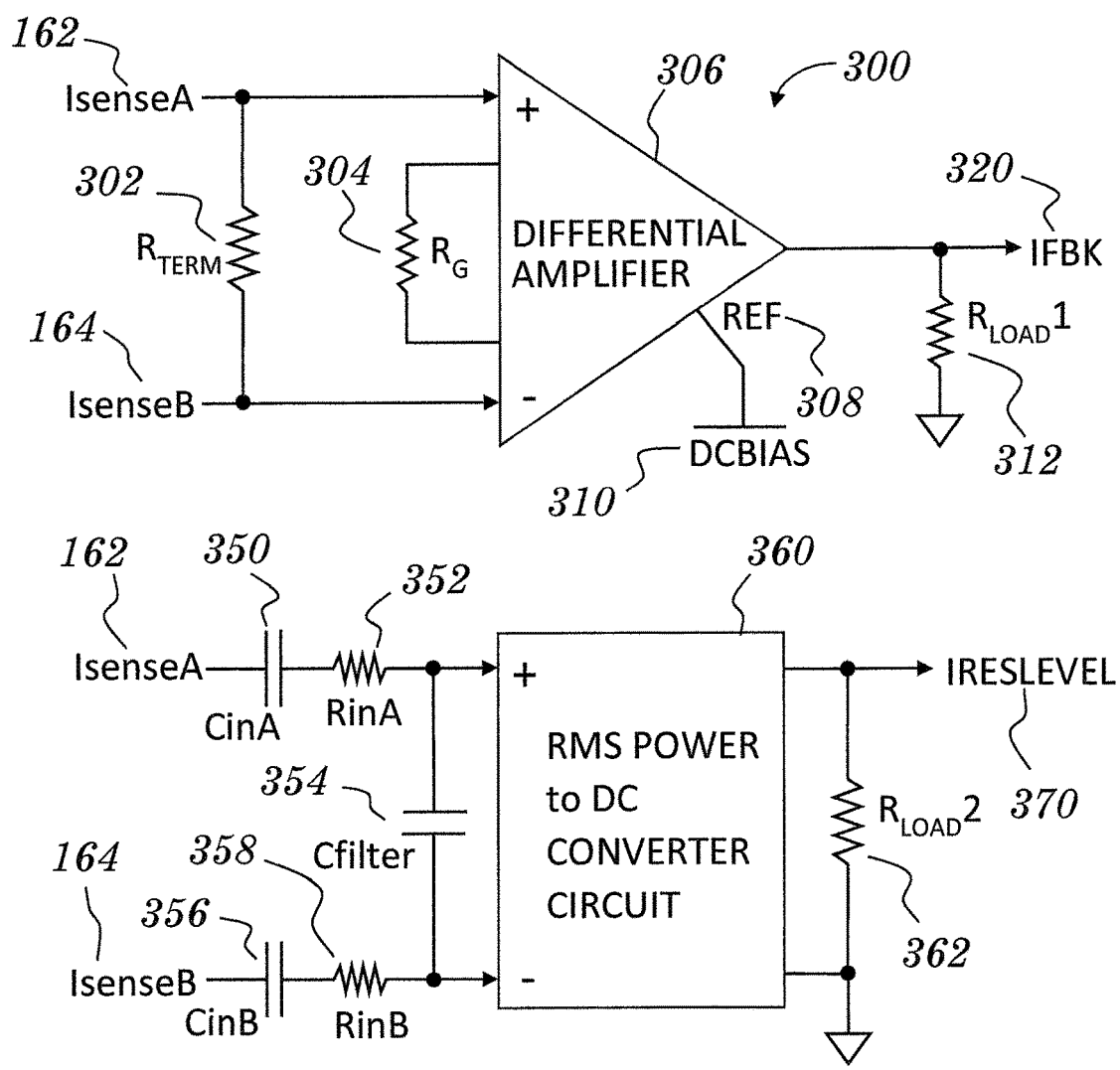
FIG. 3 shows current feedback input circuits of the resonant core power supply of FIG. 1.

Referring to FIG. 3, differential current sense output shown in FIG. 2A arrives as IsenseA 162 and IsenseB 164 through a shielded twisted pair cable attached to the output of the TEE pad network 216. The value of the termination resistor ($R_{TERM}$) 302 is provided to match the combined impedance of the shielded twisted pair current feedback cable in parallel with circuits which include items 306, 350, 352, 354, 358, 356 and 360.

Differential amplifier 306 monitors the amplitude of the current feedback signal. The differential gain of 306 is set by the value of the gain resistor $R_G$ 304. The output of 306 is terminated by resistor $R_{load1}$ 312 to provide a stable DC return path. The output of 306, IFBK 320 signal will later be fed into an analog to digital converter (ADC) for measurement. The IFBK 320 signal can be biased to provide an output more compatible for feeding into a ground referenced single-ended Analog to Digital Converter (ADC) such as an analog input (Ain) of a typical microprocessor. By applying a DC bias to the reference input (REF) 308 of the differential amplifier 306, the IFBK 320 signal can be biased to raise IFBK 320 above ground level. This avoids having the ADC being fed by IFBK 320 from being pulled below ground during negative signal peaks of IFBK 320.

The bias voltage, DCBIAS 310 should ideally be derived by the same voltage reference that the ADC uses to avoid creating a DC offset error due to any thermal drift caused by using two different voltage references. The offset bias could conveniently be provided by a DAC output from the same microprocessor that contains the ADC. If the DAC and ADC are two separate devices, then they need to share the same analog reference voltage. The IFBK output 320 of 306 is presented to an ADC to digitize the amplitude of IFBK 320.

Some ADC's and microprocessors have differential analog inputs. For differential input ADC's 306 can be omitted by feeding IsenseA 162 and IsenseB 164 directly across the ADC's differential inputs in parallel with the $R_{TERM}$ resistor 302 as long as the dynamic input range of the ADC is not exceeded by the differential current feedback signal comprised of IsenseA 162 minus IsenseB 164.

The digital conversion is performed twice every resonant frequency ($F_{RES}$) cycle; once at π/2 radians (90 degrees) and again at 3/2 π radians (270 degrees). These two digital values will represent the positive and negative peak voltage levels of IFBK 320. By subtracting the negative peak value from the positive peak value, the presence of remnant flux will be revealed as a digitized voltage difference between the two peak values.

Without DC bias, such as when there is no remnant flux, there should be no difference in amplitude between the two peak voltage measurements. The most recent measurement (positive or negative) updates each previous (positive or negative) measured value. The most recent measurements are retained for comparing to the next positive or negative peak value to be sampled. This procedure determines the presence of and amplitude of any DC biased remnant flux within the core by comparing each new measurement against the most recently saved positive or negative peak value samples.

Subcircuit 360 is a circuit that converts an analog waveform into an RMS power level (dBm signal power level) represented as a DC voltage. Subcircuit 360 is AC coupled across the terminator resistance of $R_{TERM}$ 302 to monitor the differential amplitude of the current feedback signal fed by 112 through TEE pad network 216. Input capacitors (CinA 350 and CinB 356) allows subcircuit 360 to ignore any DC bias caused by remnant flux. A low pass filter is formed by filter capacitor (Cfilter) 354 along with input resistors RinA 352 and RinB 358 to help reduce measurement error caused by any high frequency noise picked up on the current feedback cable.

The output IRESLEVEL 370 from 360 is terminated by $R_{load}2$ 362 to provide a stable DC return path. The output signal IRESLEVEL 370 of subcircuit 360 is a DC voltage representing the absolute dBm power level value in terms of dB per volt DC with respect to a specific dB intercept value. When the input signal power is at the intercept value, the DC output (IRESLEVEL 370) is zero volts DC. For signals above the intercept level, the DC output 370 is 0VDC plus the dB level above the intercept value multiplied by a positive DC conversion factor specified by the subcircuit 360 device manufacturer.

The power dissipated by the termination resistance is calculated by $$P_{CFS} = \frac{(V_{CFSrms})^2}{R_{term}} \times \frac{1{,}000 \text{ mW}}{\text{Watt}} \qquad \text{eq. 3.1}$$

Where
$P_{CFS}$=Power level of current feedback signal across [302]; milliwatts
$V_{CFSrms}$=differential voltage of current feedback signal across [302]; VRMS
$R_{term}$=resistance, $R_{TERM}$ [302] in parallel with [306] in parallel with [360]; Ω

To convert the feedback power level into dBm (assuming Rterm=50Ω)

$$P_{dBm} = \log_{10}(P_{CFS}) dBm \qquad \text{eq. 3.2}$$

Where
$P_{dBm}$=Power level of current feedback signal in terms of dBm into 50Ω
$P_{CFS}$=Power level of the current feedback signal in terms of milliwatts
$0_{dBm}$=1.0 milliwatt The output of RMS to DC converter circuit is determined by $$V_{IRESLEVEL} = 0VDC + (P_{dBm} - P_{INTERCEPT}) \times \frac{V_{CONVERT}}{dBm} \qquad \text{eq. 3.3}$$

Where
$V_{IRESLEVEL}$=DC output voltage of RMS to DC converter, VDC
$P_{dBm}$=Power level of current feedback signal in terms of dBm into 50Ω

$P_{INTERCEPT}$=Power level of the intercept point as if fed into 50Ω

$V_{CONVERT}$=conversion factor of DC output per signal power level, dBm

The IRESLEVEL output 370 from 360 is then fed to an ADC to be digitized. The digital value of IRESLEVEL 370 is used to determine the true RMS current level of the resonant current $I_{RES}$ 160 passing through $W_{RES}$ winding 104 even if the waveform is not exactly sinusoidal. This measurement will be multiplied by the RMS level of $V_{RES}$ 170 to yield the resonant VA power stored as flux within the magnetic core 102.

4. Flux Field Controller (FFC) 114, Accumulated Flux

To monitor the phase of the flux accumulated inside the magnetic core 102, circuitry inside the FFC 114 determines when the IsenseA 162 versus IsenseB 164 differential feedback signal "crosses zero". Crossing zero refers to when the IsenseA 162 and IsenseB 164 signals change polarity, either from a positive value to a negative value or vice-versa where it changes from a negative value to a positive value.

Figure 4A:
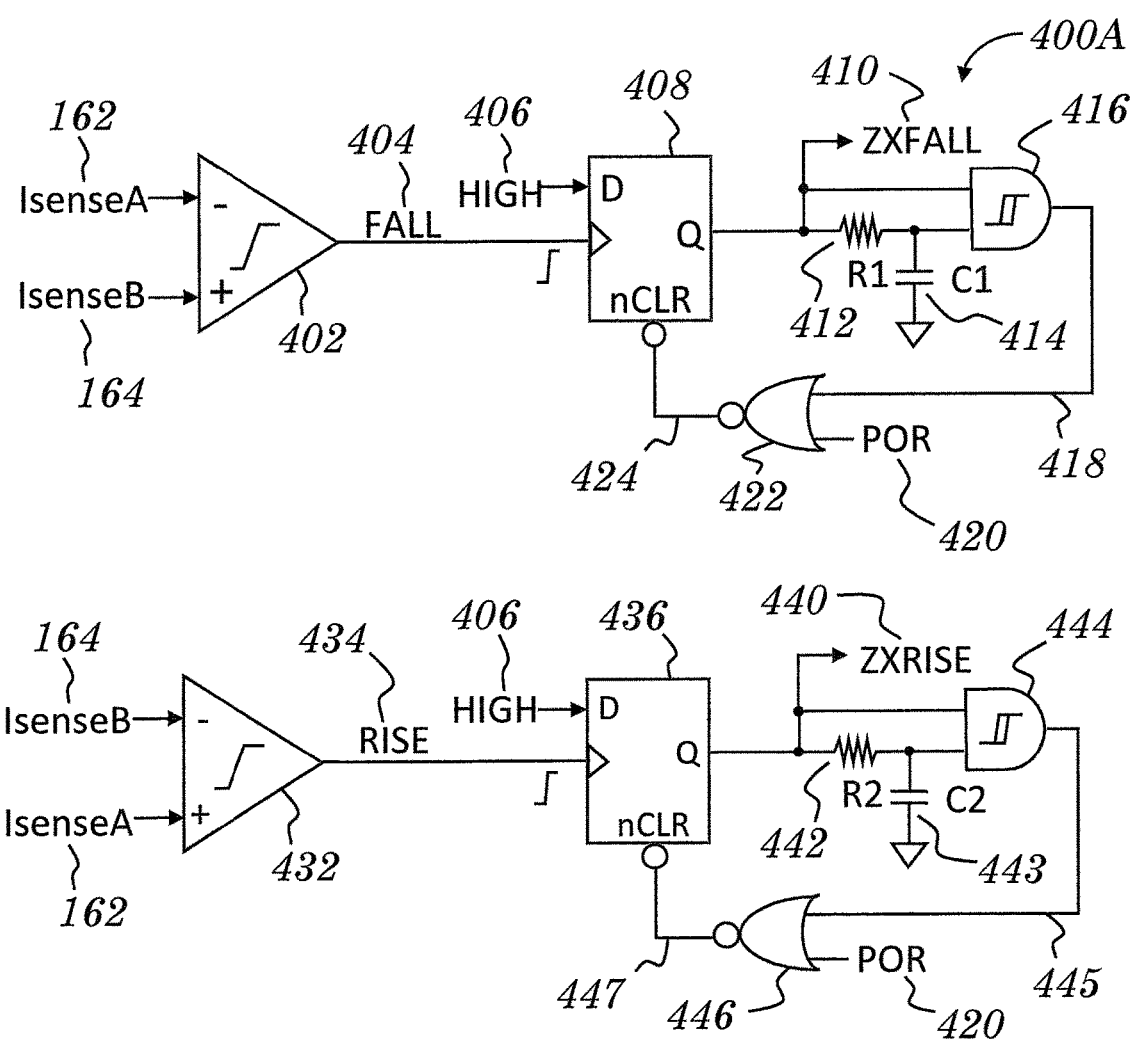
FIGS. 4A-B show zero crossing and timing circuits of the resonant core power supply of FIG. 1.

Refer to FIG. 4A. Two zero-crossing signals are used inside the FFC 114; one detects when the flux drops from a positive level to a negative level (ZXFALL 410), and the other detects when the flux rises from a negative level to a positive level (ZXRISE 440). This is accomplished by monitoring the differential current feedback signal provided by the current sensor 112. The resonant current, $I_{RES}$ 160 flowing through the resonant winding 104 is related to the magnetic flux resonating within the magnetic core 102. When the resonant current $I_{RES}$ 160 crosses zero, so does the magnetic flux within the core 102.

The FALL output 404 of voltage comparator 402 goes HIGH as soon as the two inputs of 402 (IsenseA 162 and IsenseB 164) exchange polarity where the voltage level of IsenseA 162 drops below IsenseB 164. The data "D" input 406 of flip-flop 408 is tied HIGH to a logic 1 voltage level. The "Q" output "ZXFALL" 410 of flip-flop 408 waits in the reset state (when its Q output is LOW) until the rising edge of "FALL" signal 404 from the comparator 402 output triggers flip-flop 408.

On the rising edge of FALL 404, flip-flop 408 transfers the logic state (HIGH vs LOW) of the data input signal presented to the "D" input 406 to its "Q" output, ZXFALL 410). Since the "D" input is connected to a constant "HIGH", flip-flop will always "SET" where its Q output "ZXFALL" 410 becomes HIGH. The "FALL" signal 404 remains HIGH until the IsenseA signal 162 rises above the IsenseB signal 164, which occurs once every $F_{RES}$ cycle causing "FALL" to become LOW. Since 408 only triggers on the rising edge of its clock input 404 (pin with triangle symbol), nothing happens when "FALL" 404 goes LOW.

As the output signal ZXFALL 410 goes from LOW to HIGH, one input to Schmitt trigger "AND" gate 416 rises. Resistor R1 412 is also pulled HIGH by ZXFALL 410, which in turn charges capacitor C1 414. As C1 414 charges, at some point the voltage across C1 414 has reached the input trigger threshold voltage of 416, allowing both inputs of 416 to be simultaneously HIGH, causing the output 418 of "AND" gate 416 to become HIGH.

When the RCPS is first powered on, the state of any flip-flop output is not known, it can be either HIGH or LOW. A Power-On Reset signal (POR) 420 is created by a power-on reset circuit (not shown) which causes POR signal 420 to become active (HIGH) briefly for a few milliseconds. Afterward, POR 420 then goes inactive (LOW) and stays LOW until the RCPS is turned "OFF" ("Powered Down") and then turned back on again ("Powered ON"). The POR signal 420 is fed into "NOR" gate 422, which when active (HIGH) causes the output 424 of NOR gate 422 to go LOW. The LOW output from "NOR" gate 422 feeding the nCLR input of 408 causes flip-flop 408 to clear (RESET), causing its Q output "ZXFALL" 410 to go LOW. After a few milliseconds, the POR signal 420 goes LOW and remains LOW until the next power-on sequence of the RCPS. For the rest of this discussion, POR 420 will be considered as always being LOW.

The other input 418 of "NOR" gate 422 is fed by the output 418 of "AND" gate 416. During normal operating mode, POR 420 is LOW and therefore the output of "NOR" gate 422 is always HIGH unless the output 418 of "AND" gate 416 goes HIGH. The time delay created by R1 412 and C1 414 causes the output 418 of "AND" gate 416 to be delayed after the ZXFALL output 410 of flip-flop 408 goes HIGH. This allows the ZXFALL signal 410 to remain "HIGH" briefly before the rising output of "AND" gate 416 causes the falling output 424 of "NOR" gate 422 to "RESET" flip-flop 408. When flip-flop 408 resets, the ZXFALL signal 410 immediately goes LOW. When ZXFALL 410 goes LOW, the input of "AND" gate 416 associated with R1 412 and C1 414 briefly remains HIGH. The ZXFALL input 410 feeding "AND" gate 416 immediately goes LOW, causing the output 418 of 408 to go LOW without delay even though there may still be a charge on C1 414 holding the other input of "AND" gate 416 "HIGH".

This results in the ZXFALL output to remain HIGH for a single brief pulse, beginning on each rising edge of the "FALL" signal 404. The short pulse duration is dictated by the RC constant of R1 412 versus C1 414, which is designed to be long enough for other logic devices downstream of ZXFALL 410 to be reset, but clearing away the ZXFALL 410 pulse long before the FALL signal 404 goes LOW again, which is expected to occur again around 180 degrees after FALL 404 went high.

The circuitry in FIG. 4A involving subcircuits 432, 436, R2 442, C2 443, 444 and 446 detects the rising zero crossing (RISE) 434. This circuit is identical to the previously discussed circuit that detects the falling zero crossing (FALL) 404. The difference is that the input signals (IsenseA 162 and IsenseB 164) are swapped on comparator 432 in comparison to comparator 402 where the IsenseA signal 162 feeds the non-inverting input of comparator 432 instead of the inverting input. Likewise, the IsenseB input 164 feeds the inverting input of comparator 432 instead of the non-inverting input. This results in the output "RISE" 434 of comparator 432 to be opposite that of the FALL output 404 of comparator 402.

By monitoring the polarity of the $I_{RES}$ 160 signal by comparing the polarity of IsenseA 162 versus IsenseB 164, produces reliable zero-crossing detection, regardless of the differential amplitude of Isense feedback signal from the sensor 112 representing $I_{RES}$ 160 current.

The FFC 114 will use the zero-crossing signal of ZXFALL 410 to measure the hysteresis phase delay caused by the magnetic core 102. The zero-crossing signals of RISE signal 434 and ZXRISE signal 440 will be used to synchronize the beginning of the next excitation signal.

When the RCPS is first turned on, there is no flux in the core 102, therefore, the circuits in FIG. 4A are not able to create zero crossing signals. Since the differential $I_{SENSE}$ feedback signal ($I_{SENSE}$A 162 versus $I_{SENSE}$B 164) is derived by the accumulated flux within the core 102, there is no $I_{SENSE}$ feedback, hence no zero-crossing signals. Upon initial "START-UP" of the RCPS, a surrogate signal must be used to replace the RISE 434 signal temporarily until the $I_{RES}$ current 160 resonating within the LC tank circuit 103 has developed enough amplitude to allow the zero-crossing circuits of FIG. 4A to properly function. The RISE signal 434 is needed to synchronize timing circuits within the FFC 114 in order to determine how much advance timing to apply when creating an excitation signal.

Depending upon the "Q" value of the LC tank circuit 103, the oscillator may be a simple RC oscillator. Ideally, the "Q" of the LC tank circuit should be relatively large. If the "Q" of the LC tank circuit 103 is large where the bandwidth of the natural frequency of the tank is very narrow, an oscillator with a more accurate frequency setting may be required such as derived from a crystal or ceramic resonator.

If the FFC 114 has at least one microprocessor, it will need a system clock to operate. The system clock is likely to be operating in the megahertz frequency range and $F_{RES}$ is likely to be much lower in frequency (kilohertz range). If he system clock utilizes a crystal oscillator having a digital logic level output, the system clock frequency can be reduced to a value closer to the resonant frequency $F_{RES}$ of the LC tank circuit 104, 106, 108 and 110 by using a digital counter circuit to divide the system clock frequency.

Figure 4B:
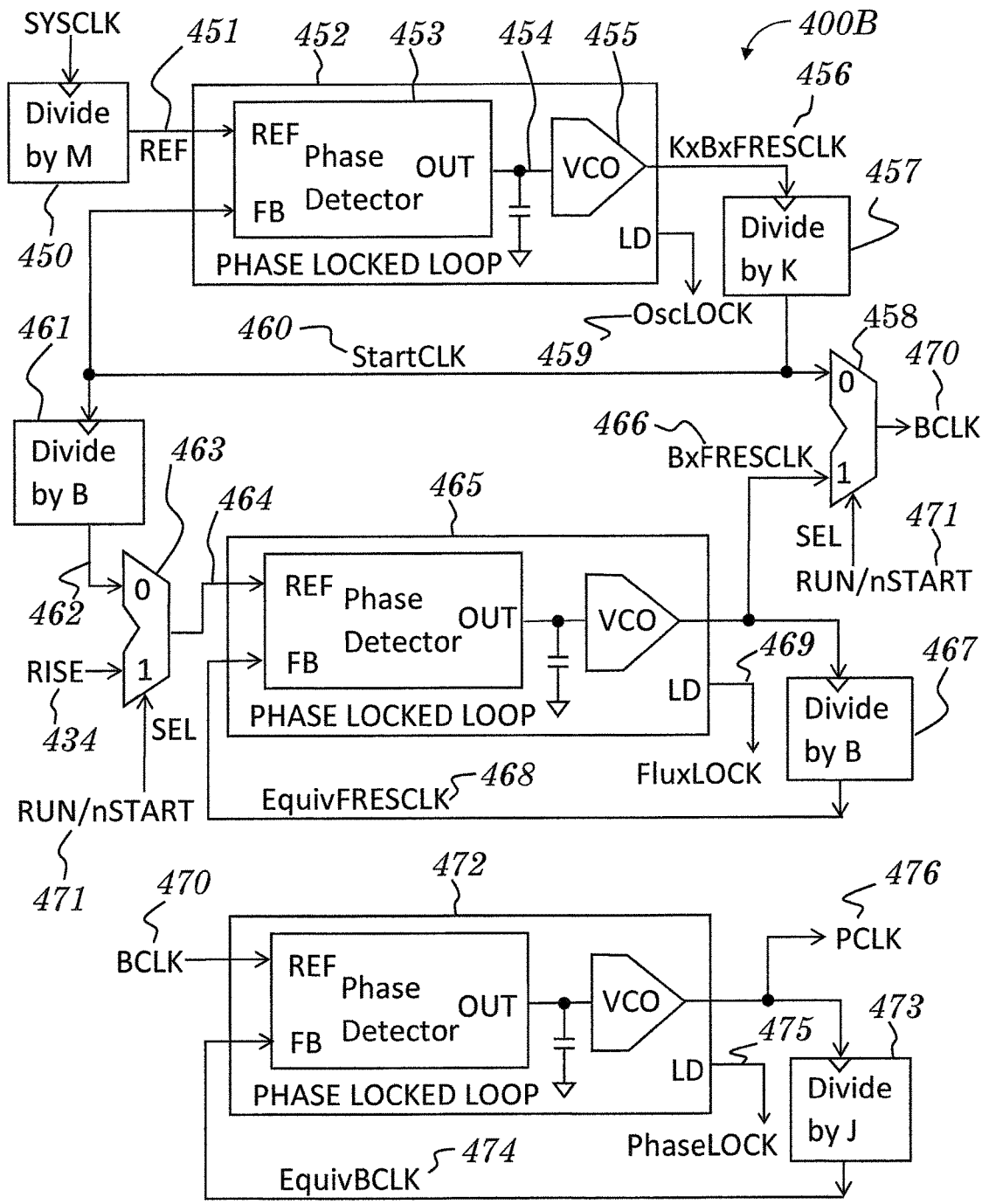

Referring to FIG. 4B. To bring of the system clock frequency down closer to the resonant frequency ($F_{RES}$) of the LC tank circuit 104, 106, 108 and 110, a digital counter 450 is used to divide the output frequency of the system clock (SYSCLK) by an integer value of "M", yielding the reference frequency signal REF 451.

The reduced frequency output from the digital counter 450 remains synchronized to the system clock. This synchronizing reduces beat frequency electro-magnetic interference (EMI) between the RCPS circuits and the microprocessor circuits. The REF 451 output of the digital counter 450 must yield a frequency that is an integer multiple of the resonant frequency of $F_{RES}$.

During startup, a surrogate RISE 434 signal is derived from an oscillator. In order to synchronize the RCPS timing circuits to the REF 451 signal, a Phase Locked Loop (PLL) circuit 452 and a frequency divider (digital counter) 457 is provided.

A PLL circuit such as 452 encompasses a "Phase Detector" 453 circuit that compares the phase of two input signals (REF 451 and FB 460), and then generates a control voltage 454 related to the phase mis-match, which in turn controls VCO 455 to modify the frequency of the VCO's output signal 456.

The feedback signal, StartCLK 460 is applied to the FB input of Phase Detector 453. Output 456 of VCO 455 is fed through a frequency divider (digital counter) 457 before reaching the FB input of Phase Detector 453. Frequency divider (digital counter) 457 divides the frequency of VCO 455 output 456 by an integer value of "K". Therefore, VCO 455 output 456 is "K" times the frequency of the output StartCLK 460 from digital counter 457.

The REF signal 451 is fed to the "REF" input of Phase Detector 453. The phase of the VCO output 456 will track the phase of the signal applied to the "REF" input (reference input) 451. Since the REF 451 signal is synchronized to the system clock (SYSCLK), the phase of the REF signal 451 and the phase of FB input fed by StartCLK 460 will be compared by the phase detector 453 while the PLL 452 causes StartCLK 460 which results in the StartCLK 460 also being synchronized to the system clock (SYSCLK).

For this to work, the frequency of the VCO output 456 must match the frequency of the StartCLK 460 times the divide value "K" of frequency divider 457. Also, the frequency of the system clock (SYSCLK) divided by "M" by digital counter 450 must be equal to the frequency of the StartCLK 460 signal.

Phase Detector 453 output 454 will control the frequency of VCO 455 output 456 to become a multiple (equal to the division ratio "K") of the REF input signal 451. The VCO 455 output 456 will also track the phase of the REF signal 451. This is referred to as being in "LOCK". In other words, the PLL will strive to have the FB input signal match both the phase and frequency of the signal fed into the REF input by either slowly increasing or decreasing the output frequency of its VCO until both FB and REF inputs are synchronized in "LOCK"—step with each other.

Output 454 from the Phase Detector 453 consists of a pulse width modulated signal. A "LOOP filter" filters the pulses before being presented to VCO 455. The LOOP filter is represented by the capacitor shown in FIG. 4B drawn in between the Phase Detector 453 output 454 and ground. The LOOP Filter may consist of active or passive components in addition to the single capacitor shown in FIG. 4B. The LOOP Filter dynamics dictate how quickly the VCO output 456 frequency is allowed to change to make corrections.

The REF 451 signal is essentially divided by an integer value of "K" due to counter 457 to create the StartCLK 460. The resulting frequency of StartCLK 460 needs to be an integer multiple of $F_{RES}$. The StartCLK 460 frequency is later divided by another digital counter 461, which divides the StartCLK 460 by an integer value of "B" in order to match the resonant frequency of the LC tank ($F_{RES}$). Therefore, the frequency of the signal 456 fed into divider 457 must be "K" times "B" times $F_{RES}$ is labeled as "KxBxFRESCLK" 456.

To ease the design task to reach an appropriate StartCLK 460 frequency derived from SYSCLK, PLL circuit 452 has been included in FIG. 4B. Depending upon the topology of the specific PLL device used for 452, a digital output clock frequency that is divided down by an integer value or multiplied by an integer value or a fractional quotient of two integers can be created. This combination of 450, 452 and 457 needs to result in the frequency of StartCLK 460 that is an integer multiple of $F_{RES}$.

By intentionally selecting the resonant frequency during the design process to coincide with a root of the SYSCLK signal 451 frequency, then an integer multiple of $F_{RES}$ for the StartCLK frequency can be achieved by directly dividing the system clock (SYSCLK). If the REF signal 451 frequency is an integer multiple of $F_{RES}$ having a value of "K", then PLL 452 can be completely omitted. In this situation, the REF signal 451 would then directly feed the frequency divider 457 in place of the PLL output 456.

There may be crystal oscillators that have a built-in PLL, encompassing circuits 450 and 452, which can be reprogrammed for a custom output frequency equal to the StartCLK frequency 460. Typical real-time clock circuits use a 32.768 KHz crystal or crystal oscillator, which can easily be divided to frequencies in the audio range that may conveniently yield an integer multiple of $F_{RES}$. This avoids needing to use the system clock.

By using one of these low frequency crystal oscillators along with digital counter 450 allows PLL circuit 452 to be omitted if the design frequency selected for $F_{RES}$ frequency is an integer root of the crystal frequency where StartCLK frequency is "K" times $F_{RES}$.

The PLL LOOP Filter determines how long it will take for the PLL to reach a LOCK state after the power is first turned on. PLL circuits typically require a number of oscillator cycles (from its VCO) before acquiring "LOCK" which is affected by the divide ratio of the frequency divider 457 in the feedback path in addition to the LOOP Filter dynamics. Therefore, during startup, the PLL may not immediately achieve "LOCK" for many milliseconds.

If a PLL struggles to achieve LOCK, the Phase Detector control voltage output 454 may approach either supply rail (VDC or common ground). This relates to attempting to climb a steep hill with an under-powered automobile pulling a heavy trailer, and the driver mashes the accelerator to the floor, or locking up the brakes while attempting to avoid hitting a suddenly appearing obstacle.

During startup, the FFC 114 evaluates a number of parameters such as the flux level in the core 102, the power supply levels that feed various internal system circuits and the LOCK status of various PLL circuits. In FIG. 4B, there are three PLL circuits shown 452, 465, and 472, each has a "LOCK Detect" signal labeled as "LD". These "LOCK Detect" signals shown in FIG. 4B are labeled as; OscLOCK 459, FluxLOCK 469 and PhaseLOCK 475.

Some PLL circuits have built-in "LOCK Detect" circuitry to provide a status bit for monitoring if the PLL is operating as expected, or that it needs more time to LOCK. The LOCK Detect circuit is simply a "window-detect circuit" that determines if the control voltage output from the Phase Detector is somewhere within the legitimate operating voltage range for the VCO input versus being slammed against either supply rail; VDC or ground.

PLL 465 may be critical part of the RCPS. The task of 465 is to create a high frequency clock signal that tracks the phase and frequency of the flux field within the magnetic core 102. During startup, the StartCLK 460 is fed into a frequency divider (digital counter) 461. Divider 461 divides the frequency of StartCLK 460 by an integer value of "B" in order for the frequency of the divider's output 461 to become equal to $F_{RES}$. This means that the frequency of the StartCLK 460 signal must be equal to "B" times $F_{RES}$. The frequency of the StartCLK signal 460 divided by "B" is fed into the "0" input of digital multiplexer (mux) 463.

A select signal, RUN/nSTART 471 is presented to the select (SEL) input of digital multiplexer circuit (mux) 463. The RUN/nSTART signal 471 is LOW during startup and goes HIGH once status from various circuits (including the LOCK status signals from the PLL's) have all reported an "OKAY" status, signifying "RUN" mode status. When the RUN/nSTART signal 471 is LOW, the StartCLK signal 460 divided by 461 is presented to the REF input 464 of PLL 465. When operation switches to "RUN" mode, the SEL input of mux 463 selects the "1" input and presents it to its output 464. The signal 464 selected by mux 463 is presented to the REF input of PLL 464 is the "RISE" signal 434 created in FIG. 4A. Since the frequency of the "RISE" signal 434 is equal to $F_{RES}$, then the frequency of signal 462 from 461 must also match the frequency ($F_{RES}$) of the "RISE" signal 434 to allow PLL 465 to lock.

During startup, the signal 462 from StartCLK 460 divided by "B" substitutes for the "RISE" signal 434, allowing the FFC 114 to create excitation signal waveforms to feed into the various EDC units 120, 122 and 124. The EDC units 120, 122 and 124 then apply excitation voltage across each excitation winding 130, 132 and 134, coercing flux to be created within the core 102. The substitute signal "StartCLK" 460 allows adequate operation for flux to accumulate within the core 102. Eventually, the flux level will achieve a level high enough for the zero-crossing circuits shown in FIG. 4A to function properly, satisfying one of the parameters that must be met in order for the FFC 114 to declare that "RUN" status has been achieved, setting the RUN/nSTART signal 471 HIGH.

Therefore, before divider 461 divides the frequency of StartCLK 460 by "B", the frequency of StartCLK must be "B" times $F_{RES}$, otherwise PLL 465 will not be able to remain in "LOCK" when the mode changes from "Startup" to "RUN" mode. Frequency divider 467 also divides by the same integer value "B" as does the divider 461. When PLL 465 is in "LOCK", the VCO output frequency is then B times $F_{RES}$.

Multiplexer 458 is fed by both the StartCLK 460 and the VCO output 466 of PLL 465, "BxFRESCLK". Both signals fed into mux 458 will become nearly the same frequency (B times $F_{RES}$) once PLL 465 is in "LOCK". The only difference is that the phase of StartCLK 460 is synchronized to the REF signal 451 while the phase of the PLL 465 VCO output 466 is synchronized to the "RISE" input 434 which is in sync with the magnetic flux within the core 102.

The exact frequency between StartCLK 460 and the VCO output 466 of PLL 465 may differ slightly since the StartCLK frequency 460 is determined by the REF signal 451 versus the flux frequency is determined by the resonant frequency of the LC tank 104, 106, 108 and 110.

The frequency of the output 470 from multiplexer 458 should be either that of StartCLK 460 or that of "BxFRESCLK" 466, hence being referred to as "BCLK".

The frequency range that a PLL can operate is dictated by the frequency range of its associated Phase Detector and VCO. The majority of PLL circuits on the market are designed for radio frequencies typically in the frequency range of megahertz to gigahertz and therefore the Phase Detector output voltage range is typically not compatible with lower frequencies. For PLL circuit 465, a PLL with a Phase Detector and VCO combination that can operate correctly at relatively low frequencies such as the $F_{RES}$ frequency must be carefully selected.

Each pulse of the BCLK 470 signal when PLL 465 is locked to the RISE 434 signal represents a phase increment of the flux field within the core 102. If the value of integer "B" used by counters 461 and 467 is large enough, BCLK 470 can feed a digital binary counter to accumulate the present phase of the flux within the core 102. Depending upon the resonant frequency $F_{RES}$ and the number of binary bits utilized by the phase counter used to accumulate the phase, the frequency required for BCLK 470 may be higher than the frequency range of the VCO of PLL 465. The frequency required for BCLK 470 to directly feed the phase accumulation counter is $F_{RES}$ times $2^N$, where N is the number of bits of the phase counter. Since PLL 465 is selected to have a phase detector that can operate at the relatively low $F_{RES}$ frequency, the associated VCO might not be able to reach the frequency of $F_{RES} \times 2^N$. To resolve this, an additional PLL 472 is shown in FIG. 4B to multiply a low frequency BCLK 470 signal by an integer factor of "J" with the aid of divider 473 to reach the necessary $F_{RES} \times 2^N$ frequency. PLL 472 can then be selected from the more ubiquitous high frequency PLL devices designed for RF applications.

The "BCLK" 470 selected by multiplexer 458 is fed into PLL 472, which multiplies the "BCLK" frequency by an integer value of "J", due to the presence of digital counter 473. The VCO output PCLK 476 may have plenty of output frequency range, yet the phase detector of PLL 465 does not need to operate at such a low frequency as that of $F_{RES}$.

However, if the phase detector of PLL 465 can operate at the $F_{RES}$ frequency and the VCO output can reach $F_{RES} \times 2^N$, then PLL 472 along with digital counter 473 can both be eliminated, where BCLK 470 then replaces PCLK 476. By selecting the correct value for division factor "B" to meet the requirements of matching REF 451 and StartCLK 460, then the additional PLL 472 and digital counter 473 can be eliminated.

The frequency of the VCO output signal 476 (PCLK) is therefore B times J, times the resonant frequency ($F_{RES}$) where B×J equals $2^N$.

Figure 4C:
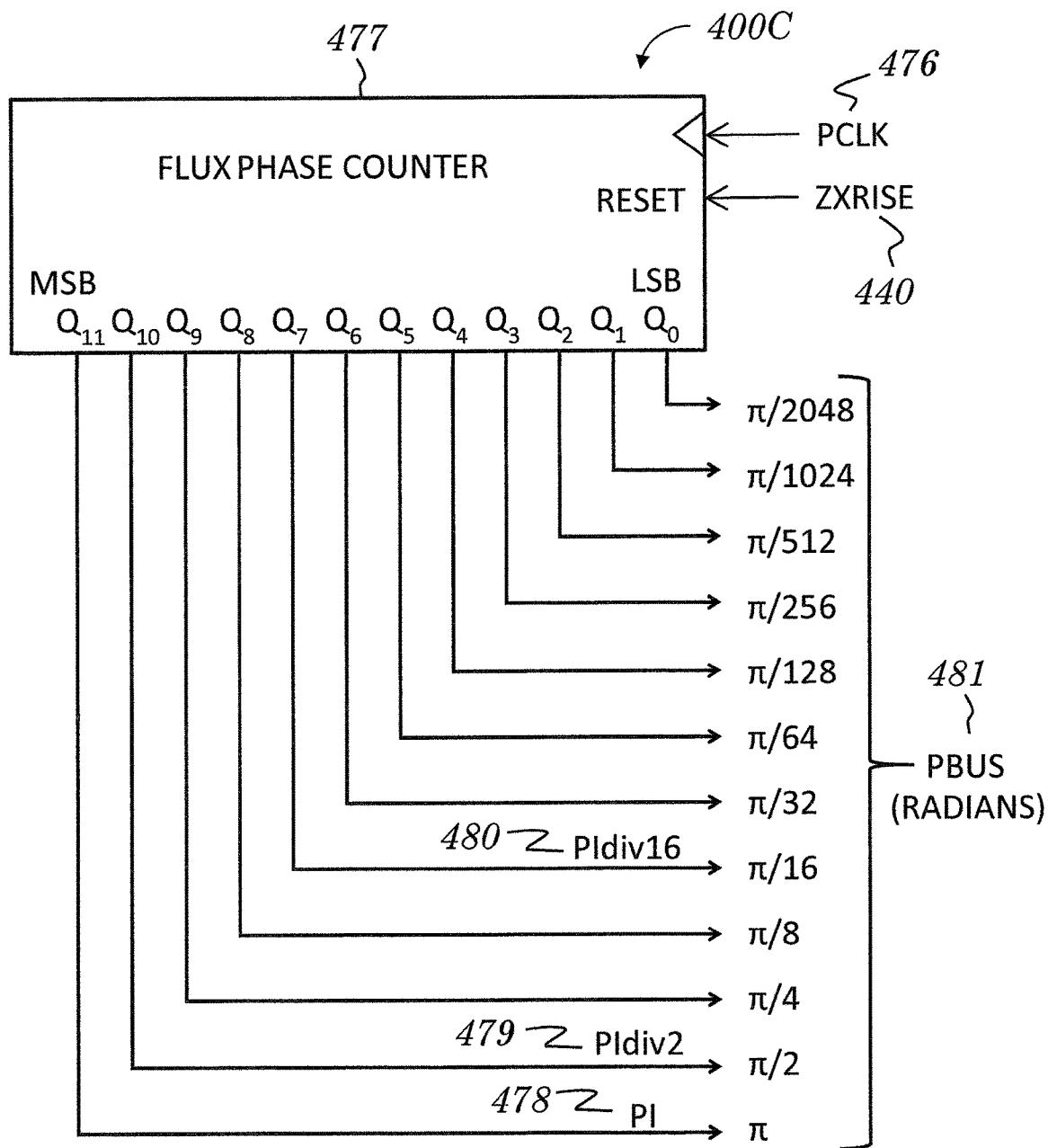
FIG. 4C-D show flux phase and excitation counters of the resonant core power supply of FIG. 1.

Referring to FIG. 4C, the PCLK signal 476, or BCLK 470 (if adequate frequency), from FIG. 4B is fed into a binary counter 477 shown in FIG. 4C. The binary counter 477 counts "PCLK" pulses 476 and the accumulated binary weighted count at any point in time represents the current phase angle of the magnetic flux within the core 102, thus counter 477 is referred to as the "Flux Phase Counter". The parallel binary value representing the instantaneous phase of the magnetic flux circulating within the magnetic core 102 is presented on the "PBUS" 481. Each bit of the PBUS 481 represents a binary increment of the flux phase in terms of radians.

Each bit of the PBUS 481 shown in FIG. 4C is labeled with its binary weight in terms of radians. One full sinusoidal cycle consists of $2\pi$ radians, and any specific binary weighted flux phase value presented on the PBUS 481 ranges inclusively between 0 radians and ($2\pi$–LSB) radians. The Least Significant Bit (LSB) is the $2^0$ bit. $Q_0$ represents the smallest phase increment value of the count in terms of radians.

The resolution of the binary weighted value of the PBUS 481 is determined by the number of binary bits contained in the counter 477

$$\phi_{RES} = \frac{(2\pi)}{(2^N)} \text{radians} \qquad \text{eq. 4.1}$$

Where
$\phi_{RES}$=phase resolution of each PCLK [476] pulse in radians
N=number of the bits in the counter
The binary weight of each bit is $$\phi_n = \frac{2\pi(2^n)}{(2^N)} \text{radians} \qquad \text{eq. 4.2}$$

Where
$\phi_n$=binary weight of any specific bit; in radians
N=number of the bits in the counter
n=specific bit when each bit is numbered from 0 to (N–1)

In order to synchronize the flux phase counter 477 to the magnetic flux accumulated within the core 102, the zero-crossing signal ZXRISE 440 from FIG. 4A resets the count (sets all bits to zero), immediately on the rising edge of ZXRISE 440. The rising edge of ZXRISE 440 should always occur at the zero-degree phase angle of the magnetic flux within the core 102. Therefore, when the phase counter is reset to zero on the rising edge of ZXRISE 440, the phase counter restarts its count from "zero", which synchronizes zero-radians (0 degrees) phase angle of the magnetic flux within the core 102 to the rising edge of ZXRISE 440.

The ZXRISE signal 440 consists of a short pulse having a width long enough to reset the flux phase counter 477, but much shorter than the pulse width of PCLK 476. To avoid masking the next rising edge of PCLK 476, the ZXRISE pulse 440 must end, leaving a safe margin to allow enough setup time for the flux phase counter 477 before the next rising edge of PCLK 476 occurs. This is the purpose of including the time delay created by R2 442 versus C2 443 in the circuit shown in FIG. 4A.

Figure 4D:
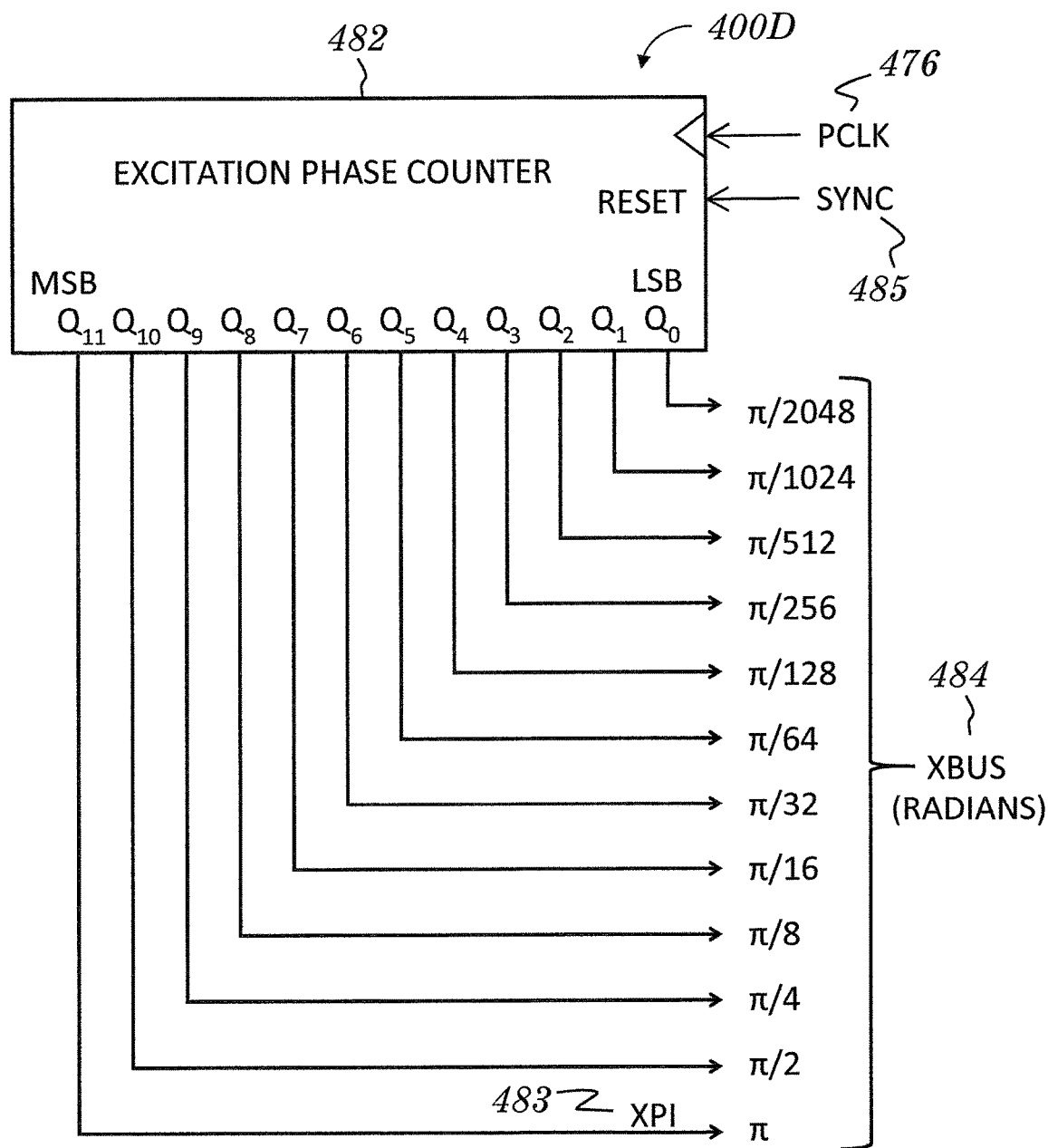

FIG. 4D shows the EXCITATION PHASE COUNTER 482. The Excitation Phase Counter 482 is very similar to the Flux Phase Counter 477 as both counters accumulate the number of PCLK 476 pulses. However, the two counters represent the present phase angle of two different signals; the present phase angle of the excitation signal being constructed by the FFC 114 versus the present phase angle of the flux accumulated within the core 102.

The Flux Phase Counter 477 shown in FIG. 4C produces the "PBUS" 481 which the binary weighted value represents the present phase angle of the flux accumulated within the core 102. On the rising edge of the ZXRISE signal 440 created in FIG. 4A, the Flux Phase Counter 477 is reset.

The Excitation Phase Counter 482 shown in FIG. 4D produces the "XBUS" 484 which the binary weighted value represents the present phase angle of the excitation signal being assembled in the FFC 114. On the rising edge of the SYNC signal 485, the Excitation Phase Counter 482 is reset. SYNC signal 485 which will be discussed later is created in FIG. 4E. The intent of the SYNC signal 485 is to offset the value of the XBUS ahead of the PBUS by a phase amount related to the hysteresis delay ($D_{HYST}$ 226 from FIG. 2B) caused by the core 102. This phase offset is the "timing advance" demonstrated as $D_{HYST}$ 226 in FIGS. 2B, 2C and 2D.

Figure 4E:
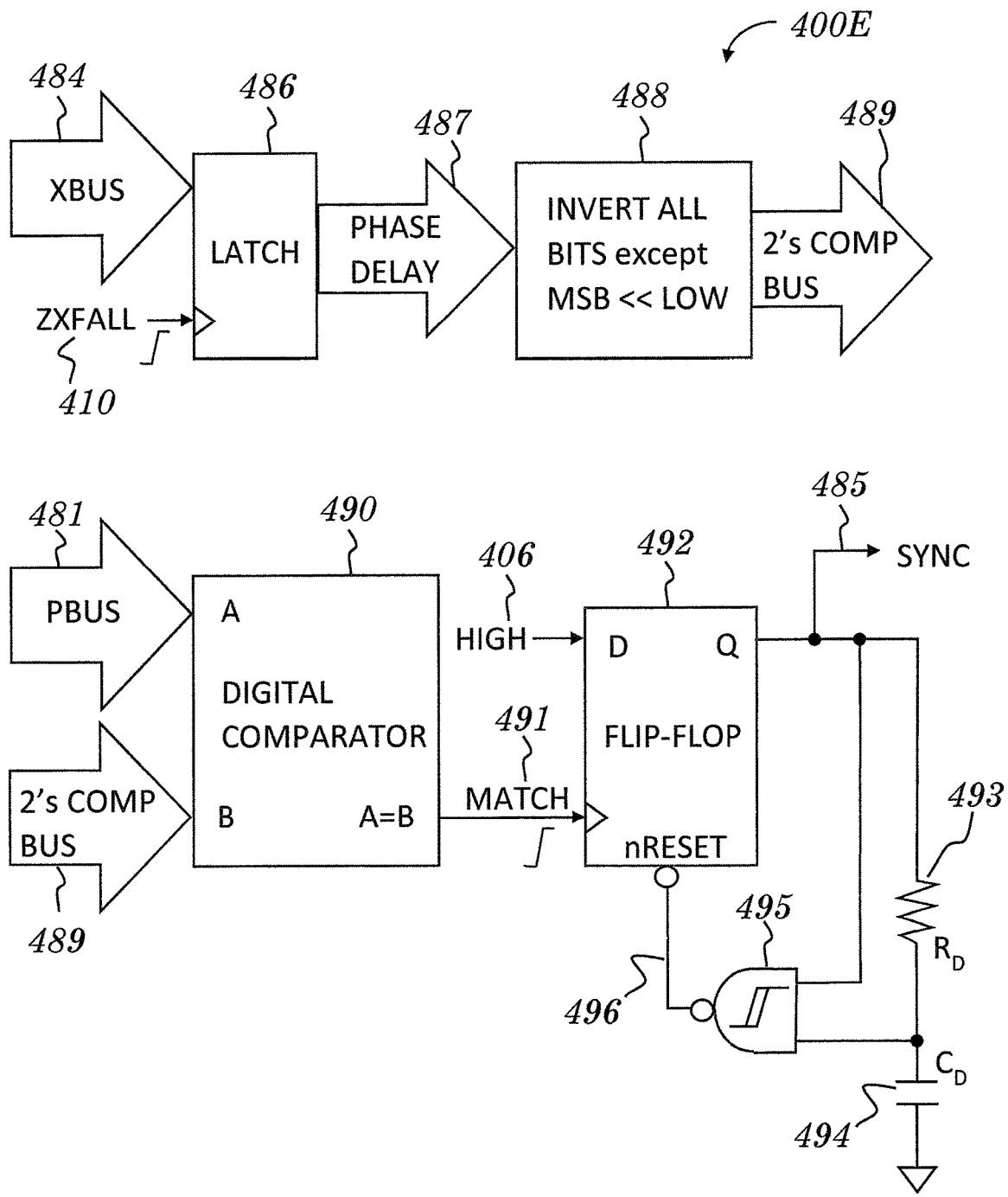
FIG. 4E shows excitation timing of the resonant core power supply of FIG. 1.

FIG. 4E shows the circuitry for controlling the advance timing of the EXCITATION signal. The excitation signal coerces the magnetic flux within the core 102, while hysteresis delay ($D_{HYST}$ 226) of the core 102 delays the phase of the flux created by the excitation signal. Therefore, if the PBUS 481 is in sync with the magnetic flux, then the phase value of the PBUS 481 will be less than the phase value of the XBUS 484 since the phase of flux within the core 102 is delayed with respect to the phase of the excitation signal. The subcircuits shown in FIG. 4E determine the phase difference between the PBUS 481 and XBUS 484 by creating a SYNC pulse 485 to reset the EXCITATION PHASE COUNTER 482 at the correct time.

The XBUS 484 imparts the phase count representing the present parallel binary weighted phase value of the excitation signal to a digital latch 486. The rising edge of ZXFALL 410 (from FIG. 4A) occurs at the zero-crossing of the magnetic flux on the falling slope of the magnetic flux, which occurs at $\pi$ radians (180 degrees). Upon the rising edge of ZXFALL 410 the latch 486 captures a "snapshot" of the XBUS 484 when the magnetic flux within the core 102 at the falling zero-crossing at $\pi$ radians (180 degrees).

The binary value captured by latch 486 represents the phase difference between the PBUS 481 and the XBUS 484 at the instant that the flux within the core 102 crosses zero at $\pi$ radians (180 degrees). Because the XBUS 484 is ahead of the PBUS 481, when the PBUS481 reaches $\pi$ radians (180 degrees), the XPI bit 483 (representing $\pi$ radians of the XBUS 484) should already be set, while the binary weighted value of the other bits of the XBUS 484 add up to the phase delay difference between XBUS 484 versus PBUS 481. The XPI bit 483 is the Most Significant Bit (MSB) of the XBUS 484. Therefore, by ignoring the MSB of the binary value captured by latch 486, the remaining bits represent the binary value of the delay caused by the hysteresis 226 of the magnetic core 102.

The binary value of "PHASE DELAY" 487 captured by latch 486 is then presented to a parallel bank of inverter gates 488, thus causing each bit of the latched Phase Delay value 487 to be inverted, changing any logic HIGH to a logic LOW and vice-versa changing any logic LOW to a logic HIGH. When all of the individual bits of a binary value have been inverted, the binary value remains the same, but the sign has changed, referred to as a two's compliment (2's compliment) value, representing a negative value.

As mentioned above, the MSB of the PHASE DELAY 487 could be ignored. Instead of inverting the MSB and presenting it to the 2's COMP BUS, the MSB of the 2's COMP BUS could be set to a logic LOW by tying it to GND. This leaves just the bits of the PHASE DELAY captured by latch 486 representing the hysteresis phase delay $D_{HYST}$ 226 being inverted and presented to the 2's COMP BUS 489 while the MSB of the 2's COMP BUS will always be tied LOW. After inverting the Phase Delay value 487 and setting the MSB of the 2's compliment LOW, the resulting 2's compliment value now represents the negative value of the Hysteresis Phase Delay value $D_{HYST}$ 226.

The Hysteresis Phase Delay value 487 is then presented to the 2's COMP BUS 489 (with the MSB of the 2's COMP BUS tied LOW). The 2's COMP BUS 489 now represents the binary negative value of the Hysteresis Phase Delay in radians. By adding the negative value of the Hysteresis Phase Delay to the binary value of the PBUS 481, the resulting sum "D" represents the present phase of the PBUS 481 minus the Hysteresis Phase Delay $D_{HYST}$ 226.

The amount of phase advance timing 226 needed to be applied to the next excitation signal to compensate for the hysteresis delay can be calculated using the value "$D_{HYST}$" 226. This timing advance of $D_{HYST}$ 226 then allows the phase of the flux energy created by the next excitation signal to coincide with the phase of the existing flux energy already accumulated in the magnetic core 102.

The Flux Phase counter 477 in FIG. 4C is shown as being 12-bits wide, but 12-bit resolution might not be necessary depending upon the hysteresis of the core 102 and the frequency of $F_{RES}$. In the case of an N-bit wide binary number, the value of all zeros (zero radians), can also represent $2^N$ (which equals $2\pi$ radians). With N being 12 bits, the minimum binary count value of PBUS 481 is 0, while the maximum binary count value presented on the PBUS is $((2^N)-1)$.

The amount of advance needed is then the value of zero radians minus $D_{HYST}$ 226. The phase angle of zero radians (0 degrees) of a sinusoid is equivalent to $2\pi$ radians (360 degrees) which represents the beginning of the next cycle. If binary zero (representing zero radians) is substituted by $2^N$ then the binary flux phase angle (binary value of PBUS 481) where the next excitation signal should begin can be calculated by $$\alpha = \frac{(2^{(N-1)} - D)}{2^{(N-1)}} \text{radians} \qquad \text{eq. 4.3}$$

Where,
α=flux phase in core 102 when next excitation begins
N=width of PBUS [481] (number of binary bits)
D=2's complement value [489], (with MSB tied LOW)

To achieve a phase match between flux created by an excitation signal and the existing flux accumulated within the core 102, as demonstrated in FIG. 2C, the excitation signal must begin when the phase of the excitation signal is advanced by the hysteresis delay ($D_{HYST}$ 226). When the value on the PBUS 481 reaches $2\pi$ minus $D_{HYST}$ 226, the next excitation signal begins.

The PBUS 481 is presented to digital comparator 490 as input word "A", while the 2's COMP BUS 489 is presented to digital comparator 490 as word "B".

The value of the PBUS 481 is continuously incrementing, while the binary value presented to word "B" remains constant for the duration of each cycle. Therefore, at some point in time the binary value of the PBUS 481 presented to the "A" word input of comparator 490 will equal the binary value presented to the word "B" input of digital comparator 490. Whenever the binary word of input "A" equals the binary value of word "B", the "A=B" output (MATCH 491) of comparator 490 will go HIGH.

The rising edge of MATCH triggers flip-flop 492, causing its "Q" output 485 (SYNC) to be set HIGH. The "Q" output of 492 will remain HIGH until flip-flop 492 is RESET. The SYNC signal 485 is presented to one input of Schmidt trigger "NAND" gate 495. In addition, Resistor $R_D$ 493 is pulled HIGH by SYNC 485, causing capacitor $C_D$ 494 to charge, causing the voltage applied to the remaining input of 495 to slowly rise.

Once the voltage across capacitor $C_D$ 494 reaches the input threshold voltage of "NAND" gate 495 is reached, the output 496 of 495 pulls the active "LOW" reset input pin (nRESET) LOW, causing 492 to RESET. This causes the SYNC output 485 to go LOW resulting in the SYNC output 485 lasting for just a short period related to how long capacitor $C_D$ 494 charging through resistor $R_D$ 493 takes to reach a sufficient voltage level to allow NAND gate 495 to recognize a HIGH (logic "1") voltage level. When the SYNC signal 485 goes LOW, the charge on $C_D$ 494 is then drained through $R_D$ 493 down towards 0 volts in preparation for the next SYNC pulse 485.

The combination of flip-flop 492, resistor $R_D$ 493, capacitor $C_D$ 494 and NAND gate 495 form a "single-shot" (multi-vibrator) circuit which produces only one short SYNC pulse 485 each time MATCH 491 rises from LOW to HIGH. By having the pulse width of SYNC 485 shorter than the period of PCLK 476 minus some "set-up" time, the SYNC pulse 485 presented to EXCITATION Phase Counter 482 can be RESET before the next PCLK pulse 476 arrives. The EXCITATION Phase Counter 482 performs the same function as the Flux Phase Counter 477 in FIG. 4C, except that the binary phase count value presented on the XBUS 484 is advanced with respect to the binary phase count value presented on the PBUS 481.

Because the EXCITATION Phase Counter 482 is RESET (re-synchronized) early before the Flux Phase counter 477 of FIG. 4C reaches its limit where it resets to zero, XBUS 484 is now ahead of the PBUS 481 by the phase delay value ($D_{HYST}$ 226) captured by LATCH 486. Because the PCLK 476 which feeds both the Flux Phase counter 477 (shown in FIG. 4C) and the EXCITATION Phase Counter 482 is "phase-locked" to "RISE" 434 (FIG. 4A) by PLL 465 (FIG. 4B), the PBUS 481 (FIG. 4C) and XBUS 484 (FIG. 4D) are both synchronized in phase with the magnetic flux field within the magnetic core 102 although their phases do not match each other.

The count value on the XBUS 484 represents the instantaneous phase of the EXCITATION signal being created by the FFC 114 which is advanced by the $D_{HYST}$ 226 phase delay value that was previously captured by LACTH 486. The FFC 114 uses the XBUS 484 to assemble the waveform that will be presented to the EDC units 120, 122 and 124 (FIG. 1).

5. Description of Remnant Flux Detection and Compensation

The Flux Field Controller 114 creates various signal components which are fed to the Excitation Drive Circuit units 120, 122 and 124 which together create an EXCITATION signal. Magnetic flux is generated within the core 102 by the differential voltage of an Excitation signal applied across one or more excitation windings 130, 132 and 134 by the EDC units 120, 122 and 124.

The LC tank circuit 104, 106 108 and 110 acts as a bandpass filter, causing flux within the core 102 to approach a sinusoidal waveform. As excitation energy is used to create magnetic flux within the core 102, it is filtered by the LC tank circuit. Therefore, whatever the waveform applied across the excitation windings 130, 132 and 134 produces what eventually approaches a sinusoidal flux waveform.

Excitation waveforms that are not sinusoidal and have a duty cycle other than 50% create a DC biased flux component. A 50% duty cycle square wave excitation signal does not cause a DC biased flux. Unfortunately, even with the intent of feeding a square wave excitation signal, small mismatches of rise time versus fall time of the square wave drive circuit may cause a slight DC bias. With each excitation cycle, the small DC bias will accumulate. A high accumulation of DC biased flux component (remnant flux) can become problematic for the following reasons.

Combined AC and DC flux may cause AC flux peaks to reach core saturation levels. As the DC bias rises, the AC flux riding on top of the DC biased flux causes one of the AC flux waveform peaks to be compressed as it approaches saturation. This asymmetric AC flux waveform comprised of large even harmonic components, behaves like a waveform having a duty cycle other than 50%. This asymmetric AC flux waveform creates additional DC biased flux, which only aggravates the situation.

Saturating the core causes extreme heat build-up within the magnetic material comprising the core 102 and reduces the inductance value of the windings. Especially troublesome is altering the self-inductance value ($L_{RES}$) of the resonant winding $W_{RES}$ 104. This results in the resonant frequency of the LC tank 104, 106, 108 and 110 to shift from the intended resonant frequency and no longer matches the StartCLK 460 signal frequency. After shutting down the RCPS unit, if the core 102 remains too hot, the altered self-inductance value $L_{RES}$ of $W_{RES}$ 104 may cause the resonant frequency ($F_{RES}$) of the LC tank 104, 106, 108 and 110 to differ too far from StartCLK 460, preventing the RCPS unit to start-up until the core 102 cools down.

The combined DC remnant flux and intended AC operating flux level increases heat dissipation of the core 102. Since iron loss increases as operating flux level increases, the core 102 temperature rises.

Due to the dangers of developing a high DC biased flux level, the Flux Field Controller (FFC) 114 must monitor, detect, and compensate for any DC flux levels (remanence). Once the FFC 114 detects a DC remnant flux accumulation, the FFC 114 adjusts the duty cycle of the excitation signal waveform to counteract the DC flux bias.

By modulating the duty cycle of the excitation signal while maintaining the correct timing advance, DC biased remnant flux can be removed. Control signals from the FFC 114 used to form excitation signals are simultaneously fed to all of the EDC units 120, 122 and 124. Identical Excitation signals are created by all of the EDC units 120, 122 and 124 which are simultaneously driven across each excitation winding 130, 132 and 134.

Magnetic flux is coerced inside the magnetic core 102 by applying an Excitation signal differentially across each excitation winding 130, 132 and 134, driven by EDC units 120, 122 and 124. The magnitude of flux coerced into the magnetic core by each excitation cycle is dependent upon the peak to peak voltage applied across each of the excitation $W_{EXC}$ windings 130, 132 or 134. The intensity of the coerced flux depends upon the peak voltage per turn applied across each winding divided by the frequency of the excitation signal, $F_{RES}$.

Therefore, by controlling the peak voltage of the excitation signal, the flux level can be controlled. Through the efforts of the FFC 114 to maintain the correct phase relationship between the excitation signal and the flux already accumulated within the core 102, each excitation cycle applied accumulates additional flux stored within the core 102. Eventually, the accumulated flux within the core 102 reaches its maximum level when the resonant voltage level $V_{RES}$ 170 has reached its nominal operating level. The nominal operating peak voltage level of $V_{RES}$ 170 is based upon the turn's ratio between the number of turns $N_{RES}$ in the $W_{RES}$ resonant winding 104, versus the number of turns $N_{EXC}$ in the $W_{EXC}$ excitation windings times the peak voltage applied across each excitation winding 130, 132 and 134.

At this point, the resonant voltage $V_{RES}$ 170 has reached its nominal operating level, and the LC tank circuit has become "fully charged". As the LC tank circuit 104, 106, 108 and 110 becomes fully charged, the resonant impedance of the LC tank approaches infinity, precluding any additional power drawn into the LC tank circuit 104, 106, 108 and 110. Controlling the peak voltage amplitude of the excitation signal controls the level of $V_{RES}$ 170 once the LC tank circuit 104, 106, 108 and 110 has been charged, which in turn determines the nominal resonating flux level stored within the core 102.

Referring to FIG. A, solid trace 501 represents a square wave (50% duty cycle) of the differential Excitation signal voltage applied across each excitation winding 130, 132 and 134. The rise and fall times have been exaggerated in the drawing for clarity. The X-axis 504 represents zero volts peak to peak differential voltage applied across each of the Excitation windings 130, 132 and 134. The maximum differential positive peak voltage $+V_{EXCPK}$ 502 applied across the excitation windings 130, 132 and 134 ideally matches the maximum negative peak voltage $-V_{EXCPK}$ 503.

Phase markings along the horizontal axis refer to the phase count of the Excitation Phase Counter 482 value presented on the XBUS 484, FIG. 4D.

Figure 5A:
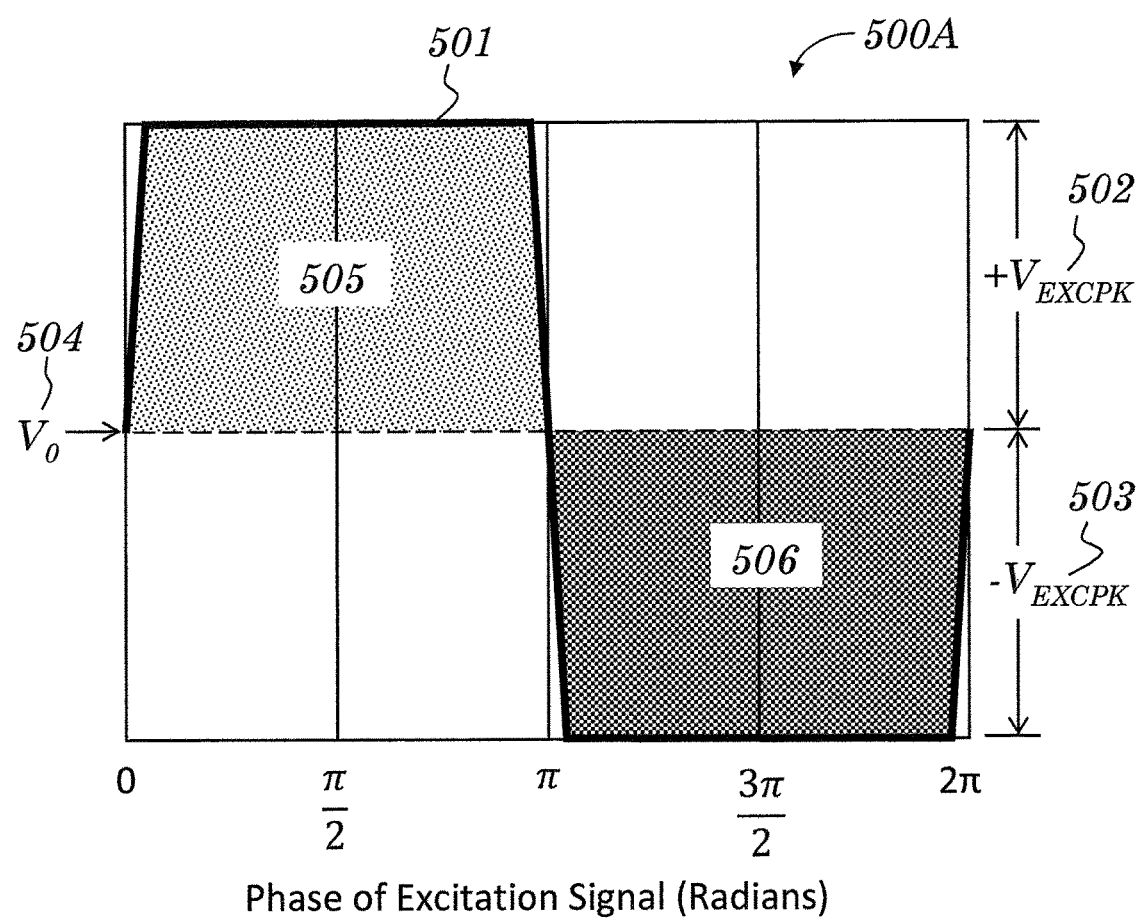
FIGS. 5A-C show duty cycles of the resonant core power supply of FIG. 1.

The Excitation waveform 501 shown in FIG. 5A has already been advanced with respect to the flux phase counter 477 by the hysteresis delay amount $D_{HYST}$ 226, FIGS. 2B, 2C and 2D. The circuit shown in FIG. 4E creates the SYNC signal 485 to reset the Excitation Phase Counter 482 ahead of the Flux Phase Counter 477 FIG. 4C. Therefore, the zero-radian value on the X-axis of FIG. 5A is advanced with respect to the accumulated flux within the core 102 by the hysteresis delay amount, $D_{HYST}$ 226.

The shaded area 505 represents positive current being drawn by the particular excitation winding $W_{EXC}$ 130, 132 or 134 coercing flux within the core 102. The shaded region 506 represents the negative current being drawn by the particular excitation winding W$_{EXC}$ 130, 132 or 134 coercing flux within the core 102. The shaded area of current drawn during the positive waveform peak 505 equals the shaded area of current drawn during the negative peak of the waveform 506, thus there should be no resulting DC bias to cause remnant flux.

Figure 5B:
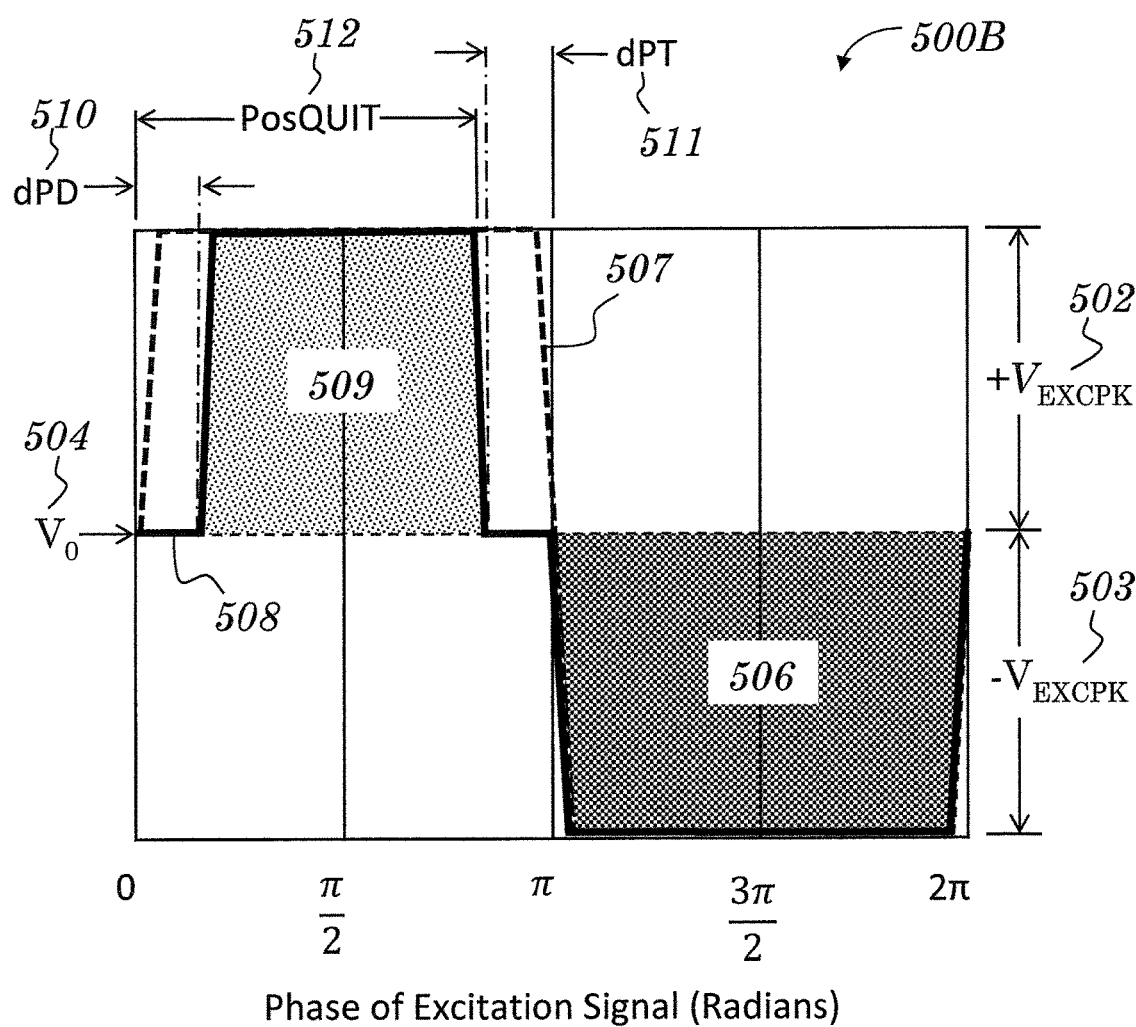

Referring to FIG. 5B, the dashed trace 507, represents an Excitation signal having a square wave (50% duty cycle) shown as a comparison reference. The solid trace 508 shows an Excitation signal with an altered duty cycle waveform. The shaded area 509 represents positive current flow fed through the attached excitation winding 130, 132 or 134. The other shaded region 506 represents the negative current flow through the load. Negative current flow region 506 has not been altered from the previous negative current flow area 506 created by a 50% duty cycle excitation signal as shown in FIG. 5A.

Since the negative current flow area 506, is greater than the positive current flow area 509, the net result is a more negative bias than positive, thus removing some positive remnant flux. The duty cycle of the positive half of the excitation waveform has been reduced to something less than 50% while the negative portion of the waveform remains around 50%. The positive area has been delayed after 0 radians by an amount shown as dPD 510. The positive peak of the waveform is then truncated early (drops to X-axis 504, zero Vpp).

This duty cycle change occurs at the time shown as PosQUIT 512 determined by the FFC 114 as needed to remove the positive DC biased remnant flux. Notice that the upper half of the waveform begins late and ends early, while the resulting pulse width is equally centered around π/2 radians. This is accomplished by the FFC 114 intentionally keeping the phase delay amount dPD 510 being equal to the amount of duty cycle truncated from the end of the pulse, dPT 511. This maintains better flux symmetry to avoid causing a phase shift of the newly created excitation flux with respect to the existing flux already accumulated within the core 102.

Due to the rise and fall time of the current waveform 508 there is a small difference between PosQUIT 512 and the beginning of dPT 511. Ideally, the calculations made by the FFC 114 to determine the value of PosQUIT 512 has taken the fall time into account to minimize the difference between dPD 510 and dPT 511. The FFC determines the ideal duty cycle to be used to reduce the remnant flux.

Figure 5C:
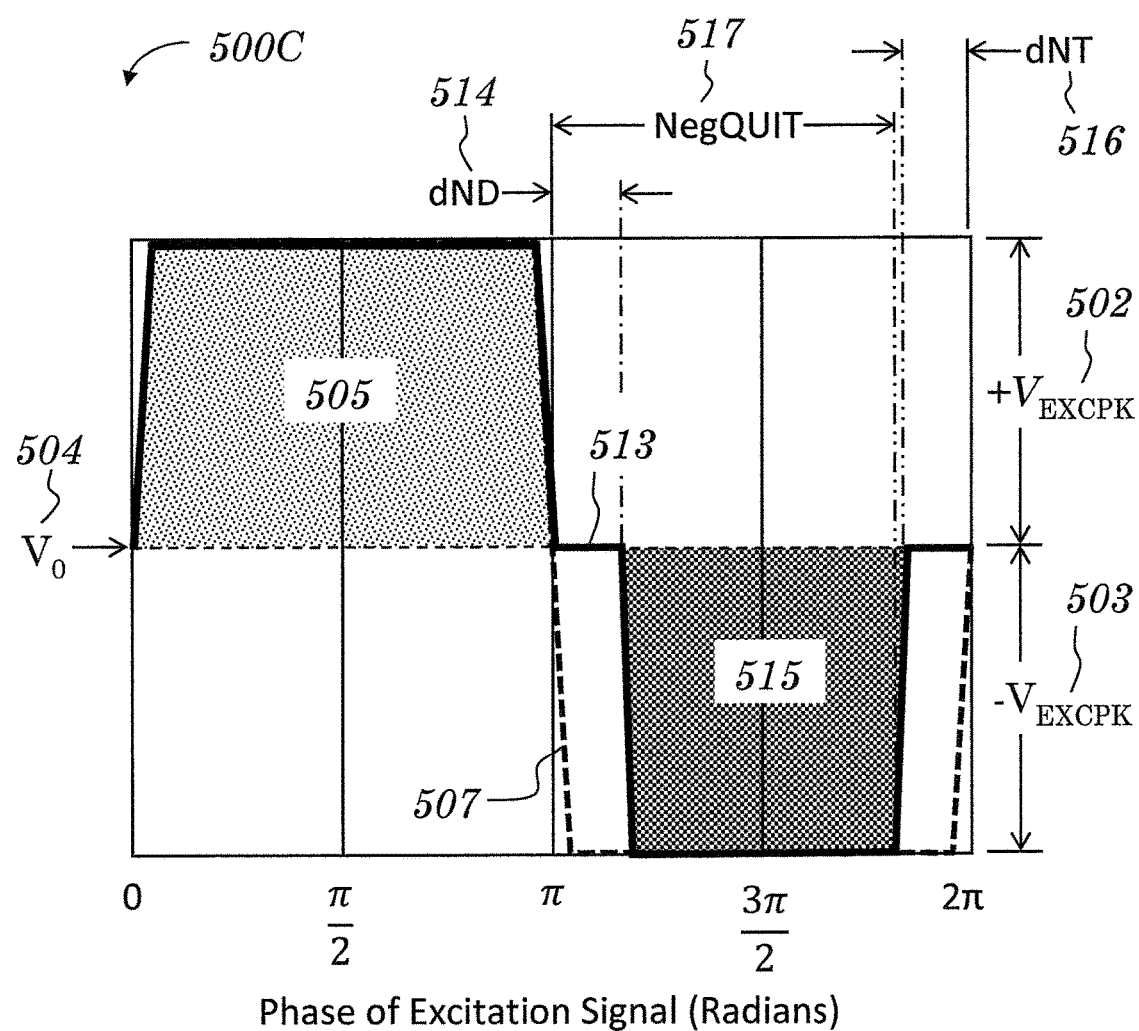

Referring to FIG. 5C, the dashed trace 507, represents a square wave (50% duty cycle). The excitation signal is shown as a comparison for reference. Solid trace 513 shows the voltage waveform of an altered duty cycle of an Excitation signal where the Negative portion (below X-axis 504) is truncated. The rising edge of the positive portion of the waveform (shaded area 505) begins at 0 degrees or multiples of 2π radians and has approximately a 50% duty cycle. The beginning of the Negative current (shaded area 515) remains along the X-axis briefly as it is delayed after π radians, then it is truncated early before reaching 2π radians by returning to the X axis (zero current flow). The resulting pulse width is equally centered around 3/2 π radians in order to maintain waveform symmetry with the intent to minimize any phase shift of the created flux. This results in a negative current flow duty cycle less than 50%.

The phase delay between π radians and the beginning of the negative current flow peak dND 514 is intentionally kept equal to the amount truncated from the negative current flow pulse width, dNT 516. This maintains the negative pulse peak centered around 3/2 π radians. Due to the rise and fall time of the current waveform there is a small difference between NegQUIT 517 and the beginning of dNT 516. Ideally, the calculations made to determine the value of NegQUIT 517 has taken the current fall time into account to minimize the difference between dND 514 and dNT 516.

Figure 5D:
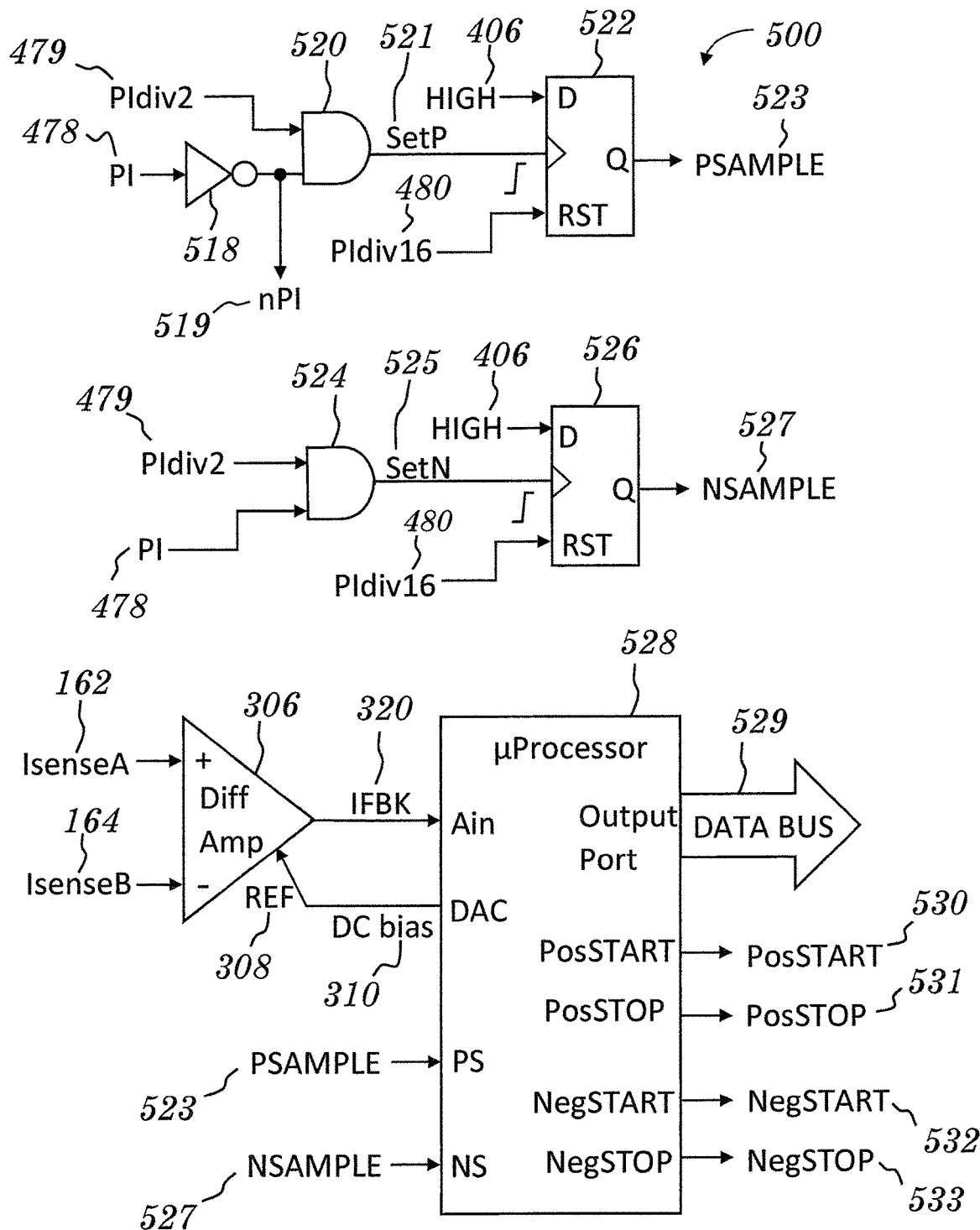
FIG. 5D shows determining and measuring remnant flux of the resonant core power supply of FIG. 1.

The circuitry shown in FIG. 5D is part of the FFC 114 which detects the presence of remnant flux and modulates the duty cycle of the EXCITATION Signal to compensate for remnant flux. This circuitry is intended to be implemented using programable logic devices, however, discrete hardware components could also be used.

To create the EXCITATION signal waveform, the signal is divided into two sections; the "positive" half of the waveform extending from 0 radians (0 degrees) to π radians (180 degrees), while the "negative" portion extends between π radians (180 degrees) to 2π radians (360 degrees). In order to compensate for remnant flux, the duty cycle of each half of the signal needs to be modulated depending upon the presence of and the amplitude of any DC biased remnant flux.

Refer to FIG. 5D. The present phase angle of the resonant magnetic flux within the core 102 is monitored by the PBUS 481, which is created by the Flux Phase Counter 477, shown in FIG. 4C. The Most Significant Bit (MSB) of the PBUS 481 represents the π radians bit, PI 478, and the second highest bit is the π/2 radians bit, PIdiv2 479 signal, both of which arrive at the upper left corner of FIG. 5D.

Inverter gate 518 receives the PI signal 478, inverts it to create nPI 519 and presents it to "AND" gate 520 along with the PIdiv2 signal 479. The rising edge of "AND" gate 520 output "SetP" 521, causes the flip-flop 522 to SET its Q output, PSAMPLE 523 HIGH when PI 478 is LOW and PIdiv2 479 is HIGH. The PSAMPLE 523 flag signal only occurs when PI 478 is LOW, phase angle is less than PI radians (180°), and the PIdiv2 signal is HIGH (π/2 radians, 90°). The RESET input (RST) of flip-flop 522 is fed by the fifth highest PBUS bit, PIdiv16 480 (representing odd multiples of 5.625°). On the next rising edge of PIdiv16 480, the flip-flop 522 is RESET, causing the PSAMPLE 523 flag signal to go LOW again.

This means that the PSAMPLE flag signal 523 is HIGH only when $$\frac{\pi}{2} \le PBUS \text{ count} < \left(\frac{\pi}{2} + \frac{\pi}{16}\right) \text{RADIANS}$$

or 90° ≤ PBUS count < 95.625°

Similarly, output SetN 525 of "AND" gate 524 SETS the Q output NSAMPLE 527 of flip-flop 526 when PI 478 and PIdiv2 479 are both HIGH, and then is RESET on the next rising edge of PIdiv16 480.

This means that the NSAMPLE is HIGH only when $$\left(\frac{3\pi}{2}\right) \le PBUS \text{ count} < \left(\frac{3\pi}{2} + \frac{\pi}{16}\right) \text{RADIANS}$$

or 270° ≤ PBUS count < 275.625°

The PSAMPLE 523 and NSAMPLE 527 flag signals indicate when one of the two amplitude peaks of the sinusoidal flux within the core 102 are expected to occur. These two peaks are expected to occur at π/2 radians (90°) for the PSAMPLE flag signal 523 and 3/2π radians (270°) for the NSAMPLE flag signal 527. These flag signals must not dwell too long and must clear quickly after the associated peak passes by, in this case the PIdiv16 signal 480 from the PBUS 481 causes the flag signals to clear just 5.625° later.

In FIG. 2A and FIG. 3, the differential feedback signal comprised of IsenseA 162 and IsenseB 164, is fed into the differential amplifier 306 (FIG. 3), repeated in FIG. 5D, which produces a single-ended output signal, IFBK 320. The IFBK signal 320 is biased above ground (zero volts) by adding a DC reference signal, DC bias 310 to the REF input 308 of differential amplifier 306 and is then fed into an analog input (Ain) of microprocessor 528. The DC bias 310 offsets the IFBK signal 320 above ground in order to satisfy the single-ended analog input (Ain) of a typical microprocessor 528. A Digital to Analog Converter (DAC) output on processor 528 provides an easy to calibrate DC voltage to use as an offset bias voltage. Typically, a microprocessor DAC output is a single-ended positive DC voltage between 0 volts and an analog reference voltage.

The IFBK signal 320 applied to analog input (Ain) of 528 is digitized by an Analog to Digital Converter (ADC) internal to 528. Digital General Purpose Input/Output (GPIO) inputs on 528 labeled here as PS and NS receive flag bits PSAMPLE 523 from flip-flop 522 and NSAMPLE 527 from flip-flop 526 signifying the correct time to digitize ("take a sample") of the DC biased IFBK 320 analog signal. The ADC fed by IFBK 320 must have a conversion rate fast enough to perform an Analog to Digital conversion during the short period that either sample flag bit (PSAMPLE 523 or NSAMPLE 527) is active.

Ideally, the above conversions are made immediately on the rising edge of each flag bit to minimize measurement error due to missing the absolute peak of the $I_{RES}$ 160 current waveform IFBK 320. The DC bias reference signal 310 produced by the DAC tracks the same DC reference voltage used by the Ain ADC, which minimizes errors due to DC offset drift over time and temperature.

The speed of microprocessor 528 must be sufficient to accomplish each analog to digital conversion, perform data analysis algorithms and complete any necessary software routines quickly enough to avoid missing the next sample flag (PSAMPLE 523 or NSAMPLE 527), allowing only 15/16 π radians (174.375 degrees) of $F_{RES}$ in between samples to perform these tasks.

In the presence of remnant flux, the IFBK signal 320 will contain a small DC offset representing the amount of remnant flux. The DC offset due to remnant flux is a relatively small value in comparison to the nominal amplitude of the IFBK signal 320. Small DC offsets, DC drift or noise could cause false indication of remnant flux. To minimize this potential risk, the peak amplitude of the IFBK signal 320 is sampled twice each cycle, once at each of the theoretical sinewave peaks occurring at π/2 radians (90 degrees) and (3/2) π radians (270 degrees). If there is no remnant flux, the peak value of IFBK 320 at 90 degrees versus the peak value at 270 degrees should ideally be the same (except having opposite polarity).

If a small DC offset is present, such as caused by remnant flux, then one peak measurement will be higher than the other measurement by twice the amount of the DC offset. Since these measurements yield digitized numeric values, the microprocessor 528 can easily determine the amplitude difference between both measurements by subtracting the absolute value of one measurement from the other. Noise can be averaged out over multiple samples. DC offsets caused by amplifier DC offsets and thermal drift can be minimized by using the same differential amplifier and analog input (Ain) for both positive peak and negative peak measurements. Static DC offset can be calculated and the DAC value can be changed to cancel out amplifier DC offsets using recalibration algorithms performed by software routines inside 528.

The peak values of each IFBK 320 sinewave signal peak are determined by taking samples of the IFBK signal 320 by the same Ain ADC of 528 at two points in time relating to the expected maximum positive sinewave peak occurring at π radians (90 degrees) and the negative sinewave peak occurring at 3/2π radians (270 degrees).

When microprocessor 528 sees the PSAMPLE flag 523 go HIGH, the IFBK signal 320 is measured and digitized by the ADC inside 528 to obtain the "positive peak value". When microprocessor 528 sees the NSAMPLE flag 527 go HIGH, the IFBK signal 320 is measured and digitized by the ADC inside 528 to obtain the "negative peak value".

The positive peak amplitude is calculated by subtracting the binary value fed to the DAC inside 528 used to create the DC bias 310 used to bias amplifier 306 from the digitized value of the positive peak measurement taken by the Ain ADC inside 528. The absolute value of the negative peak amplitude is calculated by subtracting the binary value fed to the DAC inside 528 used to create the DC bias 310 (which biases 306) from the digitized value of the negative peak measurement taken by the Ain ADC inside 528.

If the positive peak value equals the negative peak value, then there is no remnant flux and therefore the duty cycle of both halves of the excitation signal should each be kept equal, at around 50% duty cycle (each half being around r radians (180 degrees) in length. If there is a difference between the two peak values, then 528 decides which peak value (positive versus negative measurement value) is larger. The pulse width duty cycle of the of the excitation signal must be altered to compensate for remnant flux. The larger of the two peak measurements determines which peak of the excitation signal (positive peak versus negative peak) is modified.

To compensate for positive remnant flux, then the duty cycle of the positive peak of the excitation signal must be reduced by a comparable amount in which the peak amplitude has increased due to DC remnant flux bias. Likewise, if the remnant flux is negative, then the duty cycle of the negative peak of the excitation signal must be reduced.

The optimum duty cycle value is determined by the microprocessor 528 based upon the amplitude of the DC offset of IFBK 320. To maintain waveform symmetry, the amount of duty cycle reduction is then divided in half, producing two equal binary phase reduction values for each end of one of the waveform peaks to be modified (either the positive or negative pulse widths). These binary values are PosDELAY, dPD, 510 and PosQUIT 512 for modulating the positive half of the waveform, while NegDELAY, dND 514 and NegQUIT 517 for modulating the negative half of the waveform.

The duty cycle correction value needed to compensate for remnant flux is determined by the following steps.

Determine which peak amplitude measurement is larger (positive versus negative). The peak having the highest amplitude measurement needs to have its pulse width reduced while the remaining peak is left around π radians (180 degrees) duration.

Subtract the smaller value (positive peak or negative peak amplitude) from the larger peak measurement value. This represents twice the DC bias caused by remnant flux.

Divide the resulting difference by two. This yields the peak amplitude offset caused by remnant DC flux. This division can be performed in binary by shifting the binary difference value by one-bit position to the right (when the binary value is represented with the Most Significant Bit (MSB) in the left most position; little-endian).

The anticipated nominal peak amplitude value of the IFBK 320 signal is calculated by adding the above peak DC offset value to the smaller of the two peak measurement values (positive peak versus negative peak measurement values made by Ain of 528).

Determine the ratio of the remnant DC offset amplitude versus the nominal peak amplitude value. This ratio ($R_{REDUCTION}$) is calculated by dividing the peak DC offset value by the nominal peak value. The $R_{REDUCTION}$ ratio represents the duty cycle reduction factor needed for the offending pulse width.

Calculate what the pulse width (duty cycle) of the peak that will become the final modified duty cycle by multiplying the $R_{REDUCTION}$ ratio by the binary value that represents $\pi$ radians (180 degrees, where MSB is set HIGH and all other remaining bits are LOW), by the $R_{REDUCTION}$ ratio value. Round to the nearest integer value of the result.

The resulting binary pulse width is then subtracted from the nominal binary value for 50% pulse width (r radians). If the rise time, fall time and "dead time" (to be discussed later) are taken into account, then the nominal binary value for 50% duty cycle might be less than $\pi$ radians. This yields the binary value (expressed in radians) removed from the pulse width.

Divide the binary integer value of pulse width reduction from the above step by two and round to the nearest integer. This result ($B_{DELAY}$) represents the equal amount of pulse width in binary radians removed from both the beginning and the end of each pulse peak being modified in terms of excitation phase counts, PCLK 476 pulses. This binary $B_{DELAY}$ becomes the "START" delay value (dPD 510 FIG. 5B for beginning a modified positive excitation signal peak, or dND 514 FIG. 5C) for beginning a modified negative excitation signal peak.

The positive "QUIT" value (PosQUIT 512 for terminating the positive pulse peak is determined by subtracting delay reduction value ($B_{DELAY}$) from the nominal 50% duty cycle binary radians value, around $\pi$ radians. The negative "QUIT" value, NegQUIT 517 for terminating the negative pulse peak is determined by subtracting the delay reduction value ($B_{DELAY}$) from the binary $2\pi$ radians value, (which is also "zero" radians, binary 0x000h).

After performing the above steps, optimal positive and negative duty cycles for the next excitation signal have been determined in order to compensate for remnant flux. The next EXCITATION signal waveform is then assembled by concatenating a "positive" half waveform with a "negative" half waveform. The positive half duty cycle occurs during the positive 0 to $\pi$ radians (0 to 180 degrees) portion of the waveform while the negative duty cycle value is applied to the waveform during the negative half of the waveform ranging from $\pi$ radians to $2\pi$ radians (180 degrees to 360 degrees). Concatenating the two halves results in an excitation waveform similar to those shown in FIGS. 5B and 5C.

Once the microprocessor 528 has determined the ideal waveform after evaluating the most recent peak amplitude measurements, four binary values are then presented to the circuitry used to modify the waveform of the excitation signal. These binary values are The amount of phase delay (Positive delay, dPD 510) used to delay starting the positive half of the waveform (shaded area 509 in FIG. 5B).

The phase angle at which time the positive pulse width (shaded area 509 in FIG. 5B) is truncated, (PosQUIT 512).

The amount of phase delay (Negative delay, dND 514) used to delay starting the negative half of the waveform (shaded area 515 in FIG. 5C.

The phase angle at which time the negative pulse width (shaded area 515 in FIG. 5C) is truncated, (NegQUIT 517).

The binary values listed above are presented one at a time onto the DATA BUS 529 by microprocessor 528, and latched into specific data latches, allowing each digital value to be used later. Latch strobe signals including PosSTART 530, PosSTOP 531, NegSTART 532 and NegSTOP 533 from microprocessor 528 are used to strobe the appropriate data latch for the current data presented on the data bus 529.

As each new set of binary values are determined from the last sample of IFBK 320, the associated values for the "START" delay and "QUIT" phase angle values are updated immediately into the appropriate data latch. This allows real-time adjustment while the RCPS is in operation.

Figure 5E:
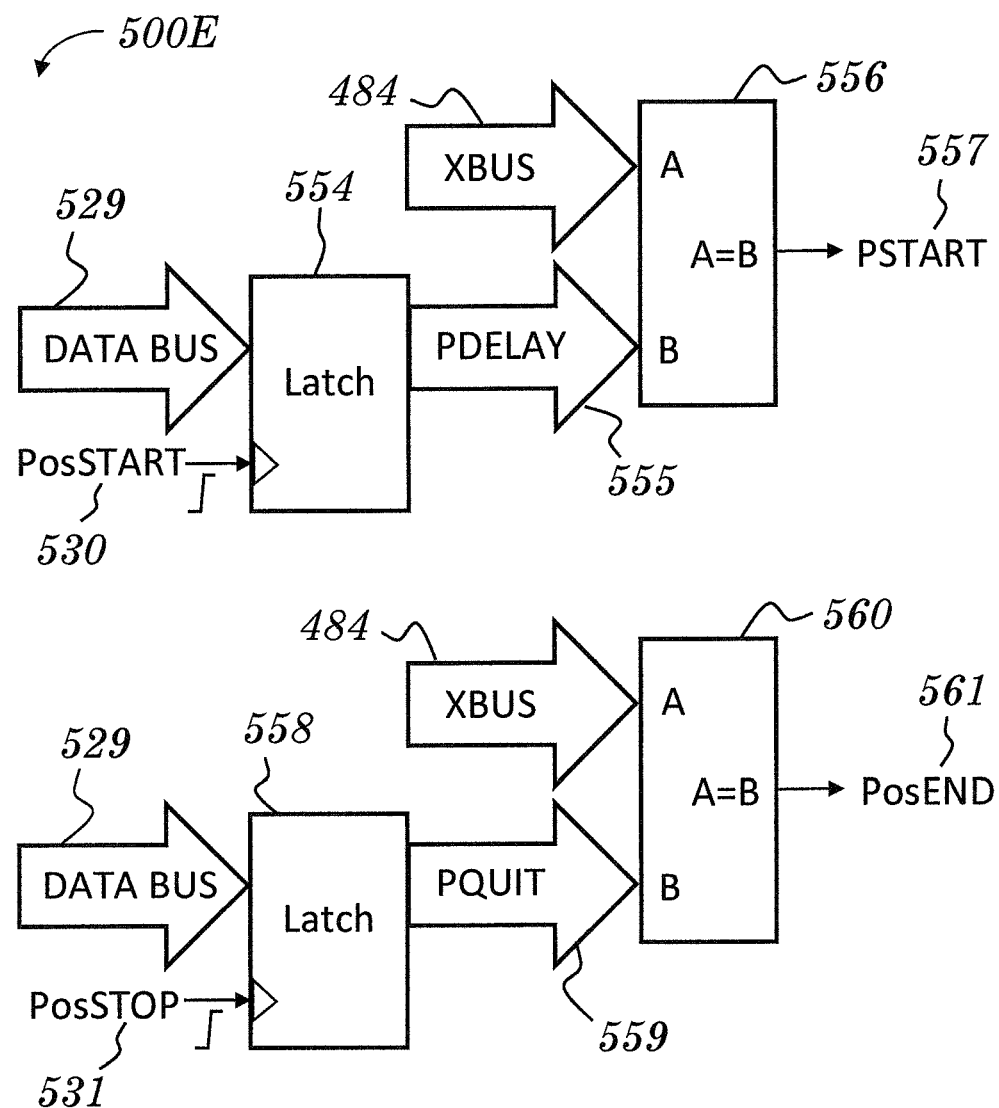
FIG. 5E shows forming the positive half of the excitation signal of the resonant core power supply of FIG. 1.

Refer to FIG. 5E. On the rising edge of the PosSTART strobe 530, latch 554 loads the binary phase value presented on the DATA BUS 529 by the microprocessor 528 representing the amount of phase delay before the positive peak of the excitation waveform begins, and then saved by latch 554 as PDELAY 555. The latched binary value of PDELAY 555 is fed into digital comparator 556 as word "B" while the XBUS 484 is fed into 556 as word "A", representing the present phase of the Excitation waveform. Since the XBUS 484 continuously increments as time goes by, at some point word "A" will equal word "B" causing the A=B output of 556, PSTART 557 to briefly go high, for the duration of one PCLK 476 pulse period (FIG. 4B).

On the rising edge of the PosSTOP strobe 531 from 528, latch 558 loads the binary phase value, PosQUIT 512 (FIG. 5B) presented on the DATA BUS 529 by the microprocessor 528 representing the phase angle at which point the positive peak pulse width should end. Latch 558 saves the PosQUIT 512 value and presents it as PQUIT 559. When the XBUS 484 value equals the PQUIT 559 value, the A=B output of digital comparator 560, PosEND 561 briefly goes HIGH.

Figure 5F:
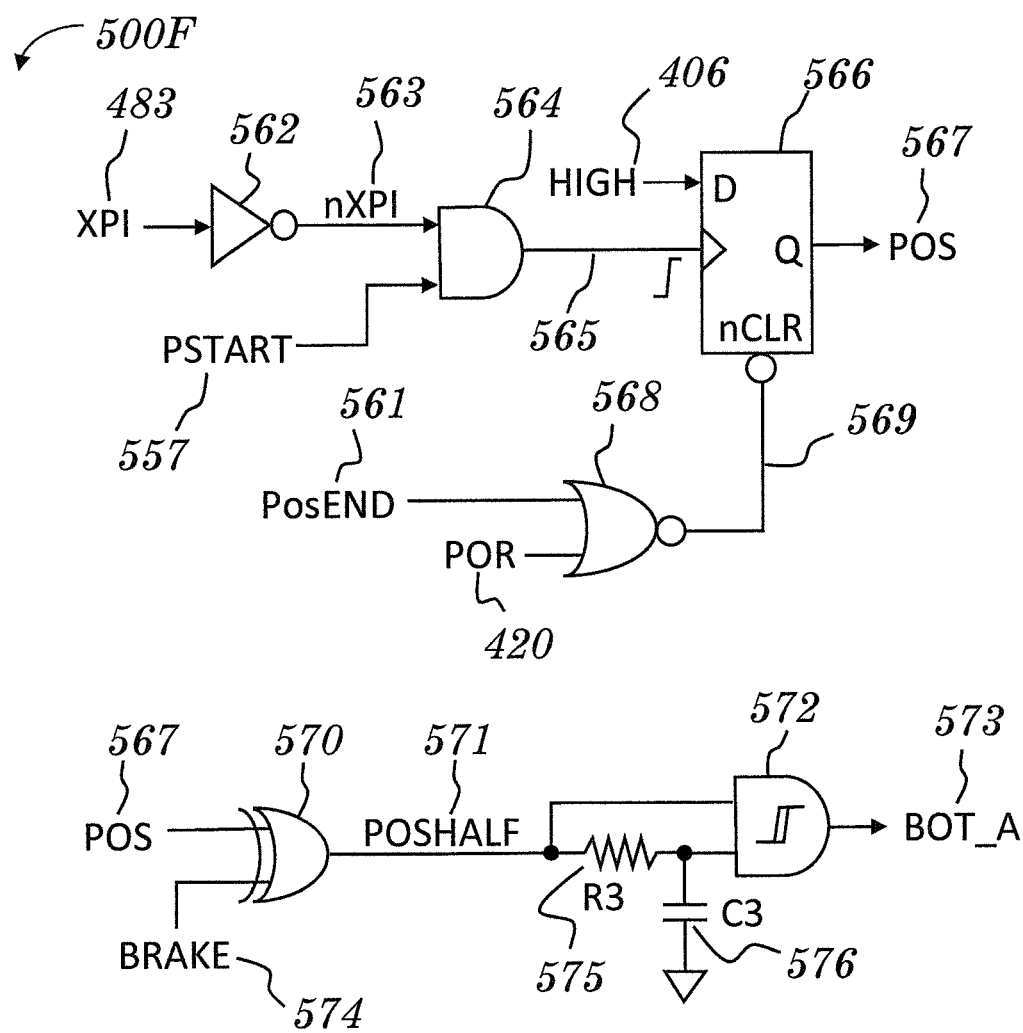
FIG. 5F shows controlling the bottom MOSFET on leg A of the resonant core power supply of FIG. 1.

Referring to FIG. 5F. The XPI bit 483 from the XBUS 484, represents the H radians excitation phase bit which is HIGH only when the excitation waveform phase angle is at least 180 degrees and less than 360 degrees. The XPI bit 483 is inverted by inverter 562 to become nXPI 563. The nXPI signal 563 signifies that the present phase angle of the Excitation waveform is greater than or equal to 0 degrees but less than 180 degrees. PSTART 557 is fed into "AND" gate 564 along with the nXPI bit 563. When PSTART 557 and nXPI 563 are both HIGH, the rising edge of output 565 of AND gate 564 causes the Q output, POS 567 of flip-flop 566 to "SET", which begins the Positive half of the Excitation waveform.

Output 569 of "NOR" gate 568 causes flip-flop 566 to "RESET" whenever either the PosEND signal 561 or the Power-On Reset (POR) signal 420 goes HIGH. This causes the output POS 567 of flip-flop 566 to go LOW, causing the positive peak of the excitation signal to end.

For removing excess flux amplitude, the BRAKE signal 574 (to be explained later) is applied to "Exclusive OR" (XOR) gate 570 causing the POS signal 567 to be inverted, becoming the POSHALF 571 signal, effectively shifting the POS 567 signal by 180 degrees whenever the BRAKE signal 574 is active.

The output signal BOT_A 573 of Schmidt trigger "AND" gate 572 is used to feed EDC units 120, 122 and 124 in creating excitation signals. The EDC units 120, 122 and 124 incorporate an "H" bridge circuit to differentially drive an excitation signal across an excitation winding 130, 132 or 134 differentially connected across the two output terminals of the "H" bridge, labeled as (LEG_A and LEG_B).

Figure 5G:
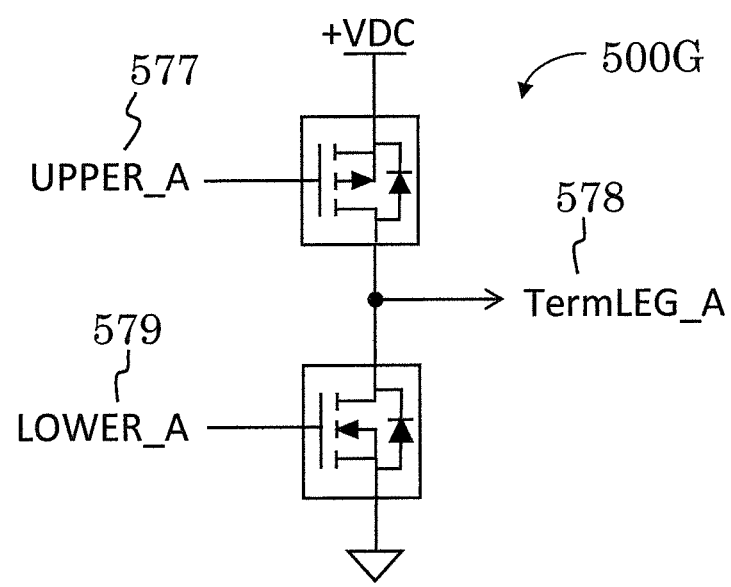
FIG. 5G shows an exemplary half of an "H" bridge of the resonant core power supply of FIG. 1.

Refer to FIG. 5G. An "H" bridge circuit consists of two halves (legs), "LEG_A" and "LEG_B". Each leg consists of an upper and lower switch device such as a transistor, IGBT or MOSFET connected in series (totem-pole configuration). FIG. 5G shows the "LEG_A" half of an "H" bridge. A P-Channel MOSFET is shown representing the upper switch device, controlled by UPPER_A signal 577. An N-Channel MOSFET is shown representing the lower switch device, controlled by LOWER_A signal 579. The two devices are connected in series by a common node between the two which is labeled as TermLEG_A 578. TermLEG_A 578 is the output terminal for "LEG_A". A complete "H" bridge circuit consists of a second identical circuit that would be referred to as "LEG_B" having an output terminal labeled as TermLEG_B. Upper MOSFET on LEG_B would be driven by UPPER_B and the lower LEG_B MOSFET would be driven by LOWER_B. A DC power source is shown as +VDC having its return connected to "ground". Both legs of the "H" bridge would share the same power source.

The two switch devices (MOSFETs) of each leg are energized alternately to pull the common output node in between each MOSFET upward towards the DC power source or downward towards the DC power return node (ground). Whenever the upper MOSFET is turned "ON", the lower MOSFET must be turned "OFF", otherwise if both are "ON", the two devices will pull against each other ("latch-up") until one or both devices are destroyed. Careful design must be implemented to avoid turning on one device before the other device is turned completely off.

Signal BOT-A 573 shown in FIG. 5F controls the bottom MOSFET on LEG_A of an "H" bridge inside EDC units 120, 122 and 124 to turn on when HIGH and off when LOW. The circuit involving resistor R3 575 and capacitor C3 576 form an RC delay circuit. When POSHALF 571 goes HIGH, one input to Schmidt trigger "AND" gate 572 is immediately pulled HIGH, while the other input to 572 is delayed as the voltage across C3 capacitor 576 charges. This causes the output BOT_A 573 to be delayed as "AND" gate 572 waits for both of its inputs to become HIGH simultaneously. When POSHALF 571 goes from HIGH to LOW, the output BOT_A 573 immediately goes LOW, despite the fact that the charge across C3 576 temporally holds the associated input of "AND" gate 572 HIGH. The result of the RC delay circuit causes the BOT_A 573 signal to stall briefly when being commanded to go HIGH, while causing the BOT_A 573 signal to immediately go LOW as soon as POSHALF 571 goes LOW. If similar circuitry is used to control the upper switch device (MOSFET) on LEG_A, then whichever device is commanded to turn "OFF" immediately begins turning "OFF", whereas when told to turn "ON", the device stalls briefly before beginning to turn "ON". By providing this "dead-time", the MOSFET being commanded to shut-off immediately begins shutting down while the associated MOSFET on the same leg is delayed before beginning to turn on. The design intent is to extend the dead-time long enough to exceed the "Fall time" of the slowest of the two switch devices (upper versus lower device) to avoid a latch-up catastrophe where both devices are simultaneously on.

Figure 5H:
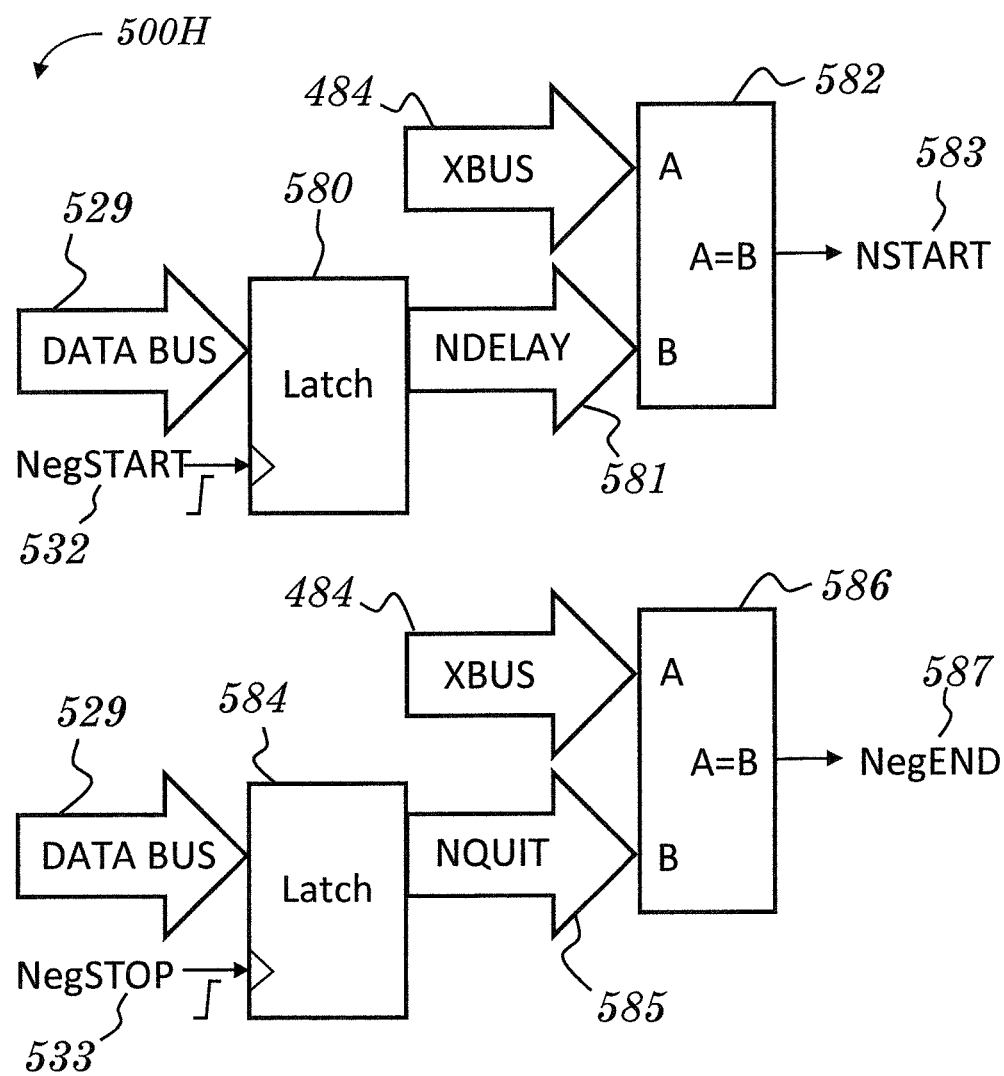
FIG. 5H shows exemplary data bus feeds to latches of the resonant core power supply of FIG. 1.

Refer to FIG. 5H. On the rising edge of the NegSTART strobe 532 from microprocessor 528, latch 580 loads the binary phase value presented on the DATA BUS 529 by the microprocessor 528 representing the amount of phase delay before the negative peak of the excitation waveform begins, dND 514 (FIG. 5C). The binary value dND 514 is saved by latch 580 becoming NDELAY 581. Saved NDELAY 581 value is presented to digital comparator 582 as word "B" while the XBUS 484 representing the current phase angle of the Excitation waveform is fed into 582 as word "A". Since the XBUS 484 continuously increments as time goes by, at some point word "A" will equal word "B" causing the A=B output, NSTART 583 of digital comparator 582 to briefly go high, for the duration of one PCLK 476 pulse period (FIG. 4B).

On the rising edge of the NegSTOP strobe 533 from microprocessor 528, latch 584 loads the binary phase value presented on the DATA BUS 529 by the microprocessor 528 representing the phase of the XBUS 484 when the negative peak of the excitation waveform ends, NegQUIT 517, FIG. 5C. The binary value NegQUIT 517 is saved by latch 584 and is presented as NQUIT 585. Saved NQUIT 585 value is presented to digital comparator 586 as word "B" while the XBUS 484 representing the current phase angle of the Excitation waveform is fed into 586 as word "A". Since the XBUS 484 continuously increments as time goes by, at some point word "A" will equal word "B" causing the A=B output, NegEND 587 of digital comparator 586 to briefly go high, for the duration of one PCLK 476 pulse period (FIG. 4B).

Figure 5J:
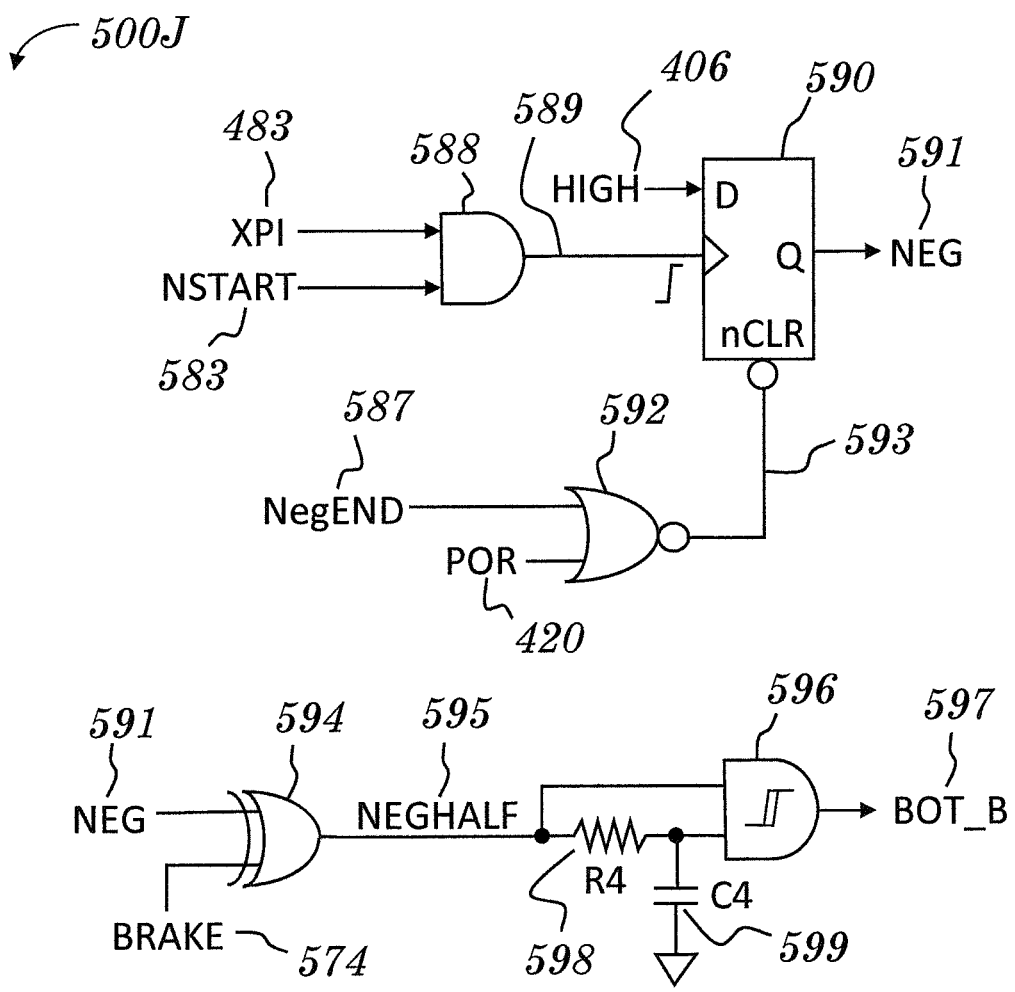
FIG. 5J shows controlling the bottom MOSFET on leg B of the resonant core power supply of FIG. 1.

Referring to FIG. 5J, NSTART 583 is fed into "AND" gate 588 along with the XPI bit 483. The XPI bit 483 represents the π radians phase bit which is HIGH only when the excitation waveform phase angle is at least 180 degrees and less than 360 degrees. This occurs during the "Negative" portion of the excitation signal waveform. When NSTART 583 and XPI 483 are both HIGH, the output 589 of the "AND" gate 588 causes the Q output NEG 591 of flip-flop 590 to set, which begins the Negative peak of the Excitation waveform.

The NegEND 587 signal is fed to "NOR" gate 592 which causes the output 593 of 592 to go LOW when NegEND 587 goes HIGH. The LOW output 593 from "NOR" gate 592 causes flip-flop 590 to "RESET" whenever either the NegEND 587 signal or the Power-On Reset (POR) signal 420 goes HIGH. This causes NEG 591 to go LOW, which ends the Negative peak of the Excitation waveform.

If the FFC 114 determines that the resonant voltage $V_{RES}$ 170 across the LC tank 104, 106, 108 and 110 has exceeded the intended nominal operating voltage level, then the FFC 114 pulls the BRAKE 574 signal HIGH. The BRAKE signal 574 is provided to reduce the $V_{RES}$ 170 voltage level whenever the resonant voltage $V_{RES}$ 170 across the LC tank 104, 106, 108 and 110 has exceeded a safe amplitude. During normal operation, the BRAKE signal 574 is LOW. When the BRAKE signal 574 is HIGH, the polarity of the two signals POSHALF 571 and NEGHALF 595 become inverted by "XOR" gates (570, FIG. 5F) and (594, FIG. 5J) causing associated bottom MOSFETs on each leg controlled by BOT_A 573 (FIG. 5F) and BOT_B 597 (FIG. 5J) signals to toggle (invert). This is part of the process that is used to shift the excitation signal by 180 degrees as shown in FIG. 2D.

Each excitation $W_{EXC}$ winding 130, 132 and 134 is connected differentially across the "H" bridge outputs ("LEG_A" and "LEG_B") of an EDC unit 120, 122 or 124 through an EMI filter to reduce high frequency switching transients from being broadcast from the RCPS unit. Each $W_{EXC}$ winding 130, 132 and 134 is driven differentially by an EDC unit 120, 122 and 124. Any group delay caused by the EMI filter will be absorbed into the hysteresis delay measurement ($D_{HYST}$ 226) shown in FIGS. 2B, 2C and 2D which is determined by circuit shown in FIG. 4E.

6. Excitation Drive Circuit (EDC) 120, 122 and 124

Inside the EDC units 120, 122 and 124 one or more "H" bridge circuits are used to drive the excitation signal across each $W_{EXC}$ winding 130, 132 or 134 connected differentially across the "H" bridge output terminals. Control signals created within the FFC 114 are simultaneously fed to all EDC units 120, 122 and 124. All EDC units 120, 122 and 124 work in tandem to coerce flux to flow within the magnetic core 102 by driving identical excitation signals across each excitation winding 130, 132 and 134. The excitation windings 130, 132 and 134 are inter-leave wound such that each turn of each winding is adjacent to the same turn of the other windings, similar to tri-filar winding. This negates phase mis-match between the excitation windings due to differing mechanical orientations with respect to the magnetic path.

The internal H Bridge circuits of the EDC units 120, 122 and 124 will always have one upper MOSFET on, either the "LEG_A" or "LEG_B" upper MOSFET according to the most significant bit (MSB), XPI 483 of the XBUS 484. Both upper MOSFETs (LEG_A and LEG_B) are never on at the same time. The lower MOSFETS are controlled by the duty cycle modification circuits described in section 5. In any case, the upper and lower MOSFETs on the same leg are never allowed to be on simultaneously. Only one lower MOSFET (LEG_A versus LEG_B) will be on at any point in time, however due to duty cycle modulation, one or both lower MOSFETs may simultaneously be shut-off.

Selecting which top MOSFET (LEG_A versus LEG_B) is "ON" occurs every r radians of the XBUS 484 and remains "ON" until the XBUS 484 reaches the next H radian increment. This results in the duty cycle of each top MOSFET having a duty of 50%. The lower MOSETS might have a 50% duty cycle, however the duty cycle of the bottom MOSFETS might be less than 50% due to the duty cycle modulation used for remnant flux compensation.

Upon a BRAKE cycle, the logic state of ALL four MOSFETS invert which effectively shifts the phase of the excitation signal by 180 degrees. The state of all four MOSFETs remain inverted until the BRAKE operation clears, BRAKE 574 goes LOW.

The "H" bridges in the EDC units 120, 122 and 124 have been arbitrarily defined as having the bottom LEG_A MOSFET being "ON" along with the upper LEG_B MOSFET being "ON" during "POSITVE" excitation current flow, shaded areas 505 or 509 (FIGS. 5A, 5B and 5C). When bottom LEG_B MOSFET is "ON" and upper LEG_A MOSFET is "ON", then the current flowing through the excitation windings 130, 132 and 134 is designated as producing NEGATIVE current flow, shaded areas 506 or 515 (FIGS. 5A, 5B and 5C).

To generate and maintain a resonant flux within the magnetic core 102 the RCPS must have at least one EDC unit 120, 122 or 124 to drive at least one excitation winding 130, 132 or 134. The EDC units 120, 122 and 124 are fed four signals from the FFC 114 used to control the MOSFETs of the internal "H" bridge(s). Two of these signals created by FIG. 5F and FIG. 5J are below.

Bot_A 573 which controls the bottom MOSFET on "H" bridge output LEG_A.

Bot_B 597 which controls the bottom MOSFET on "H" bridge output LEG_B.

Figure 6A:
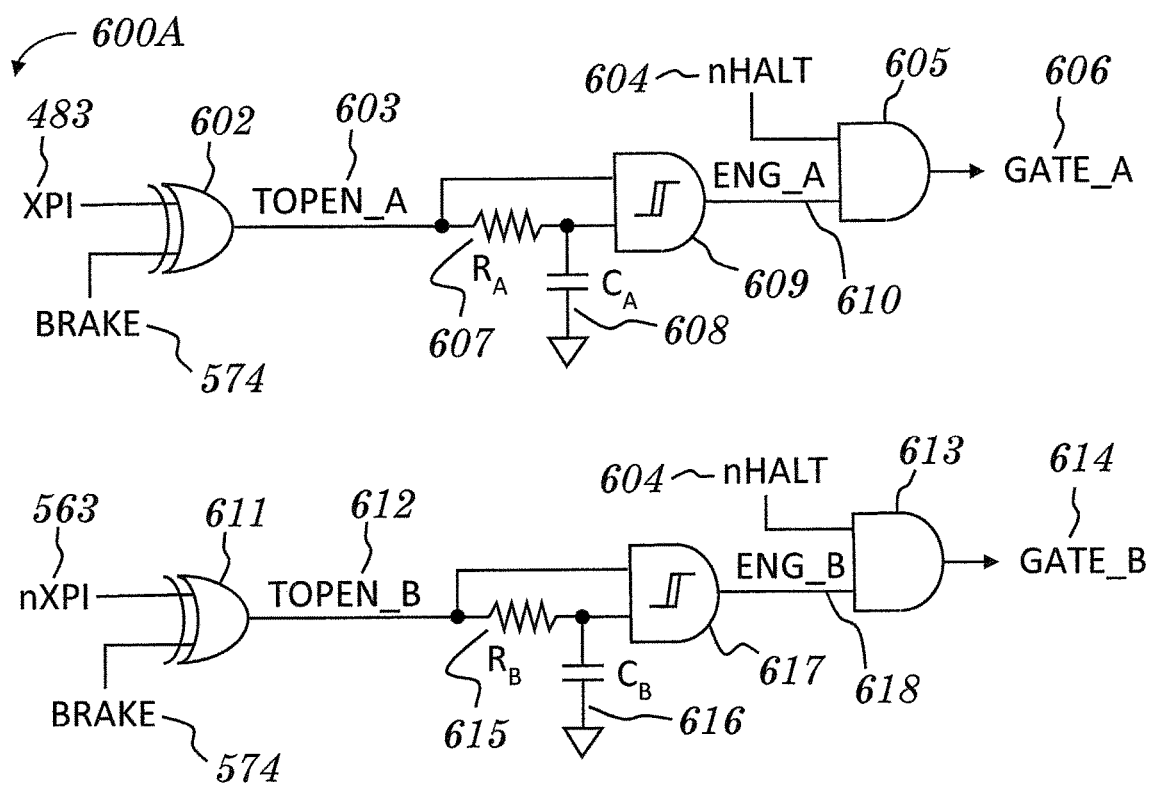
FIG. 6A shows controlling the top MOSFETs of the resonant core power supply of FIG. 1.

The remaining two signals fed to the EDC units 120, 122 and 124 from the FFC 114 are created by the circuit shown in FIG. 6A.

GATE_A 606 which controls the top MOSFET on "H" bridge output LEG_A.

GATE_B 614 which controls the top MOSFET on "H" bridge output LEG_B.

Which (LEG_A or LEG_B) upper MOSFET is turned fully ON while the other upper MOSFET is shut completely OFF depends upon the XPI 483 bit of the XBUS 484, which determines whether the positive peak or negative peak of the excitation waveform is being driven. During the positive peak of the excitation waveform where the phase value presented on the XBUS 484 is greater than 0 radians but less than π radians, the top MOSFET on the "LEG_B" leg is ON, otherwise the top MOSFET on "LEG_A" is ON. In any case, only one of the two (LEG_A or LEG_B) upper MOSFETs are ON at any point in time. This is independent from the duty cycle modulation being applied to the lower MOSFETs controlled by BOT_A 573 and BOT_B 597 signals.

Refer to FIG. 6A. Inside the FFC 114, exclusive "OR" (XOR) gate 602 is fed by both the "BRAKE" signal 574 and the XPI 483 signal. Assuming that the "BRAKE" signal 574 is not active (LOW), the "top enable for LEG_A" output TOPEN_A 603 from XOR gate 602 follows the XPI 483 signal. The TOPEN_A 603 signal is the enable signal for turning on the upper MOSFET on "LEG_A". The RC delay circuit formed by RA 607 and CA 608 provides "DEAD TIME" when turning on the upper MOSFET on LEG_A, yet shuts-off the upper MOSFET on LEG_A immediately when XPI 483 goes LOW. This is similar to the RC delay circuit described in FIG. 5F involving Schmidt trigger "AND" gate 572 which creates the BOT_A signal 573. The "top gate enable signal for LEG_A" signal, ENG_A 610 output of Schmidt trigger "AND" gate 609 is presented to "AND" gate 605 along with nHALT 604.

The nHALT 604 signal is an active LOW signal which gets pulled down by the emergency stop (ESTOP) Keyline. The ESTOP Keyline signal is normally pulled HIGH through a pull-up resistor and is pulled LOW by any emergency stop button which is connected to the ESTOP Keyline in a "Wired-OR" configuration or by the FFC 114. For safety, any ESTOP button connected to the ESTOP Keyline can pull the Keyline LOW in case a human operator needs to shut-off the RCPS unit during an emergency. The FFC 114 can also pull the ESTOP Keyline LOW if it decides that an unsafe condition occurs. Each EDC unit 120, 122 and 124 has its own nHALT 604 signal connection independent of other EDC units. This allows the FFC 114 to monitor the status of all EDC units 120, 122 and 124 and determine if just one EDC unit is faulty and shut it off independently, or if an ESTOP emergency has occurred where all of the EDC units need to be shut down simultaneously. By pulling nHALT 604 signal LOW disables the "AND" gate 605, thus shutting-off GATE_A 606. When nHALT 604 is not active (HIGH) then the enable signal, ENG_A 610 for Leg A controls the GATE_A 606 signal through "AND" gate 605, which then controls the upper MOSFET on LEG_A.

The circuitry involving "XOR" gate 611 resistor RB 615, capacitor CB 616, Schmidt trigger "AND" gate 617 and "AND" gate 613 operates identically to the circuit just described that creates the GATE_A 606 signal, except that the nXPI signal 563 replaces the XPI 483 signal. When nHALT 604 is not active (HIGH) then the enable signal, ENG_B 618 for Leg_B controls the GATE_B 614 signal through "AND" gate 613, which then controls the upper MOSFET on LEG_B.

Since the nXPI 563 signal is created by inverting XPI 483 by inverter 562, GATE_A 606 and GATE_B 614 will always have opposite polarities.

Figure 6B:
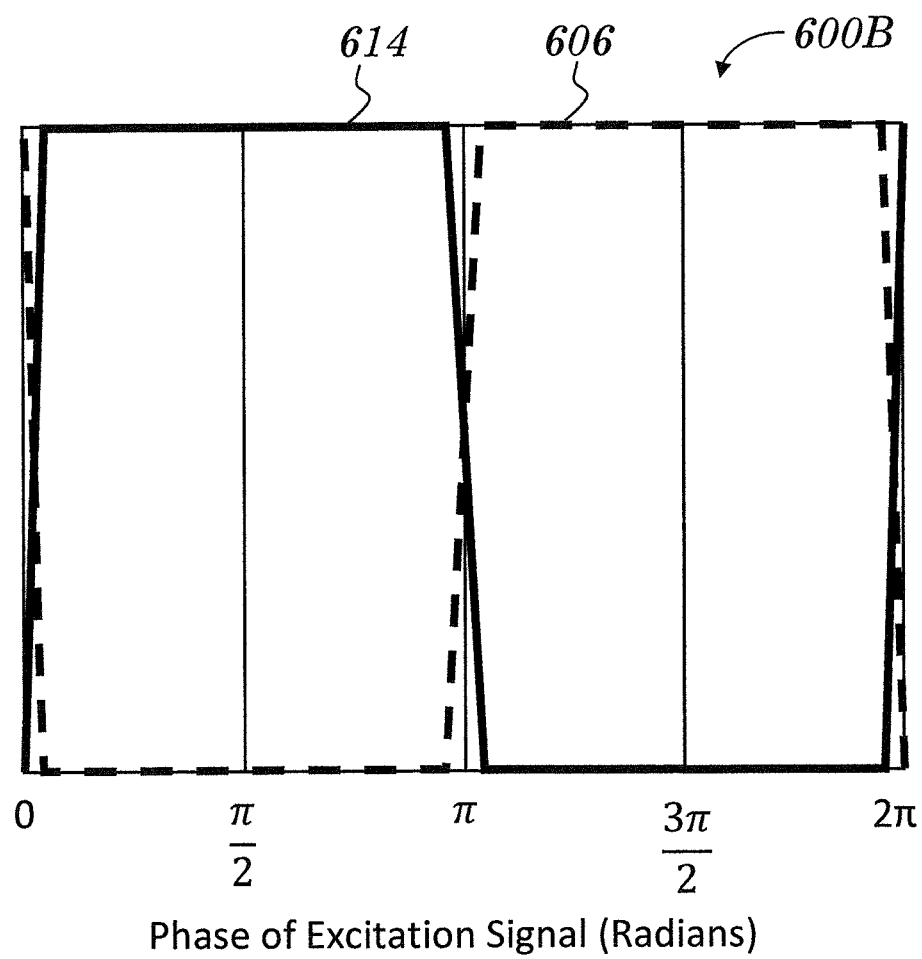
FIG. 6B shows the waveform of the top MOSFET gate signals of the resonant core power supply of FIG. 1.

FIG. 6B shows the waveform of the upper MOSFET gate signals. Upper MOSFET on LEG_B is controlled by GATE_B 614, shown as a solid trace. The dashed trace in FIG. 6B represents GATE_A 606, which controls the upper MOSFET on LEG_A. This demonstrates that both upper MOSFETs have a 50% duty cycle while both are on alternately.

The BRAKE 574 signal when HIGH causes "XOR" gates 570, 594, 602 and 611 to act as an inverter by inverting the signal applied to the remaining input. Since this causes POSHALF 571, NEGHALF 595, TOPEN_A 603 and TOPEN_B 612 to invert, all four MOSFETs invert states simultaneously. This causes the differential excitation signal across the output terminals to flip polarity, essentially shifting the phase of the differential output across the LEG_A and LEG_B output terminals of each "H" bridge by 180 degrees. Because the MOSFETS are actually controlled by signals (BOT_A 573, BOT_B 597, GATE_A 606 and GATE_B 614) which each having a "DEAD Time" RC delay circuit, activating the BRAKE 574 signal still provides "DEAD Time" protection from latch-up.

These control signals fed from the FFC 114 are simultaneously fed to all of the EDC units 120, 122 and 124 with the intent to have the excitation output of each EDC unit match the phase, amplitude and waveform of all of the other EDC units. Each EDC unit 120, 122 or 124 feeds an associated excitation winding $W_{EXC}$ 130, 132 or 134.

Figure 6C:
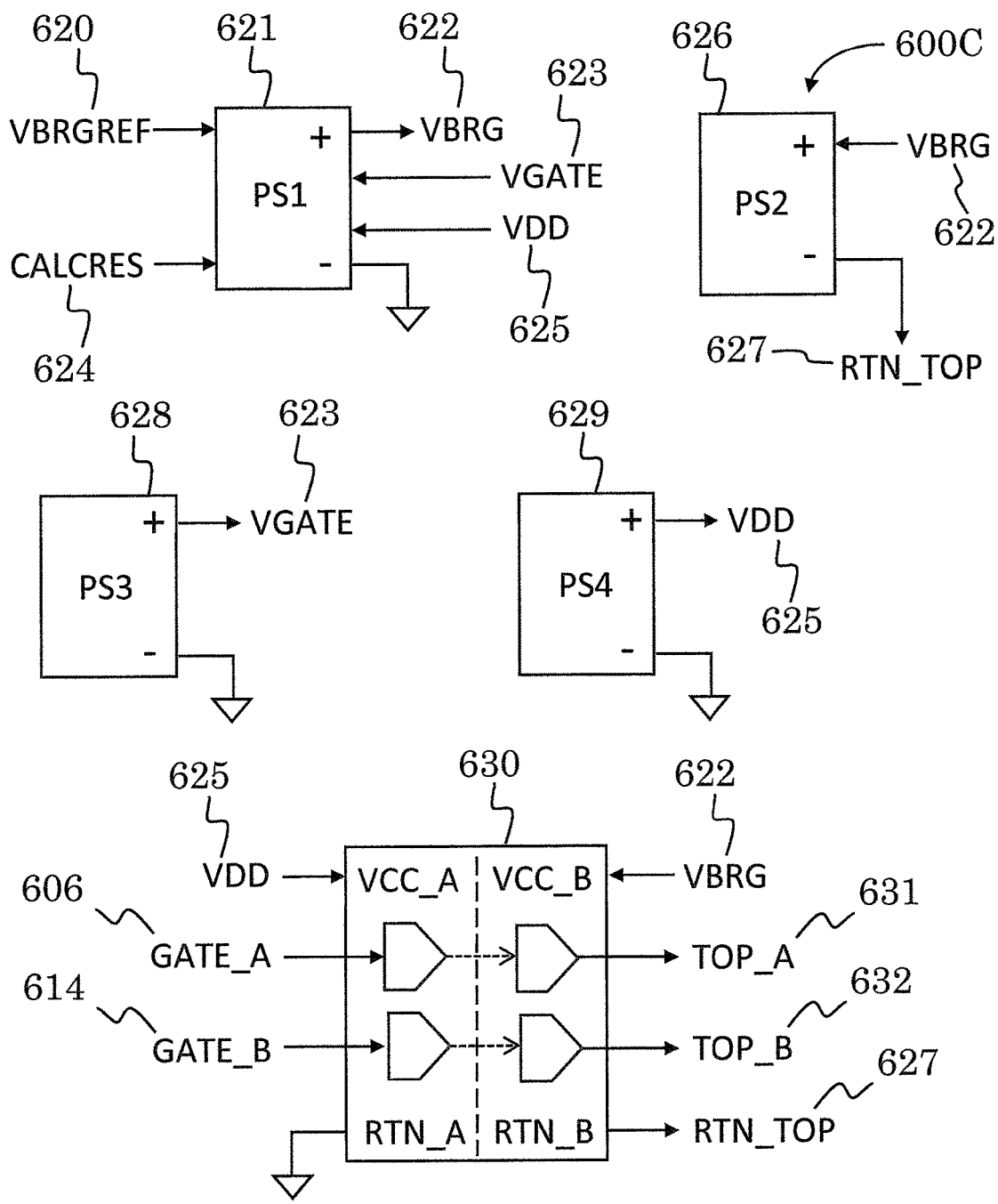
FIG. 6C shows power supplies and signal isolation inside EDC units of the resonant core power supply of FIG. 1.

Refer to FIG. 6C. Inside each EDC unit 120, 122 and 124 is a power supply, PS1 621 to feed power to each "H" bridge. The voltage level of the DC power supply VBRG 622 output from PS1 621 for feeding the "H" bridge circuits establishes the peak voltage amplitude of the excitation signal fed across each excitation winding $W_{EXC}$ 130, 132 and 134. The voltage level of VBRG 622 relates to the $+V_{EXCPK}$ 502 and $-V_{EXCPK}$ 503 peak excitation voltages shown in FIGS. 5A, 5B and 5C. The resonant voltage $V_{RES}$ 170 accumulated across the LC tank circuit 104, 106, 108 and 110 is determined by the peak voltage of the excitation signals applied across each excitation winding $W_{EXC}$ 130, 132 and 134 multiplied by the turns ratio between the number of turns ($N_{RES}$) of the resonant winding $W_{RES}$ 104 divided by the number of turns ($N_{EXC}$) in each excitation winding $W_{EXC}$ 130, 132 and 134. The FFC 114 evaluates the amplitude of the resonant current feedback IFBK 320 signal provided by sensor 112 amplified by 306 to determine what the level of the resonant current $I_{RES}$ 160 is passing through the resonant winding $W_{RES}$ 104. The FFC 114 calculates the required $V_{RES}$ 170 level across the LC tank circuit 104, 106, 108 and 110 required to achieve the desired resonant VA power level ($P_{RES}$). This voltage level becomes the nominal operating level for $V_{RES}$ 170 that the FFC 114 will maintain during normal operation.

The "H" bridge circuits in each EDC unit 120, 122 and 124 are powered by VBRG 622. The voltage level of VBRG 622 is adjusted by the FFC 114 in order to control the peak excitation voltage level, $+V_{EXCPK}$ 502 and $-V_{EXCPK}$ 503, which in turn controls the resonant voltage $V_{RES}$ 170 across the LC tank circuit 104, 106, 108 and 110. The output voltage VBRG 622 from PS1 621 of each "H" bridge power supply is controlled by VBRGREF 620, a DC reference voltage signal generated by a Digital to Analog Converter (DAC) controlled by a microprocessor inside the FFC 114. The voltage level setting of VBRGREF 620 is determined by the FFC 114 based upon the desired $V_{RES}$ 170 level divided by a constant ($K_{VBRG}$).

The VBRGREF 620 signal from the FFC 114 is simultaneously monitored by all of the EDC units 120, 122 and 124 which then adjust the VBRG 622 output voltage of their individual internal "H" bridge power supplies, PS1 621 such that each VBRG 622 output voltage level equals VBRGREF 620 times the constant value of $K_{VBRG}$.

By using a common reference for all EDC units 120, 122 and 124 helps maintain a more uniform EXCITATION signal amplitude among all of the EDC units.

The VBRGREF 620 signal is buffered well enough for distribution throughout the RCPS to feed all of the EDC units 120, 122 and 124. If a single DAC output is used universally for all of the VBRGREF 620 reference, then changing the DAC voltage level simultaneously changes the VBRG 622 voltage level of all of the EDC units 120, 122 and 124. This allows the FFC 114 to control the voltage level of $V_{RES}$ 170.

Depending upon the desired resonant power level ($P_{RES}$) of the RCPS unit, handling the voltage and current levels required of the "H" bridge circuit may be difficult for just one "H" bridge and one EDC unit 120, 122 and 124 by itself, and therefore there may be merit in using multiple EDC units 120, 122 and 124 in tandem, each driving individual excitation windings $W_{EXC}$ 130, 132 or 134. Multiple "H" bridge circuits within each EDC unit 120, 122 or 124 may need to be paralleled to drive each excitation winding $W_{EXC}$ 130, 132 or 134 as well.

At the top of FIG. 6C are power supplies labeled as; PS1 621, PS2 626, PS3 628 and PS4 629. These power supplies are for the following.

PS1 621 is the bridge power supply which feeds the "H" bridge power supply voltage VBRG 622 to all of the "H" bridge circuits. Reference voltage, VBRGREF 620 from FFC 114 controls the output voltage level of VBRG 622. VGATE is provided by PS3 628 which PS1 621 uses for various internal circuits. The CALCRES signal 624 is also provided by the FFC 114 to reduce the VBRG 622 output voltage level to yield a low voltage excitation test signal for calibrating the $C_{RES}$ capacitor 106. VDD 625 is provided from PS4 629 to power various digital logic circuits inside PS1621.

PS2 626 power supply provides power to the high side MOSFET gate driver circuits. The positive output lead of this power supply is connected to the VBRG 622 output of PS1 621 while the negative RTN_TOP 627 lead maintains a constant negative DC voltage with respect to VBRG 622. Power supply PS2 626 floats with the VBRG 622 output voltage while providing a constant DC voltage solely for the upper MOSFET gate drive circuits. As the VBRG 622 voltage level is changed in response to a change in VBRGREF 620 controlled by the FFC 114, PS2 626 floats along with the new VBRG 622 output level. While CALCRES signal is active, the VBRG 622 voltage level may drop so low as to cause the negative return lead, RTN_TOP 627 of PS2 626 to actually drop below ground (negative voltage with respect to ground). The output voltage across PS2 626 is designed to allow the upper MOSFET gate drive circuits to drive upper P-Channel MOSFETs into hard saturation, thus reducing their VDS saturation voltage and thus reducing power dissipation. Digital isolation circuit 630 provides high voltage isolation between low voltage logic signals GATE_A 606 and GATE_B 614 on the left side of 630. Low voltage logic signals GATE_A 606 and GATE_B 614 can't directly drive the upper MOSFET gates due to the upper MOSFETs being powered from a high voltage power source, VBRG 622. The digital isolator circuit 630 detects the digital logic levels of GATE_A 606 and GATE_B 614 presented to the inputs on its left-hand side, and then repeats these logic levels of the output signals on the right-hand side TOP_A 631 and TOP_B 632. The left-hand side of 630 is powered by the digital logic power supply VDD 625 output of PS4 629 which is referenced to system ground. The right-hand side of 630 is powered by the "H" bridge power supply VBRG 622 output of PS1 621 which is referenced to system ground. The signal return for the logic level output signals TOP_A 631 and TOP_B 632 is provided by the power return RTN_TOP 627 of floating power supply PS2 626.

PS3 628 is the gate driver power supply VGATE 623 to feed the gate drive circuits which control the lower MOSFETs of the "H" bridges. DC power output VGATE 623 from PS3 628 provides power used in various locations in the EDC 120, 122 and 124. Additionally, the VGATE 623 voltage is used as a GATE voltage reference for the common gate (cascode) configured MOSFETS. VGATE is also in the EXCITATION CURRENT SINK circuit (FIG. 6E) where it is used as an in-rush current limiter circuit.

PS4 629 provides power for various digital logic circuits labeled as VDD 625.

Digital logic signals GATE_A 606 and GATE_B 614 entering FIG. 6C at the lower left side come from the FFC 114. These signals are generated by the circuits shown in FIG. 6A.

Upper MOSFET control signals GATE_A 606 and GATE_B 614 from "AND" gates 605 and 613 shown in FIG. 6A, are fed to digital isolator 630 where they are level shifted and presented as TOP_A 631 and TOP_B 632.

Figure 6D:
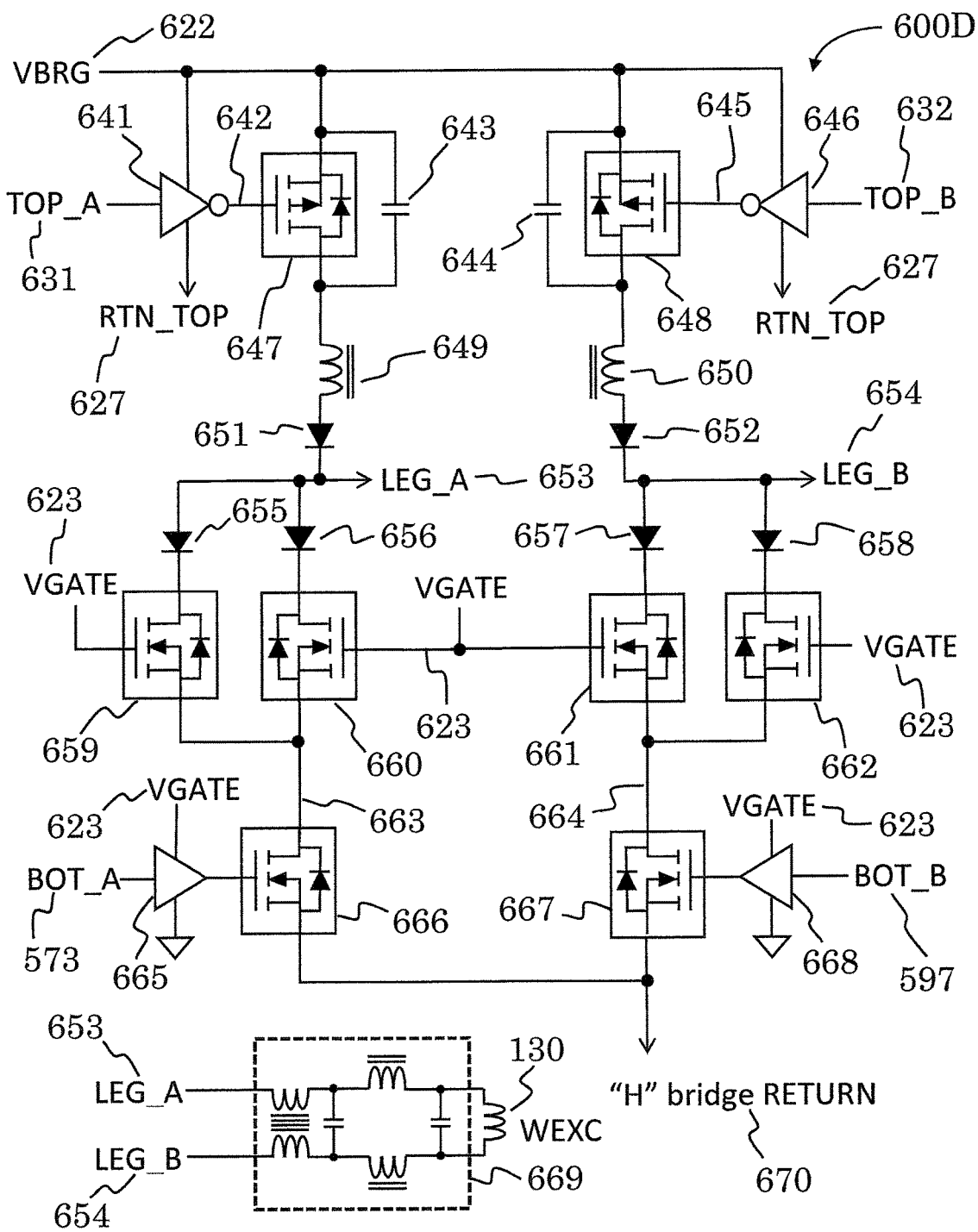
FIG. 6D shows "H" bridge circuits used inside EDC units of the resonant core power supply of FIG. 1.

FIG. 6D shows a single "H" bridge circuit. The top of the H bridge circuit is fed by the VBRG 622 power source from PS1 621. On the left-hand side of FIG. 6D is the "LEG_A" portion while on the right-hand side is the "LEG_B" portion of the "H" bridge.

The TOP_A signal 631 from digital isolator 630 feeds inverting gate drive circuit 641 which is powered between VBRG 622 and the power return lead of floating power supply PS2 626, RTN_TOP 627. When TOP_A 631 is HIGH, the output of inverting gate driver circuit 641 goes LOW, which then pulls the gate 642 of P-channel MOSFET 647 on "LEG_A" towards RTN_TOP 627. This turns the upper MOSFET 647 of LEG_A" on hard. When TOP_A 631 goes LOW, inverting gate drive circuit 641 pulls the gate 642 of MOSFET 647 towards VBRG 622. This turns off MOSFET 647. Likewise, upper P-channel MOSFET 648 on "LEG_B" is turned on by the output 645 of inverting gate drive circuit 646 pulling the gate of MOSFET 648 down towards RTN_TOP 627 when TOP_B 632 goes HIGH. When TOP_B 632 goes LOW, the output 645 of inverting gate drive circuit 646 pulls the gate of MOSFET 648 towards VBRG 622, turning MOSFET 648 off.

Inductors 649 and 650 along with capacitors 643 and 644 help shut off the upper MOSFETs 647 and 648 in a quasi-resonant manner. As each upper MOSFET 647 or 648 is shut off, current stored in the associated inductor 649 or 650 connected to the drain of MOSFET 647 or 648, attempts to maintain current flow. A back-emf discharge voltage from the inductor backflows upward towards VBRG 622 while being collected by the associated capacitor 643 or 644. As capacitor 643 or 644 charges, shunts the output capacitance (Coss) of the associated upper MOSFET 647 or 648 discharging the stored charge in Coss of the MOSFET. The back EMF from the inductor 649 or 650 further discharges the Coss capacitance of upper MOSFET 647 or 648. The component values of the capacitors 643 and 644 and the values of inductors 649 and 650 are selected by calculating the resonant frequency having a time period (1/f) seconds just long enough to shut off the MOSFET. This is calculated by $$T_{shutOFF} = 2\pi\sqrt{L \times C} \text{ seconds} \qquad \text{eq.6.1}$$

Where $T_{shutOFF}$=time provided to shut off the MOSFET, seconds
L=the inductor value [649] or [650], henrys
C=the capacitor value [643] or [644], farads The circuit shown in FIG. 6D differs from the simple example of an "H" bridge circuit shown in FIG. 5G in that there are four MOSFETs versus two MOSFETs per leg. Because the VBRG 622 power supply is likely to be fairly large, the drain to gate voltage swing of both the upper and lower MOSFETs becomes fairly large. Miller effect causes the switching speed of the switch devices to become slow. By using a cascode configuration, the Miller effect is drastically reduced, therefore allowing faster rise and fall times.

The cascode configuration adds a third (middle) common gate biased MOSFET to the circuit on each leg. This middle MOSFET will be required to dissipate a substantial amount of power, approaching VBRG 622 times the excitation current ($I_{EXC}$). By paralleling two or more identical MOSFETs, each MOSFET shares the power dissipation while the combined MOSFETs act as a single large MOSFET. FIG. 6D shows two MOSFETs in parallel comprising each middle MOSFET. The middle MOSFETs shown in FIG. 6D are comprised of 659 and 660 for the LEG_A middle MOSFET, while 661 and 662 comprise the middle MOSFET on LEG_B.

When BOT_A 573 signal is HIGH, the output of non-inverting gate driver circuit 665 pulls the gate of lower MOSFET 666 upwards towards VGATE 623. The voltage level of VGATE 623 is sufficient to provide enough gate to source voltage (VGS) to turn MOSFET 666 on hard enough so that the saturation voltage (VdsSat) and on resistance (RdsON) of MOSFET 666 are both minimized. This keeps the power dissipation of MOSFET 666 low enough to allow using a smaller device with lower input capacitance (Ciss) to be used. A MOSFET with a low Ciss value tends to switch faster than one with more input gate capacitance (Ciss). Likewise, gate driver 668 turns lower MOSFET 667 on hard when BOT_B 597 is HIGH.

As lower MOSFET 666 turns on, it pulls the source leads of 659 and 660 acting as a single MOSFET, towards the "H" bridge RETURN 670. By pulling the source lead of the middle MOSFET 659 and 660 down with the gate leads of the middle MOSFET being tied to the VGATE 623 power supply, the middle MOSFET 659 and 660 turns on. Likewise, the middle MOSFET 661 and 662 on LEG_B is turned on when lower MOSFET 667 is turned on by non-inverting gate driver 668 when BOT_B 597 goes HIGH.

As the source leads of middle MOSFET 659 and 660 are pulled down by lower MOSFET 666, middle MOSFET 659 and 660 pull the LEG_A terminal 653 down through steering diodes 655 and 656.

An excitation winding 130, 132 or 134 is connected differentially across the "H" bridge output terminals 653 and 654. FIG. 6D shows an Electro Magnetic Interference (EMI) filter 669 (lower left-hand corner) connected across the "H" bridge terminals LEG_A 653 and LEG_B 654 before presenting the EXCITATION signal to the associated $W_{EXC}$ winding 130, 132 or 134, $W_{EXC}$ winding 130 is shown connected in this case. The EMI filter 669 absorbs switching transients which could cause radio interference.

Assuming that upper MOSFET 648 is on, current is then pulled through the LEG_A side of EMI filter 669, through the attached $W_{EXC}$ winding 130, 132 or 134, through diode 652, through inductor 650 and through upper MOSFET 648. This current is limited by either the input impedance of the attached $W_{EXC}$ winding 130, 132 or 134 affected by the resonant impedance ($Z_{RES}$) of the LC tank circuit 104, 106, 108 and 110, or by the in-rush current limit imposed by the EXCITATION CURRENT SINK circuit to be discussed later, shown in FIG. 6E.

If the EDC unit 120, 122 or 124 fails to operate or has been instructed to shut down (due to the nHALT signal 604 FIG. 6A, being pulled LOW), flux flowing through the core 102 will attempt to induce a voltage across the attached $W_{EXC}$ winding 130, 132 or 134. Steering diodes 651, 652, 655, 656, 657 and 658 prevent current from the induced voltage by flux continuing to flow within the core 102 from backwashing through the "H" bridge. Without the steering diodes, a shut-down EDC unit 130, 132 and 134 would load down the magnetic flux within the core 102 as backwash current flows through the body diodes of all of the "H" bridge MOSFETs, causing the attached $W_{EXC}$ winding 130, 132 or 134 to appear as a shorted winding.

Figure 6E:
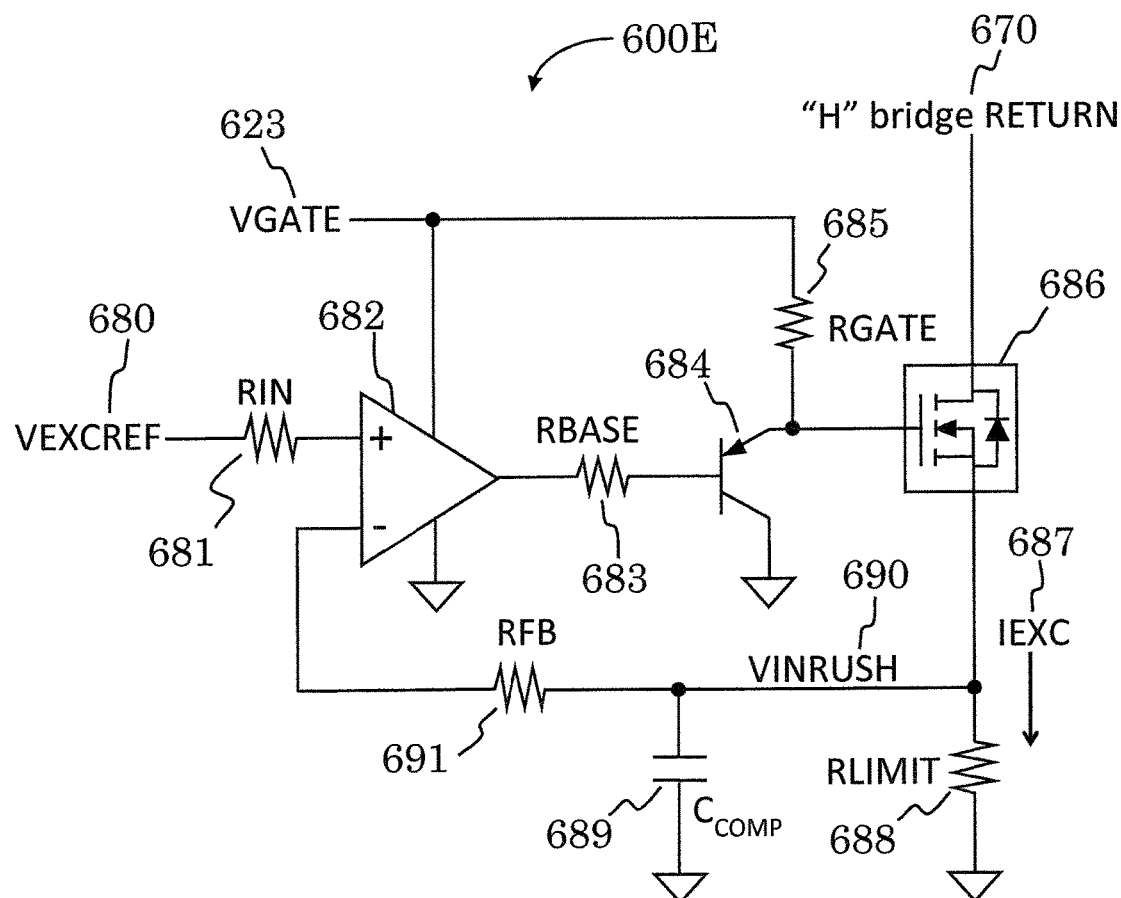
FIG. 6E shows excitation current sink used inside EDC units of the resonant core power supply of FIG. 1.

Refer to FIG. 6E. The "H" bridges used inside the EDC units 120, 122 and 124 have an EXCITATION CURRENT SINK circuit at the "bottom" return node, "H" bridge RETURN 670. The EXCITATION CURRENT SINK establishes the maximum in-rush current limit for the EXCITATION Current, $I_{EXC}$ 687.

A reference voltage VEXCREF 680 from the FFC 114 is created by a Digital to Analog Converter (DAC). All of the EDC units 120, 122 and 124 monitor the VEXCREF signal 680 which universally sets the in-rush current limit for all of the EDC units 120, 122 and 124.

Op amp 682 controls the gate voltage presented to MOSFET 686 through emitter follower circuit of transistor 684 in order to cause enough current to flow through RGATE 685 such that the VINRUSH 690 voltage across current sense resistor RLIMIT 688 matches (servos around) VEXCREF 680. This allows the FFC 114 to control the excitation current limit of all EDC units 120, 122 and 124 to be set to the same level.

A small value resistor, RBASE 683 of around 50 ohms isolates the base input capacitance of transistor 684 and gate input capacitance of MOSFET 686 from the output of op amp 682 to improve circuit stability. Current through RGATE 685 pulls the gate of MOSFET 686 up enough until there is sufficient gate to source voltage (VGS) to keep MOSFET 686 on. The value of RGATE is low enough to turn MOSFET on against the input capacitance of 686 quickly, while large enough to not exceed the power dissipation limit of transistor 684. Just a few microamps are adequate to keep 686 on while transistor 684 sinks surplus current through RGATE 685 to ground. The resistance of RGATE 685 is selected to allow sufficient current to quickly charge the input capacitance (Ciss) of the gate of MOSFET 686. The resistance of RGATE 685 needs to be large enough to limit the current so as not to stress transistor 684 when shunting excess current through RGATE 685 not needed whenever the gate voltage applied to the gate of MOSFET 686 is being held at a steady level.

The servo loop involving op amp 682, resistor RBASE 683, transistor 684, MOSFET 686 and current sense resistor RLIMIT 688 maintains VINRUSH 690 voltage to match VEXCREF 680. The excitation current IEXC 687 is limited by VINRUSH 690 voltage divided by RLIMIT 688.

The excitation current IEXC 687 is monitored by the voltage drop across RLIMIT 688 which creates VINRUSH voltage 690. Op amp 682 controls the gate to source (VGS) voltage applied to the gate of MOSET 686 to allow just enough current through MOSFET 686 to cause the voltage drop VINRUSH 690 across resistor RLIMIT 688 to match VEXCREF 680 voltage, thus limiting the amount of IEXC current 687 allowed to pass through RLIMIT 688.

Compensation capacitor CcoMp 689 helps circuit stability by reducing the circuit bandwidth to eliminate switching transients generated by the "H" bridge and also holds the VINRUSH 690 voltage stable during brief periods of no current flow when duty cycle modulation truncates the excitation waveform when compensating for remnant flux. Feedback resistor RFB 691 isolates the capacitance of the CCOMP 689 capacitor from the op amp input. To minimize DC input offset voltage error due to input bias current of op amp 682, the RFB 689 resistor matches the input resistance of RIN 681 in series with the source impedance of VEXCREF 680.

If the LC tank circuit 104, 106, 108 and 110 is not fully charged, the input impedance of the attached $W_{EXC}$ winding 130, 132 or 134 may be quite low. Without limiting the current, then either VBRG 622 power supply maybe overloaded, or the current drawn through the "H" bridge may cause component damage. During periods of heavy load when the LC tank circuit 104, 106, 108 and 110 is not charged, the amount of current limited by the active current sink circuit may not support much voltage potential across the attached $W_{EXC}$ winding 130, 132 or 134. As the LC tank circuit 104, 106, 108 and 110 charges, the input impedance of the $W_{EXC}$ winding 130, 132 or 134 increases, which allows more voltage across the attached $W_{EXC}$ winding 130, 132 or 134. Until the LC tank circuit 104, 106, 108 and 110 acquires sufficient charge, the differential voltage between LEG_A and LEG_B terminals is less than the intended peak to peak voltage of nearly 2×VBRG; $+V_{EXCPK}$ 502 and $-V_{EXCPK}$ 503.

During the positive portion of the excitation signal, upper MOSFET 648 on LEG_B is turned on. Current from VBRG 622 passes through the drain of MOSFET 648, through inductor 650, diode 652, and then through the LEG_B side of EMI filter 669. Current continues through the attached $W_{EXC}$ winding 130, 132 or 134, through the LEG_A side of EMI filter 669, through diodes 655 and 656, LEG_A middle MOSFET 659 and 660, lower MOSFET 666, current sink MOSFET 686 and sense resistor RLIMIT 688. If the $W_{EXC}$ winding 130, 132 or 134 impedance is low, LEG_B terminal 654 remains close to VBRG 622 while the LEG_A terminal 653 pulls down just a few volts below the LEG_B terminal 654 voltage. On the next half of the waveform, the LEG_A terminal 653 is pulled close to VBRG 622 while the LEG_B terminal 654 is just a few volts below the LEG_A terminal 653. As the LC tank circuit 104, 106, 108 and 110 charges, the differential voltage between LEG_A terminal 653 and LEG_B terminal 654 increases.

As the tank circuit 104, 106, 108 and 110 approaches full charge, the reflected impedance through the attached $W_{EXC}$ winding 130, 132 or 134 grows high enough for the current passing through $W_{EXC}$ winding 130, 132 or 134 to become less than the in-rush current limit. Once the excitation current has reduced below the in-rush current limit, then the LEG_A terminal 653 will eventually be pulled down approaching the VINRUSH 690 voltage across the sense resistor RLIMIT 688, plus the sum of the saturation voltages of the lower MOSFET 666, middle MOSFET 659 and 660, forward drop of diode 655 in parallel with diode 656. The resulting peak to peak excitation voltage applied across the attached $W_{EXC}$ winding 130, 132 or 134 can be calculated by $$V_{EXCpk} \cong (V_{BRG} - \Sigma Q_{sat} - V_{650} - V_{652} - V_{BlegFLT} - V_{AlegFLT} - V_{655} - V_{RLIMIT}) \qquad \text{eq. 6.2}$$

Where $V_{EXCpk}$=peak excitation voltage across attached W_EXC winding, Vpk
$V_{BRG}$=DC output voltage level of bridge power supply VBRG [622], VDC
$\Sigma Q_{sat}$=sum MOSFET saturation voltages of [648,659 & 660,666,686], volts
$V_{650}$=I*Rdc loss voltage across inductor [650], volts
$V_{652}$=forward voltage drop across Diode [652], volts
$V_{BlegFLT}$=I*Rdc loss voltage across LEG B side of filter [669], volts
$V_{AlegFLT}$=I*Rdc loss voltage across LEG A side of filter [669], volts
$V_{655}$=forward voltage drop across Diode [655]≈[656], volts
$V_{RLIMIT}$=VINRUSH [690] voltage across RLIMIT [688]≈VEXCREF[680], volts The amount of power each excitation cycle delivers to be accumulated as stored resonant energy within the resonant LC tank circuit 104, 106, 108 and 110 during each cycle can be estimated by $$P_{EXCrms} \cong \left( \frac{V_{EXCpk}}{\sqrt{2}} \times I_{EXC} \times N_{HBRG} \times N_{EDC} \right) \text{Watts} \qquad \text{eq. 6.3}$$

Where $P_{EXCrms}$=RMS power level delivered to LC tank per excitation cycle, Watts
$V_{EXCpk}$=peak voltage level of excitation voltage across W_EXC winding, Vpk
$I_{EXC}$=DC current limit level of current sink Amperes
$N_{EDC}$=number EDC's [120,122 and 124] and W_EXC [130,132 or 134] used in RCPS
$N_{HBRG}$=number of "H" bridges in parallel per each WEXC [130,132 or 134]

By estimating the amount of power delivered per excitation cycle, then an estimate of how many excitation cycles are needed to charge the LC tank circuit 104, 106, 108 and 110 from initial START-UP to fully charged.

$$N_{charge} \cong \frac{P_{RESVA}}{P_{EXCrms}} \text{excitation cycles,} \qquad \text{eq. 6.4}$$

Where $N_{charge}$=number of excitation cycles needed to fully charge LC tank, cycles
$P_{RESVA}$=desired nominal resonant operating power, VA
$P_{EXCrms}$=RMS power level delivered to LC tank per excitation cycle, Watts Determining the amount of time required to recharge the resonant power level in between peak power loads/transients is useful. In the case where the intended load to be driven by the RCPS is a sinusoidal AC power inverter, two repetitive peaks will be expected every cycle of a single-phase inverter, while a three-phase inverter causes six peaks per cycle of the inverter output. Depending upon the inverter output frequency and the number of phases of the inverter's output dictates the amount of time available in between load peaks caused by the inverter. Comparing the number of excitation cycles that can occur in between each inverter load peak versus the resonant frequency ($F_{RES}$) of the RCPS yields a figure of merit as to how much power can be drawn by the load before the RCPS fails to recharge in time for the next inverter load peak.

$$T_{load} = \frac{1}{2 \times F_{LOAD} \times N_\phi} \text{seconds} \qquad \text{eq. 6.5}$$

Where $T_{LOAD}$=time in between inverter load peaks, seconds
$F_{LOAD}$=output frequency of power inverter being fed, Hz
$N_\phi$=number of phases of the inverter output The time required for the RCPS to recharge a fully drained LC tank circuit suggests how much of the nominal resonant power ($P_{RES}$) stored within the LC tank circuit 104, 106, 108 and 110 is allowed to be drained in between inverter load peaks before the RCPS fails to fully recover before the next load peak, assuming one excitation cycle per $F_{RES}$ cycle.

$$T_{CHARGE} \cong N_{CHARGE} \times \left( \frac{1}{F_{RES}} \right) \text{seconds} \qquad \text{eq. 6.6}$$

Where $T_{CHARGE}$=time required to fully recharge LC tank [104, 106,108 and 110]
$N_{CHARGE}$=number of excitation cycles needed to charge LC tank, cycles
$F_{RES}$=resonant frequency of LC tank circuit [104,106,108 and 110], Hz If $T_{LOAD}$ is less than $T_{CHARGE}$, then the amount of power provided by each excitation cycle is not sufficient to maintain operation. To resolve this, various means listed below may be used.

Increase the in-rush current limit as long as the various electronic devices within each EDC can withstand the increased power dissipation, namely the middle MOSFETs (659//660 and 661//662) will be affected the most.

Increase the number of "H" bridges used in parallel inside each EDC unit 120, 122 and 124 to drive each EMI filter 669 and associated $W_{EXC}$ winding 130, 132 and 134.

Increase the number of EDC Units 120, 122 and 124 along with associated $W_{EXC}$ windings 130, 132 and 134.

The wire used in $W_{EXC}$ windings must be able to carry the increased current. The skin depth at the $F_{RES}$ frequency may dictate that increasing the wire size is not as effective as using multiple EDC's and $W_{EXC}$ windings.

To minimize the power consumed by the EDC units 120, 122 and 124 during START-UP, VEXCREF 680 can be set lower than the normal operating level, causing IEXC 687 to be lower than the nominal operating level. This will require more time to start the RCPS unit, however, the power drawn from the Start-up power source is less. Once the RCPS has fully charged the LC tank circuit 104, 106, 108 and 110 and verifies that all is well, the RCPS changes mode from "START-UP" to "RUN" mode. When the FFC 114 decides that the RCPS is ready to begin normal operation, the Run/nSTART signal 471 (FIG. 4B) goes HIGH, causing various circuits to begin normal operation. Upon entering "RUN" mode, the VEXCREF signal 680 is changed to the nominal operating level, thus increasing the in-rush current limit of IEXC 687 to the nominal operating level.

In case of an emergency ("E-STOP") button being pressed by an operator, the RCPS simultaneously through hardware circuitry shuts off all of the EDC units 120, 122 and 124 by pulling nHALT 604 signal LOW, thus immediately turning off all upper MOSFETs. Additionally, the FFC 114 through software sets VEXCREF 680 voltage to ground (zero volts). This causes all off the EDC units 120, 122 and 124 to reduce the current limit for $I_{EXC}$ 687 to zero amperes, which drains CCOMP 689 capacitor and VINRUSH 690 to zero volts through the RLIMIT 688 resistor. Therefore, if the RCPS is quickly restarted after clearing the ESTOP button, the excitation current $I_{EXC}$ 687 will be remain at zero amperes until the FFC 114 has determined that everything is ready to resume operation before resetting the excitation current.

7. Resonant Voltage Level Monitoring and $C_{RES}$ Calibration Circuits

The resonant voltage $V_{RES}$ 170 across the LC tank circuit 104, 106, 108 and 110 builds with each excitation cycle until it reaches a level determined by the turns' ratio between the number of turns ($N_{RES}$) in the resonant winding $W_{RES}$ winding 104 versus the number of turns ($N_{EXC}$) in the Excitation windings ($W_{EXC}$, 130, 132 and 134. The nominal resonant voltage level $V_{RES}$ 170 grows with each excitation cycle until the following equation 7.1 is met.

$$V_{RESpk} = \left(\frac{N_{RES}}{N_{EXC}}\right) \times V_{EXCpk} \text{ volts peak} \quad \text{eq. 7.1}$$

Where, $V_{RESpk}$=peak resonant voltage across LC tank circuit [104,106,108 and 110]

$N_{RES}$=the number of turns in the resonant winding, $W_{RES}$ [104]

$N_{EXC}$=number of turns in each excitation winding, $W_{EXC}$ [130,132 and 134]

$V_{EXCpk}$=peak excitation voltage, $+V_{EXCPK}$ [502] or $|-V_{EXCPK}$ [503]|; volts The nominal operating voltage level selected by design for the resonant voltage $V_{RES}$ 170 may be quite high, perhaps several thousand volts. The higher the operating voltage, the more stress is applied to the wire insulation used in the $W_{RES}$ winding 104 and the dielectric material used in the resonant capacitor $C_{RES}$ 106. Care must be given to avoid reaching the breakdown voltage rating for either the wire insulation or dielectric material of $C_{RES}$ 106 or that of $C_{SERIES}$ 108. A safety margin for any potential peak voltage surges also needs to be given consideration in order to prevent permanently damaging wire insulation of the resonant winding $W_{RES}$ 104 or the dielectric material used inside $C_{RES}$ 106 and $C_{SERIES}$ 108.

According to equation 7.1, $V_{RES}$ 170 will increase until reaching the desired operating voltage level. However, in the presence of load fluctuations, peak surges could cause $V_{RES}$ 170 to exceed the nominal operating level which had been determined by equation 7.1. In such cases, the FFC 114 compensates for load induced peak surges by issuing "BRAKE" cycles as mentioned for FIG. 2D. The BRAKE signal 574 causes the EXCITATION signal to become inverted, phase shifted by 180 degrees.

Each inverted EXCITATION cycle absorbs (dampens) some of the resonant flux accumulated within the core 102, which in turn reduces the voltage induced across $W_{RES}$ winding 104 and therefore reduces $V_{RES}$ 170. Once the FFC 114 has determined that $V_{RES}$ 170 has dropped to a safe level, the BRAKE signal 574 is cleared, allowing normal operation.

Figure 7A:
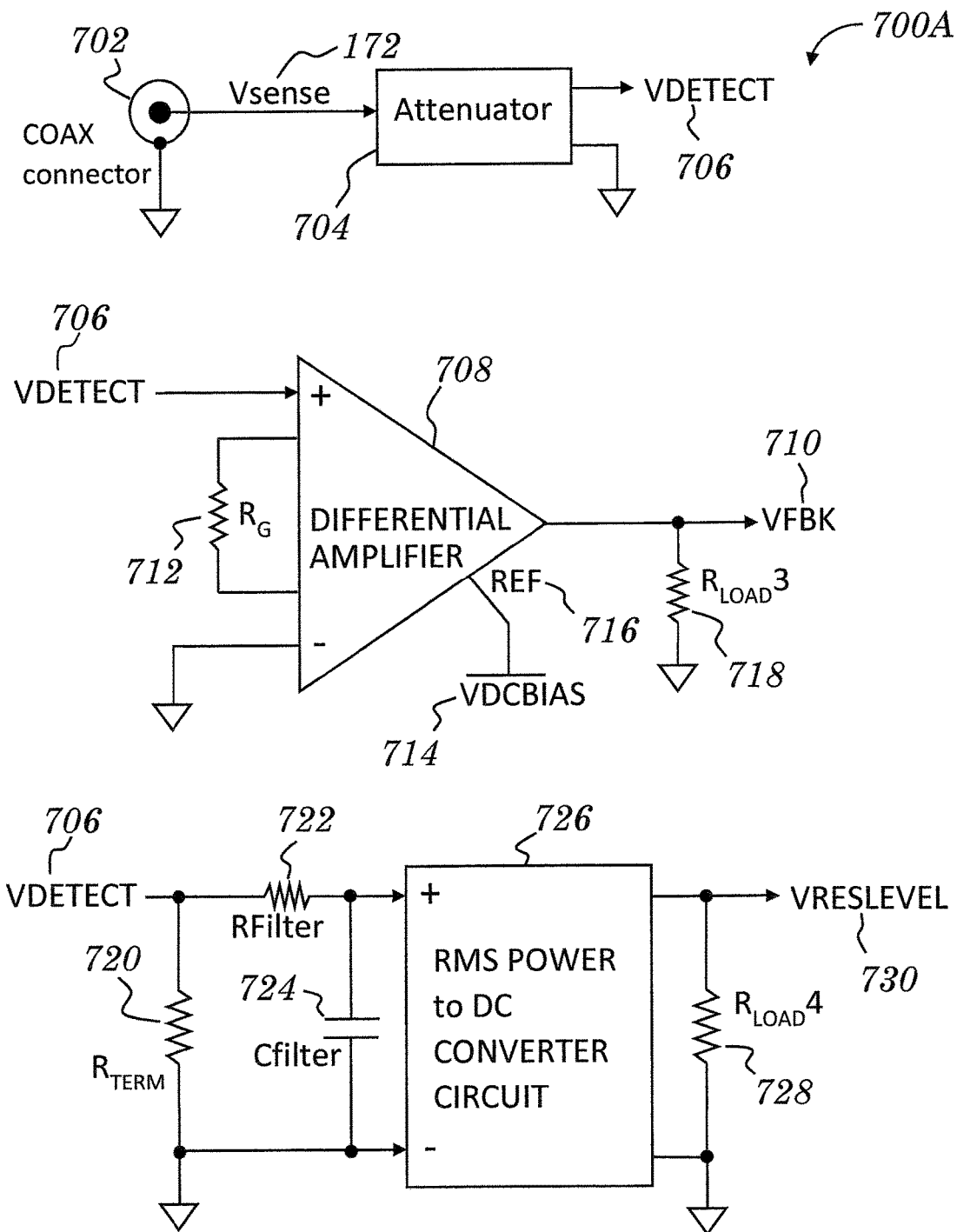
FIG. 7A shows voltage feedback circuits used inside the FFC of the resonant core power supply of FIG. 1.

Refer to FIG. 7A. The voltage feedback signal created by the voltage divider consisting of $C_{SERIES}$ 108 and $C_{SENSE}$ 110, is labeled as Vsense 172 in FIG. 2A which arrives through a coaxial cable connected to the coax connector 702. This feedback signal is shared by a differential amplifier 708 and RMS to DC converter circuit 726.

The input impedance of attenuator 704 matches the impedance of the Vsense 172 feedback cable attached the coax connector 702.

The amplitude of the Vsense 172 signal is calibrated by setting the RcalV potentiometer 208 (FIG. 2A) during manufacture to establish an accurate attenuation ratio between $V_{RES}$ 170 across the LC tank 104, 106, 108 and 110 versus the Vsense signal 172. The attenuation value of attenuator 704 is selected to provide an optimal signal level VDETECT 706 for both the differential amplifier 708 and for the RMS to DC converter 726.

Differential amplifier 708 receives the VDETECT 706 signal to create the VFBK 710 signal. The VFBK 710 signal is DC biased (offset) to prevent VFBK 710 from either swinging below ground or clipping the analog input Ain1 710 of microprocessor 732, FIG. 7B. The DC offset is controlled by the VDCBIAS 714 signal provided by DAC1 of microprocessor 732 fed into the REF input 716 of differential amplifier 708. The gain of differential amplifier 708 is set by the value of resistor $R_G$ 712 in order to provide a maximum peak to peak amplitude of VFBK 710 that fits within the input voltage range of the Ain1 input of microprocessor 732.

The PSAMPLE 523 and NSAMPLE 527 flag signals created by the circuit in FIG. 5D are monitored by microprocessor 528. Microprocessor 732 monitors the PS 523 and NS 527 flag input bits and causes analog input Ain1 to take a sample at either peak of VFBK 710. The positive peak amplitude of VFBK 710 is determined by subtracting the VDCBIAS 714 voltage set by DAC1 from the PSAMPLE measurement value taken by Ain1 during the PS flag 523.

The negative peak amplitude of VFBK 710 is determined by subtracting the NSAMPLE measurement value taken by Ain1 during the NS flag 527 from the VDC bias voltage set by DAC1.

In normal operation, the resulting two peak amplitude calculations should be the same. If a load induced surge causes a peak, then one or both of these signal peak measurements will ideally detect the surge. If a peak surge on the $V_{RES}$ 170 amplitude occurs, indicating that $V_{RES}$ 170 as exceeded the nominal operating level, microprocessor 732 pulls the "BRAKE" signal 574 HIGH through a General-Purpose Input/Output bit (GPI/O bit) bit labeled as "BRAKE". This BRAKE signal 574 flips the polarity of the EXCITATION signal as demonstrated in FIG. 2D.

The RMS to DC Converter Circuit 726 (FIG. 7A) monitors the amplitude level of VDETECT 706 just as differential amplifier 708 does which represents the amplitude of $V_{RES}$ 170. However, 726 constantly monitors the relative power level of VDETECT 706 instead of the voltage level. The output of 726 VRESLEVEL 730 is a DC voltage that is presented to analog input Ain2 of microprocessor 732. VRESLEVEL 730 represents the power level of VDETECT 706 in terms of dBm as if the VDETECT voltage 706 were applied across 50 ohms where 0 dBm equals 1 mWrms. VRESLEVEL 730 is determined by 0 VDC representing the intercept signal level of a small signal level specified by the 726 device manufacturer.

When the input VDETECT 706 of RMS to DC Converter Circuit 726 is greater than the intercept value, the VRESLEVEL 730 voltage will be 0 VDC plus a DC voltage level representing the dBm power of VDETECT 706 above the manufacturer's specified intercept power level times a scale factor such as 10 mVDC per dB above the intercept level. The VRESLEVEL 730 signal fed into analog input Ain2 of 732 accurately relates to the true RMS value of $V_{RES}$ 170 without regard to waveform.

The true RMS amplitude of the resonant current measurement IRESLEVEL 370 of $I_{RES}$ 160 is accurately made in a similar manner by the RMS to DC Converter 360 shown in FIG. 3. The IRESLEVEL 370 signal from FIG. 3 is fed into the analog input Ain3 of microprocessor 732 shown in FIG. 7A.

Microprocessor 732 uses the two measurements; VRESLEVEL 730 from Ain2 and IRESLEVEL 370 from Ain3 to determine the resonant VA Power Level ($P_{RES}$) stored within the magnetic core 102 by multiplying these two measurements.

To determine the resonant power level in terms of VA, then the resulting product of VRESLEVEL 730 and IRESLEVEL 370 must be multiplied by a scaling factor (Kscale). The scaling factor (Kscale) compensates for the RMS power to DC voltage conversion factors of each RMS to DC converter circuits (360 in FIGS. 3 and 726 in FIG. 7A), the turns ratio of the current sense transformer (TRsense shown in FIG. 2A), the division ratio of the AC voltage divider comprised of $C_{SERIES}$ 108 and $C_{SENSE}$ 110 (FIG. 2A) after calibrating Rcalv potentiometer 208 (FIG. 2A), the attenuation value of attenuator 704, the volts per bit resolution of Ain2 and the amperes per bit resolution of Ain3. The two measurements; VRESLEVEL 730 and IRESLEVEL 370 are based upon RMS levels. Due to the fact that the LC tank circuit 104, 106, 108 and 110 is operating in resonance, the combined reactance appears nearly resistive (non-reactive), therefore, the resonant power the stored in the LC tank circuit has a power factor of nearly 1.0, which means that the VA product closely approximates the real power level in terms of Watts.

Magnetic core material used to manufacture the magnetic core 102 typically has a large magnetic permeability tolerance, such as up to 25%. Magnetic permeability value of the core material has a primary effect upon the self-inductance value $L_{RES}$ of the resonant winding $W_{RES}$ 104. This causes an uncertainty of the actual $L_{RES}$ value by ±25%, and subsequentially the resonant frequency ($F_{RES}$) of the LC tank circuit 104, 106, 108 and 110 by the square root of the tolerance uncertainty; $\sqrt{(\pm 25\%)} = \pm 50\%$. Therefore, in order to force the resonant frequency ($F_{RES}$) of the LC tank circuit 104, 106, 108 and 110 to be at a desired frequency, the resonant capacitor $C_{RES}$ 106 must be adjusted to compensate for the value of $L_{RES}$ differing from the intended value. The tuning mechanism 116 is used to adjust the value of $C_{RES}$ 106.

Figure 7B:
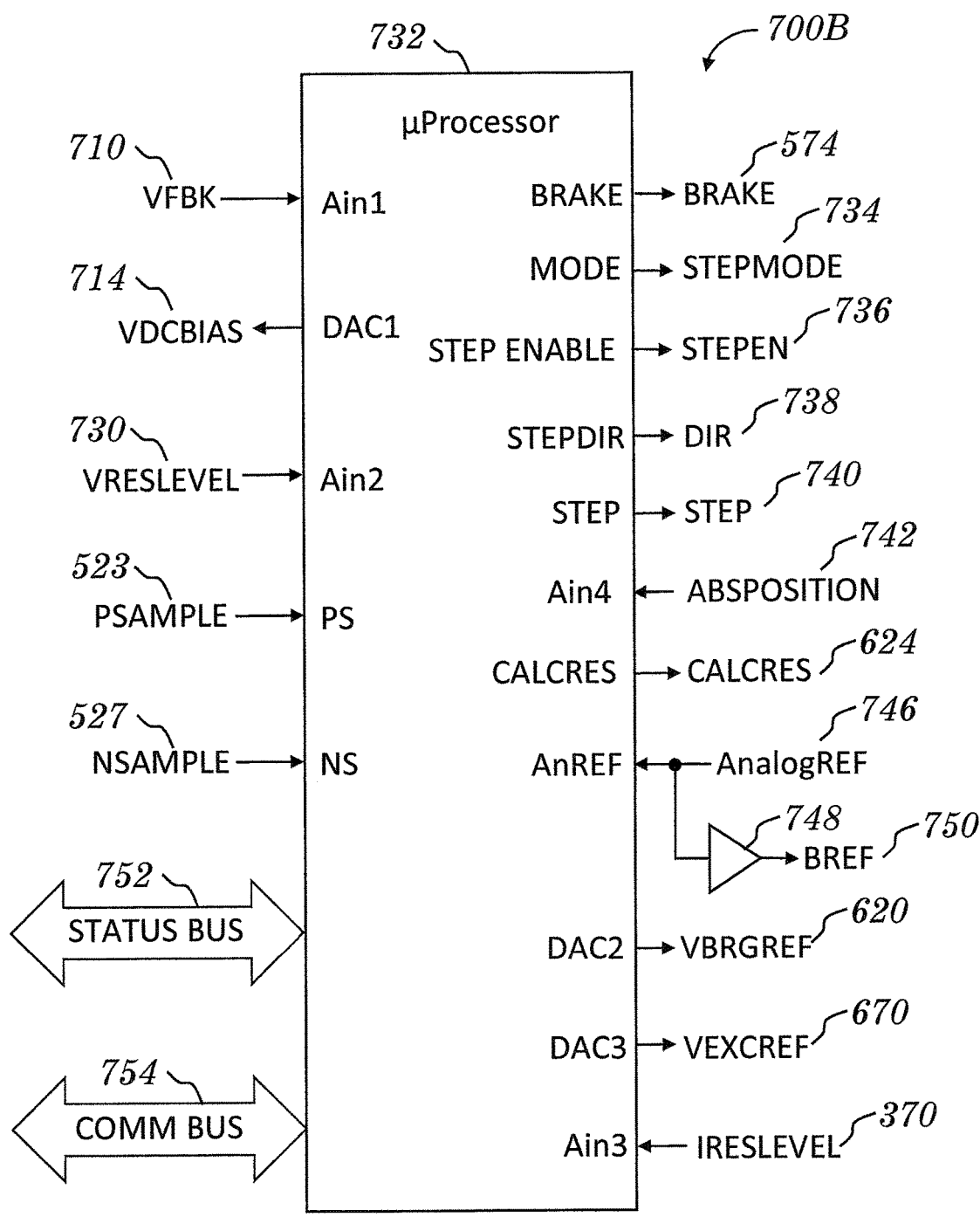
FIG. 7B shows flux level control processor inside the FFC of the resonant core power supply of FIG. 1.

The tuning mechanism 116 uses a motor to mechanically adjust the capacitance setting of $C_{RES}$ 106. FIG. 7B shows several General-Purpose Input/Output bits (GPI/O bits) of microprocessor 732 specified for controlling the motor that drives the tuning mechanism 116. These GPI/O signals enable the motor control circuit inside the tuning mechanism 116 that drives the motor, instructs the motor control circuit which way to operate the motor (either clockwise or counter-clockwise), the mode of operation of how quickly to move the motor shaft, and when to move by another "STEP" increment. The names given to these GPI/O signals controlled by microprocessor 732 shown in FIG. 7B relate to typical control signal names of stepper motor control signals. Of course, if a synchro-resolver is used instead of a stepper motor, the control signals will operate differently than those for a stepper motor.

After $C_{RES}$ 106 is adjusted, the resulting inductive and capacitive reactive impedances ($XL_{RES}$ and $XC_{RES}$) of the LC tank 104, 106, 108 and 110 may differ by ±25% from the nominal design values. When the LC tank circuit 104, 106, 108 and 110 is operating at its natural resonant frequency ($F_{RES}$), the inductive reactance $XL_{RES}$ and the capacitive reactance $XC_{RES}$ are equal. The inductive reactance $XL_{RES}$ of the resonant winding $W_{RES}$ 104 equals the capacitive reactance $XC_{RES}$ of resonant capacitor $C_{RES}$ 106 in parallel with the AC voltage divider formed by $C_{SERIES}$ 108 connected in series with the sense capacitor $C_{SENSE}$ 110. The resonant current $I_{RES}$ 160 is determined by the resonant voltage $V_{RES}$ 170 divided by the resonant impedance; either $XL_{RES}$ or $XC_{RES}$. The value of $C_{RES}$ 106 has been changed by the process of readjusting $C_{RES}$ 106 to compensate for the difference between the actual value of $L_{RES}$ from the intended value of $L_{RES}$ due to the tolerance error of the magnetic permeability of the core 102. Since $L_{RES}$ differs from its intended value, $C_{RES}$ 106 has been adjusted to something other than the initially intended value in order to compensate for the actual $L_{RES}$ value, the reactance values ($XC_{RES}$ and $XL_{RES}$) now differ from the intended nominal values. The resonant current $I_{RES}$ 160 passing through of the resonant winding $W_{RES}$ 104 which is determined by $V_{RES}$ 170 divided by $XL_{RES}$ differing from the intended value, yields an $I_{RES}$ 160 current different from the intended nominal operating current level.

This means that to achieve the desired stored energy level ($P_{RES}$) in terms of VA, the voltage level of $V_{RES}$ 170 must be adjusted according to the resulting $I_{RES}$ 160 current after the $C_{RES}$ 106 adjustment. Microprocessor 732 calculates the actual $P_{RES}$ level and then determines the amount by which VRESLEVEL 730 needs to be adjusted based upon the actual IRESLEVEL 370. The VRESLEVEL 730 depends upon the turns' ratio of the resonant $W_{RES}$ winding 104 versus the Excitation windings $W_{EXC}$ 130, 132 or 134 times the peak voltage $+V_{EXCPK}$ 502 or $-V_{EXCPK}$ 503 applied across each excitation winding 130, 132 or 134 as per equation 7.1.

To control the amplitude of $V_{RES}$ 170, microprocessor 732 sets the output of DAC2 VBRGREF 620, which is the reference voltage used by all of the EDC units 120, 122 and 124 to set their "H" Bridge power supply voltages VBRG 622. By adjusting the "H" bridge voltage VBRG 622, the effective peak voltage of the excitation signal ($+V_{EXCPK}$ 502 or $-V_{EXCPK}$ 503) is adjusted, which in turn adjusts the $V_{RES}$ 170 level.

When the LC tank circuit 104, 106, 108 and 110 is partially charged, the input impedance of each $W_{EXC}$ winding 104 may likely be low enough to cause the current drawn from each "H" bridge circuit in each EDC unit 120, 122 and 124 to be limited by the current sink circuit shown in FIG. 6E. When the current is limited by the current sink circuit instead of being limited by the input impedance of the $W_{EXC}$ windings 130, 132 and 134, the peak amplitude voltage will be substantially less than VBRG 622. The amplitude of $V_{RES}$ 170 builds with each cycle, even while the current is limited.

As $V_{RES}$ 170 across the LC tank circuit 104, 106, 108 and 110 approaches the nominal operating level (as calculated by eq. 7.1) the input impedance of each excitation winding 130, 132 and 134 approaches infinity. Once the input impedance of each $W_{EXC}$ winding 130, 132 and 134 has increased sufficiently to not draw more than the in-rush current limit of each "H" bridge, the peak voltage applied across each $W_{EXC}$ winding 130, 132 and 134 is able to approach VBRG 622.

Each time the RCPS powers up, the natural resonant frequency $F_{RES}$ of the LC tank circuit 104, 106, 108 and 110 must be correctly set in order for $F_{RES}$ to match the StartCLK 460 frequency. Therefore, the latest adjustment to $C_{RES}$ 106 made by the tuning mechanism 116 needs to be verified at the time of starting up the RCPS. By utilizing an absolute position sensor or encoder, microprocessor 732 will be able to determine if the tuning mechanism 116 has been moved inadvertently while powered down since the last time the RCPS was operating. Otherwise microprocessor 732 (FIG. 7B) will not be aware if the tuning mechanism 116 has been moved since the last operation.

Therefore, if it is uncertain whether the last setting of $C_{RES}$ 106 made by the tuning mechanism 116 has been altered, microprocessor 732 (FIG. 7B) must then readjust $C_{RES}$ 106 using the tuning mechanism 116 to a known position such as reaching a limit switch, and then readjust the tuning mechanism 116 each time the RCPS powers on in order to be certain. By using a synchro-resolver, there is no need to provide an absolute position sensor, yet a more complicated drive circuit for using a synchro-resolver is needed.

Figure 7C:
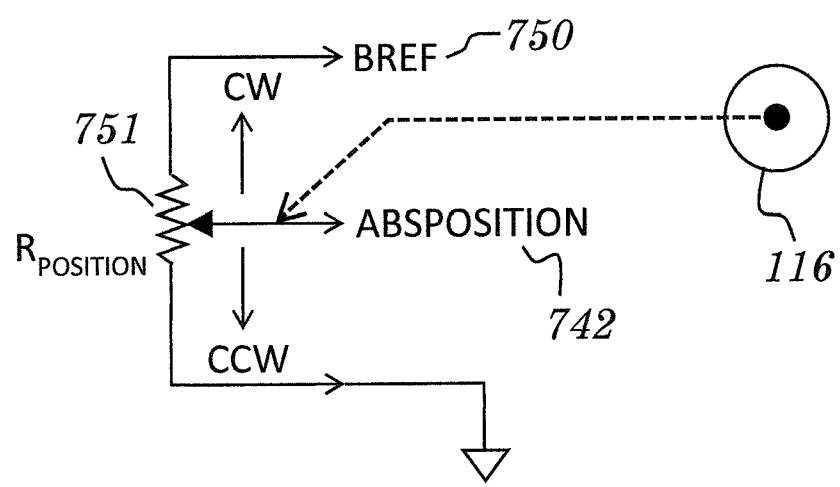
FIG. 7C shows the absolute position sensor of the adjustment shaft of the resonant capacitor in the resonant power supply of FIG. 1.

Refer to FIG. 7C. Analog input Ain4 of microprocessor 732 receives an analog absolute position signal, ABSPOSITION 742 signal from the wiper of a potentiometer, $R_{POSITION}$ 751 is mechanically coupled to the rotor shaft of $C_{RES}$ 106. Amplifier 748 (FIG. 7B) provides a buffered version, BREF 750 of the analog DC voltage reference AnalogREF 746 that is fed into the analog refence voltage input (AnREF). AnalogREF 746 is used internally by the analog inputs (Ain1 through Ain4) and DAC's (DAC through DAC3) inside 732. The absolute position sensing potentiometer, $R_{POSITION}$ 751 has one fixed lead tied to ground, while the other fixed lead is tied to the buffered reference voltage BREF 750 driven by buffer amplifier 748 (FIG. 7B). Tuning mechanism 116 mechanically positions the adjustment shaft of $C_{RES}$ 106 along with the attached shaft of position potentiometer $R_{POSITION}$ 751, which in turn moves the wiper of $R_{POSITION}$ 751.

The wiper of the position sensor potentiometer $R_{POSITION}$ 751 provides an analog voltage representing the rotational position of the capacitor shaft ranging between 0 volts and the buffered refence voltage BREF 750. When the potentiometer is mechanically coupled to the capacitor shaft, the position of the potentiometer shaft is adjusted to slightly less than the potentiometer's full mechanical clockwise (CW) position and secured to the capacitor shaft while the capacitor's shaft is held against its full clockwise (CW) mechanical limit position. With the capacitor's shaft positioned at its maximum capacitance value, it is coupled to the mechanism's shaft while the mechanism's shaft is rotated to just short of its full clockwise (CW) mechanical position. Just before the potentiometer can rotate to its full-clockwise (CW) mechanical limit, the mechanism reaches its full-clockwise (CW) limit, causing the wiper voltage to be very close to the reference voltage, BREF 750. As the mechanism shaft is rotated towards the full counter-clockwise (CCW) position, the wiper voltage approaches zero volts. The mechanism is designed such that the minimum and maximum capacitance values are reached just before reaching either the hard limit of the potentiometer or the hard limit of the tuning mechanism 116. During manufacture, the maximum and minimum voltage values of ABSPOSITION 742 representing the safe-limit wiper positions (clockwise and counter-clockwise) are measured by microprocessor 732 and programmed into non-volatile memory positions by microprocessor 732. Mechanical damage can be averted by having software inside microprocessor 732 stop further movement beyond either safe-limit values of ABSPOSITION 742.

The initial factory calibration adjustment process of setting $C_{RES}$ 106 to the correct value involves applying a small test signal having a frequency accurately set to the desired $F_{RES}$ frequency to the excitation windings 130, 132 and 134. Microprocessor 732 sets the "CALCRES" signal HIGH which when fed to all of the VBRG PS1 621 power supplies inside each EDC unit 120, 122 and 124 causes all of the VBRG 622 output voltage levels to drop to a predefined low voltage "test" signal level. This results in reducing the excitation signal peak voltage level to produce a small "test" signal (somewhere below half of one-volt peak), yet having the correct frequency to match the desired resonant frequency ($F_{RES}$).

Assuming that the tuning mechanism 116 utilizes a stepper motor, microprocessor 732 controls the tuning mechanism 116 by issuing control signals to the stepper motor drive circuit within the tuning mechanism 116. The stepper motor control signals are shown in FIG. 7B as follows.

STEPEN: Stepper motor controller enable signal. When activated the stepper motor controller circuit is fully operational, whereas when not active, then the stepper motor controller sleeps while providing a small holding torque current to the stepper motor windings to help maintain its last mechanical position, preventing accidental movement due any external vibration.

STEP MODE: Selects the step mode that the stepper motor controller uses, primarily half step versus full step.

DIR: Stepper motor direction for the next step, either clockwise (CW) or counter-clockwise (CCW).

STEP: The pulse that actually causes the motor to move one step in the direction dictated by the DIR signal.

The VRESLEVEL 730 output of the RMS to DC converter 726 is logarithmic, which provides a very large dynamic range in the neighborhood of tens of dB can be measured. Small signal levels of VDETECT 706 fed into the RMS to DC converter 726 can be measured with good resolution, while allowing large signal levels to be measured without over-driving the analog input (Ain2) of microprocessor 732.

To calibrate the $C_{RES}$ 106 capacitance value, a small amplitude test signal having an accurately controlled frequency equal to the intended $F_{RES}$ frequency is fed into one or more excitation windings, but not when the RCPS is operating in the normal configuration.

A small test signal is created by the microprocessor 732 setting the CALCRES 624 bit HIGH. The CALCRES 624 signal is fed to the EDC units 120, 122 and 124. The "H" bridge power supply PS1 621 inside the EDC units 120, 122 and 124 uses the CALCRES 624 signal to set the VBRG 622 to low voltage level, perhaps just a few volts. The low voltage level of VBRG 622 causes the peak amplitude, $+V_{EXCPK}$ 502 and $-V_{EXCPK}$ 503 of the excitation signals presented to the excitation windings $W_{EXC}$ 130, 132 and 134 to become much lower than the normal operating level. The small test signal has the correct frequency equal to the intended $F_{RES}$ frequency.

As $C_{RES}$ 106 is adjusted by the tuning mechanism 116, the amplitude of the VRESLEVEL 730 representing the resonant voltage $V_{RES}$ 170 increases as the natural resonant frequency of the LC tank 104, 106, 108 and 110 approaches the $F_{RES}$ frequency of the excitation test signal. However, the amplitude of VRESLEVEL 730 drops as the natural resonant frequency of the LC tank circuit 104, 106, 108 and 110 diverges from the frequency of the test signal, either too high or too low. As the capacitance value of $C_{RES}$ 106 is adjusted, the amplitude of VRESLEVEL 730 peaks when the natural frequency of the LC tank circuit 104, 106, 108 and 110 matches the frequency of the test signal.

During $C_{RES}$ 106 adjustment, Microprocessor 732 measures VRESLEVEL 730 by digitizing the Ain2 input fed by of VRESLEVEL 730 and updates the measurement with each step. As the VRESLEVEL 730 increases, microprocessor 732 continues to issue more step signal pulses. If VRESLEVEL 730 decreases, microprocessor 732 flips the polarity of the DIR signal 738 and then issues more step 740 pulses. When the peak value of VRESLEVEL 730 is reached, the DIR 738 signal is reversed and a few step 740 pulses issued to verify that the peak value had been reached. Then the DIR 738 signal is reversed again until the tuning mechanism 116 has been repositioned to the peak amplitude position. The peak amplitude occurs at the position where the capacitance of $C_{RES}$ 106 resonates with the actual value of $L_{RES}$ when stimulated by the test signal which is set to match Fres. Once this process has been successful, the ABSPOSITION value 742 is then measured by the Ain4 input of 732 and saved into a non-volatile memory position as "TARGET" position. The next time that this $C_{RES}$ 106 calibration procedure is performed, the "TARGET" position is compared to the present ABSPOSITION 742 measured by Ain4. This comparison tells microprocessor 732 how far away the mechanism is from the ideal position along with which direction to move if the ABSPOSITION 742 value differs from the saved TARGET value, thus reducing the amount of time needed to readjust the tuning mechanism 116. After the tuning mechanism 116 has completed the $C_{RES}$ 106 calibration process, the CALCRES 624 and STEPEN 736 signals clear, allowing the RCPS to proceed with "START-UP".

When STEPEN 736 signal is LOW, the stepper motor controller circuit maintains a small amount of "idle" current in each active motor winding in order to produce a small "detent" torque which helps hold the mechanism and thus the $C_{RES}$ 106 value in the event of vibration. This small "idle current" is low enough as to not cause stress to the stepper motor.

After adjusting $C_{RES}$ 106, the reactance $XC_{RES}$ of $C_{RES}$ 106 has changed. When the LC tank circuit 104, 106, 108 and 110 is in resonance, the capacitive reactance $XC_{RES}$ of $C_{RES}$ 106 equals the inductive reactance $XL_{RES}$ of $L_{RES}$ induce value of $W_{RES}$ winding 104. The resonant power $P_{RES}$ is related to $V_{RES}$ 170×$I_{RES}$ 160. Since the $I_{RES}$ 160 current depends upon the reactance of $XL_{RES}$ then the current through $W_{RES}$ 104 also differs from the intended nominal operating current. Therefore, in order to achieve the desire stored resonant power level $P_{RES}$, then the voltage level of $V_{RES}$ 170 must be adjusted. Calculate the new voltage level needed for $V_{RES}$ 170 as follows.

$$V_{RESNEW} = \frac{P_{RES}}{I_{RESactual}} \text{Volts RMS} \qquad \text{eq. 7.2}$$

Where $V_{RESNEW}$=new resonant voltage setting $V_{RES}$ [170]; Volts RMS $P_{RES}$=stored resonant power level; Watts RMS $I_{RESactual}$=new resonant current level $I_{RES}$ [160]; Amperes RMS The new setting for $V_{RES}$ 170 is achieved by microprocessor 732 changing the voltage level of VBRGREF 620 to readjust VBRG 622 power supply output voltage of the PS1 621 power supplies inside EDC units 120, 122 and 124 which causes the peak excitation voltages +VEXCPK 502 and −VEXCPK 503 to satisfy equation 7.1.

After adjusting the $V_{RES}$ 170 level after $C_{RES}$ 106 has been calibrated, the ideal excitation current $I_{EXC}$ 687 can be calculated by microprocessor 732. With $V_{RES}$ 170 being readjusted due to the $C_{RES}$ 106 calibration setting, the $I_{EXC}$ 160 current level may be able to safely increase as long as the "H" bridge components are not over-stressed. The higher the excitation power $P_{EXC}$ per cycle, the quicker the RCPS can compensate for accumulated flux level fluctuations due to load surges. This provides the advantage of recharging the $P_{RES}$ level stored within the LC tank circuit 104, 106, 108 and 110 in between peak power load events. The excitation current $I_{EXC}$ 687 is limited by the safe operating level of the power dissipated within various components within the EDC units 120, 122 and 124, namely the middle (cascode configured) MOSFETs 659, 660, 661 and 662. If the $I_{EXC}$ 687 level is selected for the maximum safe level when VBRG 622 is at its maximum level, the maximum excitation power level of $P_{EXC}$ is achieved. However, if VBRG 622 has been reduced to avoid exceeding the safe operating voltage level of $V_{RES}$ 170, then the maximum allowable $P_{EXC}$ level is no longer reached. Since VBRG 622 has been reduced in order to reduce $V_{RES}$ 170, the power dissipated within the "H" bridge circuits inside EDC units 120, 122 and 124 also has been reduced. To achieve the highest allowable $P_{EXC}$ level, $I_{EXC}$ 687 might be allowed to increase as long as the maximum allowable power dissipation and current ratings for the "H" bridge components and that of the wire used within the excitation windings 130, 132 and 134 is not exceeded. The maximum safe RMS power level of each excitation cycle can be calculated as below.

$$P_{EXCMAX} \cong \frac{V_{BRGactual} \times I_{EXCSAFE}}{2 \times F_{RES}} \text{Watts} \qquad \text{eq. 7.3}$$

Where $P_{EXCMAX}$=maximum safe excitation power level; Watts RMS $I_{EXCsafe}$=max safe peak current level; Amperes peak $V_{BRGactual}$=actual "H" Bridge voltage level setting of VBRG [622]; VDC $F_{RES}$=resonant operating frequency; Hz Based upon the actual $V_{RES}$ 170 level and the safe maximum peak excitation power level $P_{EXCMAX}$, the required peak current level of $I_{EXC}$ 687 can be determined by dividing the peak power level $P_{EXCPK}$ by the peak voltage of the excitation signal level dictated by +$V_{EXCPK}$ 502 and −$V_{EXCPK}$ 503 which are almost equal to VBRG 622.

$$I_{EXCPK} = \frac{2 \times P_{EXCMAX}}{V_{BRGactual}} \text{amperes peak} \qquad \text{eq. 7.4}$$

Where $I_{EXCPK}$=peak current level needed for achieving $P_{EXCMAX}$; Amps peak $P_{EXCMAX}$=maximum safe excitation power level; Watts RMS $V_{BRGactual}$=actual "H" Bridge voltage level setting of VBRG [622]; VDC To verify that the middle MOSFETs 659, 660 and 661, 662 are not overstressed, a calculation of worst-case power dissipation needs to be evaluated. When the RCPS is first turned on, the LC tank is not charged, therefore the $I_{EXC}$ 687 current is limited by the in-rush current limit, while the majority of VBRG 622 is held cross the drain and source of the middle MOSFET's 659, 660, 661 and 662. This brief period during "Start-UP" is the worse-case power dissipation. Ideally, the duration of this situation remains for less than 100 mS and the MOSFET's endure this over a 50% duty cycle. To be safe, calculate the power dissipated during initial "Start-up" considering a 50% duty cycle.

$$P_{MM} = V_{BRGactual} \times I_{INRUSH} \times 0.5 \text{ Watts} \qquad \text{eq.7.5}$$

Where $P_{MM}$=power dissipation of middle MOSFET's each Leg; Watts RMS $I_{INRUSH}$=inrush current limit setting of $I_{EXC}$ [687]; Amps peak $V_{BRGactual}$=actual "H" Bridge voltage level setting of VBRG [622]; VDC The allowable power dissipation level of $P_{MM}$ depends upon the effectiveness of the heatsink(s) used to draw heat dissipated within each MOSFET. This evaluation may point to increasing the number of EDC units 120, 122 and 124 used in tandem while reducing the in-rush limit of each EDC.

To verify that the natural resonant frequency ($F_{RES}$) of the LC tank circuit 104, 106, 108 and 110 has not drifted due to age or temperature change, microprocessor 732 performs an occasional frequency measurement.

Microprocessor 732 measures (counts) the number of timing pulses of a timing clock derived from its internal microprocessor clock in between the rising edges of PSAMPLE 523 (PS) and NSAMPLE 527 (NS). The phase difference between PS and NS is PI radians (180 degrees). Therefore, the resulting count of timing clock pulses occurring over a period equal to one half cycle (180 degrees) of one $F_{RES}$ period can be used to calculate the frequency of $F_{RES}$. The measured frequency of $F_{RES}$ should be the timing clock frequency divided by 2 times the clock count.

$$F_{MEASURED} = \frac{F_{CLK}}{2 \times \text{COUNT}} \text{Hz} \qquad \text{eq. 7.6}$$

Where $F_{MEASURED}$=frequency measured by counting pulses during π radians; Hz $F_{CLK}$=repetition rate of timing "clock-" pulses being counted; Hz $C_{OUNT}$=number of pulses counted during π radians Microprocessor 732 determines if the measured actual resonant frequency differs sufficiently from the ideal $F_{RES}$ frequency to require readjustment. If readjustment is needed, then microprocessor 732 can make small adjustments to $C_{RES}$ 106 without disturbing operation of the RCPS by using the tuning mechanism 116 without activating the CALCRES 624 signal. If the frequency is too low, then the capacitance value of $C_{RES}$ 106 must be reduced, likewise if the measured frequency is too high, then the capacitance of $C_{RES}$ 106 must be increased. Over time, the amount of frequency error between the design frequency of $F_{RES}$ versus the actual natural resonant frequency of the LC tank circuit 104, 106, 108 and 110 should be very minimal, just as resetting a wrist watch on a daily basis with respect to a standard clock results in minimizing absolute time discrepancies between the standard clock and the watch.

To readjust the $C_{RES}$ capacitor 106 during normal operation, microprocessor 732 performs the following procedure;

1) Determine which direction to adjust $C_{RES}$ 106,
2) Set the STEPEN signal 736 to enable the stepper motor drive circuit,
3) Set the DIR signal 738 for the correct direction,
4) Issue a STEP pulse 740,
5) Measure the frequency again using PS versus NS clock count method for several $F_{RES}$ cycles,
6) Determine if the correct frequency has been achieved, otherwise repeat steps 3 through 6.
7) Measure the ABSPOSITION 742 value,
8) Save the new ABSPOSITION 742 value as the "temporary TARGET" value inside at a volatile RAM location.
9) Clear STEPEN signal 736.

Later, during the power shut-down process of the RCPS, the "temporary TARGET" value is then used to update the "TARGET" value that was previously stored in a non-volatile memory location. This "TARGET" value will be used the next time that the RCPS is powered up again.

In FIG. 7B, the STATUS BUS 752 is used to communicate system status to various sections within the RCPS such as the following.

The EDC units 120, 122 and 124
Power Factor Correction units 144 and 146
Power supply units 154 and 156

Additionally, the Status Bus 752 allows various circuits listed above to broadcast important status details to each other in addition to the FFC 114 without need to wait for software interrupts or protocol procedures.

The COMM BUS 754 shown in FIG. 7B is used for formal communication among various units to transfer blocks of data or script commands.

8. Selecting System Parameters

Primary operating parameters of an RCPS interact with each other, therefore requiring careful selection and making compromises in order to allow the system to work properly. For the intended application, the peak output power needed to drive the intended load must be considered. This dictates what the minimum resonant power level ($P_{RES}$) that should be maintained during operation. The resonant power level $P_{RES}$ dictates what the resonant voltage $V_{RES}$ 170 and what the resonant current $I_{RES}$ 160 level needs to be since $P_{RES}$ equals the product of $V_{RES}$ 170 and $I_{RES}$ 160. As the $V_{RES}$ 170 level increases, it approaches the break-down voltage of the $W_{RES}$ 104 wire insulation and the breakdown voltages of the $C_{RES}$ 106 and $C_{SERIES}$ 108 dielectric material. As the resonant current $I_{RES}$ 160 flowing through $W_{RES}$ 104 increases, it may approach the safe operating current level for the wire size used in the $W_{RES}$ winding 104. As $V_{RES}$ 170 decreases, the $I_{RES}$ 160 level decreases, causing the resonant power level $P_{RES}$ to decrease below the desired operating level, unless the FFC 114 compensates by increasing $V_{RES}$ 170.

Depending upon the nature of the intended driven load, there may be an expected repetition rate of load peak surges. To feed a sinusoidal AC power inverter to drive a large motor, the RCPS will encounter two large peak surges every cycle of the inverter output (if the inverter has a single-phase output) or six surges per inverter output cycle (if the inverter has a three-phase output). The output frequency of the inverter will dictate the time in between these load peaks. How the motor is used also effects the load characteristics. A motor driving an irrigation pump has a relatively constant load. If the motor drives a manually operated engine lathe, a machinist may be heavy-handed and take deep heavy cuts followed by quickly retracting the tool after completing each cut and therefore, causing less predictable load characteristics. An RCPS needs to be able to sustain any load peaks or else recharge the accumulated flux back to full operating $P_{RES}$ level before the next peak occurs. This determines how much energy must be delivered to recharge during each excitation cycle and how many excitations cycles are needed in between expected load peaks. Also, the maximum $I_{EXC}$ 687 in-rush current limit determines how much energy per excitation cycle is delivered to the LC tank circuit 104, 106, 108 and 110 and the number of EDC units 120, 122 and 124 that are required to be used in tandem. The resonant frequency ($F_{RES}$) determines how many excitation cycles are available in between load peaks. Ultimately, the resonant frequency needs to be high enough to provide many recharging (excitation) cycles in between load peaks.

As the resonant frequency ($F_{RES}$) increases, the less resonant current $I_{RES}$ 160 flows within the LC tank 104, 106, 108 and 110 due to the reactance ($XL_{RES}$) of the resonant winding $W_{RES}$ 104, which increases with higher $F_{RES}$ frequency. This requires the FFC 114 to compensate by increasing $V_{RES}$ 170 in order to achieve the desired resonant power level ($P_{RES}$).

As the resonant frequency increases, so does the magnetic hysteresis losses within the core 102, causing more iron loss. Iron loss can become quite substantial as the core size increases since iron loss results in "Watts per pound". If the core 102 dissipates hundreds of watts, then substantial cooling will be needed. Core loss is determined by the material type, the operating frequency, the operating flux level, the mass of the core 102 and the signal waveform.

As the nominal operating voltage level $V_{RES}$ 170 increases, so does the operating flux level along with the operating flux density level ($B_{Pk}$) within the core 102. The resonant peak flux created by the nominal operating peak voltage level of $V_{RES}$ 170 is limited by equation 7.1. The nominal operating peak flux density ($B_{Pk}$) is determined by the resonant peak flux level divided by the cross-sectional area of the core 102. As the nominal operating voltage level $V_{RES}$ 170 increases, a larger core cross-section is required to maintain the same flux density ($B_{PK}$).

Increasing $F_{RES}$ has the advantage of reducing the required cross-sectional area of the core 102 to carry the nominal operating flux level, while iron loss caused by core hysteresis increases. Choosing the resonant frequency must balance iron core loss against core cross-section area. Increasing $F_{RES}$ also has the advantage of providing more resonant excitation cycles in-between load surges.

However, as $F_{RES}$ increases, the stray capacitance between each adjacent turn in the resonant $W_{RES}$ winding 104 increases. The combined stray capacitance in between each turn accumulates, becoming more critical. The effect of the stray capacitance appears in parallel with $C_{RES}$ 106. As $F_{RES}$ increases, the $C_{RES}$ 106 value must be adjusted to a smaller capacitance value. If the required $C_{RES}$ 106 value approaches the value of the stray capacitance of the $W_{RES}$ winding 104, then $C_{RES}$ 106 might not be able to be adjusted low enough. At lower frequencies, the required capacitance adjustment value of $C_{RES}$ 106 increases and therefore the amount of stray capacitance across $W_{RES}$ 104 has less effect and perhaps no longer causes trouble. Also, a larger value of $L_{RES}$ can be allowed, which allows the effective permeability of the core 102 to be higher.

As $F_{RES}$ is decreased, the required capacitance value of $C_{RES}$ 106 in parallel with AC divider comprised of $C_{SERIES}$ 108 and $C_{SENSE}$ 110 connected in series increases while the self-inductance value ($L_{RES}$) of $W_{RES}$ winding 104 must decrease. With a lower $F_{RES}$ frequency, $L_{RES}$ may become to too large. Changing the geometry of the core 102 either by reducing the cross-section area or by increasing the magnetic path length decreases the effective permeability of the magnetic core 102, thus reducing the self-inductance value $L_{RES}$ of $W_{RES}$ winding 104. If the inductance value $L_{RES}$ becomes too large, then the resonant current $I_{RES}$ 160 flowing through the $W_{RES}$ winding 104 may become too low to achieve the desired $P_{RES}$ level.

By lowering $F_{RES}$, $C_{RES}$ 106 must increase. Since $V_{RES}$ 170 is likely to be a high voltage, then the voltage rating of $C_{RES}$ 106 must be able to handle this high voltage. The thickness of the dielectric material used in making $C_{RES}$ 106 must increase to handle the higher voltage, thus increasing the material cost and reducing the effective capacitance of the capacitor which then requires that the plate area must increase to compensate for the thicker material, which also increases the cost of the plates.

As $F_{RES}$ increases, the more pronounced "skin effect" occurs within the individual wires used within all of the windings 104, 130, 132, 134, 140 and 152. Skin effect, which is frequency dependent, reduces the useful conductor area of each wire. When the "skin depth" value is calculated, it represents how deep the current flows down from the outer surface into the wire's cross-section. Larger diameter wires having a radius larger than the skin depth value no longer are able to conduct current effectively in the center area of the wire's cross-section. This effectively reduces the current capacity rating of the wire. A frequency of 6.4 KHz passing through copper wire has a skin depth of 814.9 µm. The diameter of 14AWG wire is 1.628 mm which has a radius of 814.5 µm and a rated current carrying capacity of 5.9 Arms. If $F_{RES}$ is equal to or greater than 6.4 KHz then wires having a radius larger than 14AWG electrically appear similar to 14AWG wire. If $F_{RES}$ is reduced to below 5.3 KHz, then the skin depth increases to 895.5 µm. A 13AWG wire has a diameter of 1.8288 mm and a radius of 914.4 µm. The current capacity rating for 13AWG wire is 7.4 Arms. For windings that carry less than 7.4 Arms 13AWG wire could be used if $F_{RES}$ stays below 5.3 KHz. If $F_{RES}$ remains above 5.3 KHz but below 6.4 KHz, for windings that carry more than 5.9 Arms, multiple 14AWG or smaller wires must be used in parallel.

In the case of excitation windings 130, 132 and 134, EDC units 120, 122 and 124 which have their in-rush current limit set at or below 5.9 Arms can drive excitation windings that consist of 14AWG wire. Having multiple EDC units 120, 122 and 124 operating in tandem each driving their own 14AWG winding allow a combined excitation current exceeding that of one wire's current rating.

Small disparities in the excitation signal amplitudes between multiple EDC units 120, 122 and 124 are averaged out galvanically through the magnetic coupling of the core 102 and not adversely affect the electronic circuitry within each EDC unit.

Likewise, for the PFC units 144 and 154, loads attached to these PFC circuits 146 and 156 might draw more current than the skin effect allows. Therefore, by dividing the current by either paralleling wires used in each winding or by using multiple PFC units 144 or 154 in tandem, higher currents can be delivered to the downstream circuits 146 and 156.

By studying the core material manufacturer's datasheet of the core material, a decision can be made regarding the operating frequency ($F_{RES}$), the peak operating magnetic flux density level ($B_{Pk}$) and acceptable iron loss. The peak magnetic flux ($B_{Pk}$) level must remain below the flux saturation limit (specified in Teslas or gauss) for the material being considered. The nominal peak magnetic flux density level ($B_{Pk}$) is determined by the nominal peak magnetic flux operating level ($\Phi_{Pk}$) divided by the cross-sectional area of the core 102.

The nominal peak magnetic flux operating level ($\Phi_{Pk}$) is maintained by the FFC 114 at a specific desired level by controlling the $V_{RES}$ 170 level. The peak operating flux level ($\Phi_{Pk}$) can be determined in relation to the nominal $V_{RES}$ 170 voltage level.

$$\Phi_{Pk} = \frac{V_{RES} \times \sqrt{2}}{N_{RES} \times \omega} \text{Webers} \qquad \text{eq. 8.1}$$

Where
$\Phi_{Pk}$=operating flux level; Webers peak
$V_{RES}$=resonant voltage [170] across LC tank [104,106, 108 & 110]; (Vrms)
$N_{RES}$=number of wire turns in resonant winding WRES [104]; (turns)
$\omega=2\times\pi\times F_{RES}$; (Radians per second)
$F_{RES}$=natural resonant frequency of LC tank [104,106,108 & 110]; Hz The minimum cross-section area required for the core 102 can then be calculated by:

$$A_{core} = \frac{\Phi_{Pk}}{B_{Pk} \times \omega} \text{meters}^2 \qquad \text{eq. 8.2}$$

Where
$A_{core}$=minimal area of the core [102] required for $\Phi_{Pk}$; ([ meters] ^2)
$\Phi_{Pk}$=peak operating flux level as calculated in eq.8.1; Webers
$B_{Pk}$=peak operating flux density level; (Tesla)
{1 Tesla=10,000 gauss=1 Weber/meter^2}
$\omega=2\times\pi\times F_{RES}$; (Radians per second)
$F_{RES}$=natural resonant frequency of LC tank [104,106,108 & 110]; Hz The peak flux level $\Phi_{Pk}$ allowed to flow through the core 102 is related to the cross-sectional area of the magnetic core 102. By re-arranging eq. 8.2 into equation 8.3 can be used to reaffirm that the flux density ($B_{Pk}$) coerced into the core 102 by $V_{RES}$ 170 as calculated by eq. 8.1 does not exceed the flux density capacity of the core area;

$$B_{Pk} = \frac{\Phi_{Pk}}{A_{core} \times \omega} \text{meters}^2 \qquad \text{eq. 8.3}$$

Where
$B_{Pk}$=peak operating flux density level; (Tesla)
$A_{core}$=min. cross section area of core [102] required to carry $\Phi_{Pk}$; (meter ^2)
$\Phi_{Pk}$=peak operating flux level; (Webers)
$\omega=2\times\pi\times F_{RES}$; (Radians per second)
$F_{RES}$=natural resonant frequency of LC tank [104,106,108 & 110]; Hz Equation 8.3 assists in selecting the core material, the operating level of $V_{RES}$ 170 which implies the flux density that the core needs to operate at and aids estimation of core material's the hysteresis iron loss at $F_{RES}$.

As the core 102 cross-sectional area $A_{core}$ increases, the higher the self-inductance value $L_{RES}$ of the resonant winding $W_{RES}$ 104 increases, which increases the inductive reactance $XL_{RES}$, which reduces $I_{RES}$ 160 which then requires that the FFC 114 to increase $V_{RES}$ 170 in order to compensate. As the FFC 114 increases the excitation voltage in order to increase $V_{RES}$ 170, the flux level within the magnetic core 102 increases as per eq. 8.1, which then increases iron loss. The expected iron loss in terms of Watts per pound weight of the core 102 may be gleaned from the magnetic core material manufacturer's datasheet. If not, the Steinmetz constants $\alpha$, $\beta$ and $K_c$ might be provided by the datasheet. These variables can be used to predict the iron loss by using the Steinmetz equation (eq. 8.4) shown below.

$$\text{Iron}_{loss} = \frac{K_C \times F_{RES}^{\alpha} \times B_{Pk}^{\beta}}{MPL} \text{Watts/pound weight} \qquad \text{eq. 8.4}$$

Where
$\text{Iron}_{loss}$=predicted iron loss of the core [102]; (Watts per pound)
$K_C$=constant relivant to the magnetic material; (from datasheet)
$\alpha$=constant relivant to the magnetic material; (from datasheet)
$\beta$=constant relivant to the magnetic material; (from datasheet)
MPL=magnetic path length that flux travels through the core (meters)

Assuming that the geometry of the core 102 is toroidal, the mean magnetic path length (MPL) can be calculated as follows.

$$MPL = \frac{2 \times \pi \times \ln\left(\frac{Core_{OD}}{Core_{ID}}\right)}{\left(\frac{1}{Core_{ID} \times 0.5}\right) - \left(\frac{1}{Core_{OD} \times 0.5}\right)} \text{meters} \qquad \text{eq. 8.5}$$

Where
MPL=magnetic path length that flux travels through the core (meters)
$Core_{OD}$=outside diameter of magnetic core [102]; (meters)
$Core_{ID}$=inside diameter of magnetic core [102]; (meters)

The resonant current $I_{RES}$ 160 flowing through the resonant winding $W_{RES}$ 104 is controlled by the inductive reactance $XL_{RES}$ of $L_{RES}$ at the resonant frequency, $F_{RES}$. Reactance $XL_{RES}$ is controlled by the self-inductance $L_{RES}$ of $W_{RES}$ 104. If the inductive reactance of $L_{RES}$ is too high, then $L_{RES}$ must be decreased in order to achieve the desired level of $I_{RES}$ 160. The self-inductance of the resonant winding $W_{RES}$ 104 can be calculated as follows.

$$L_{RES} = \frac{N_{RES}^2 \times \mu_0 \times \mu_r \times A_{core}}{MPL} \text{ henries} \qquad \text{eq. 8.6}$$

Where $L_{RES}$=self inductance of the resonant winding $W_{RES}$ [104]; (henrys)

$N_{RES}$=number of wire turns in resonant winding $W_{RES}$ [104]; (turns)

$\mu_0$=magnetic permeability of space, $4\pi \times 10^{-7}$; (henrys per meter)

$\mu_r$=relative permeability of core material with respect to $\mu_0$; ratio $\mu_r/\mu_0$ $A_{core}$=cross sectional area of the core [102]; (meters$^2$)

MPL=magnetic path length calculated by eq.8.5; (meters)

If the $L_{RES}$ value is too high, then the effective permeability of the core 102 can be reduced by adding one or more air gaps to the core 102. The resulting relative permeability is something that can be specified to the core manufacturer when ordering the core 102. By specifying what the desired effective permeability of the core needs to be is a normal parameter that the industry is familiar with. By replacing $\mu_r$ in equation 8.6 with the desired effective permeability ($\mu_{eff}$) and rearranging equation 8.6 into equation 8.7, then the correct value needed for $\mu_{eff}$ can be determined.

$$\mu_{eff} = \frac{L_{RES} \times MPL}{N_{RES}^2 \times \mu_0 \times A_{core}} \qquad \text{eq. 8.7}$$

Where $\mu_{reff}$=effective relative magnetic permeability of gapped core; ratio of $\mu_{eff}/\mu_0$ $N_{RES}$=number of wire turns in resonant winding $W_{RES}$ [104]; (turns)

$\mu_0$=magnetic permeability of space, $4\pi \times 10^{-7}$; (henrys per meter)

$A_{core}$=cross sectional area of the core (item 1); (meters$^2$)

$L_{RES}$=self-inductance of the resonant winding $W_{RES}$ [104]; (henrys)

MPL=magnetic path length calculated by eq.8.5; (meters)

To resolve $L_{RES}$ becoming too high, the effective permeability of the core can be reduced by adding one or more "air gaps", causing the self-inductance value of all windings 104, 130, 132, 134, 140 and 150 on the magnetic core 102 to become lower. An advantage of gapping the core helps prevent the flux level reaching the saturation level of the magnetic core material. However, gapping the core 102 increases the core reluctance value, which reduces the amount of flux that is allowed to flow along the magnetic path. If the reluctance becomes too high, then the desired operating flux level ($\Phi_{Pk}$) may not be able to flow. To resolve this, the cross-section area of the core 102 can be increased, but not so much that $L_{RES}$ increases too much. This requires a compromise.

Gapping the core 102 can cause "flux-fringing" which allows some of the flux $\Phi_{Pk}$ flowing within the core 102 to escape the boundaries of the magnetic core, thus causing "leakage inductance". If the effective permeability $\mu_{eff}$ is reduced to fairly low value, such as 125 or less, the escaping flux may not be easily coerced back into the magnetic core, becoming lost instead of being useful within the core 102. By keeping the length of the air gap to a minimum, or by dividing the air gap length into multiple shorter air gaps having a combined length of the single air gap, less fringing occurs. Majority of fringing occurs within a radius typically equal to that of the distance of each air gap. Therefore, several small gaps may result in a combined flux leakage less than the leakage caused by a single wider air gap.

Knowing the required combined gap length of all of the air gaps cut into the core is helpful. To calculate the required combined length of all of the air gaps to achieve the desired $\mu_{eff}$, the following equation can be used.

$$\text{Length}_{GAP} = \left(\frac{MPL}{\mu_r}\right) \times \left(\frac{\mu_r}{\mu_{eff}}\right) \text{meters} \qquad \text{eq. 8.8}$$

Where $\text{Length}_{GAP}$=magnetic path length of air GAP sections combined; (meters)

$\mu_r$=relative magnetic permeability of core material; ratio of $\mu_r/\mu_0$ $\mu_{reff}$=effective relative permeability of gapped core; ratio $\mu_{eff}/\mu_0$ MPL=magnetic path length calculated by eq.8.5; (meters)

The combined magnetic path length of the remaining "iron" core sections ($\text{Length}_{iron}$) after gapping the core is simply the existing un-gapped magnetic path length (MPL) minus the combined air gap sections; (MPL−$\text{Length}_{GAP}$). The combined magnetic reluctance of all magnetic core (iron) sections can be calculated as follows.

$$R_{iron} = \frac{\text{Length}_{iron}}{\mu_0 \times \mu_r \times A_{core}} \{(\text{Ampere} * \text{turns})/\text{Weber}\} \qquad \text{eq. 8.9}$$

Where $R_{iron}$=combined reluctance of magnetic core sections; Amp*turns/Weber $\mu_0$=magnetic permeability of space, $4\pi \times 10^{-7}$; (henrys per meter)

$\mu_r$=relative magnetic permeability of core material; ratio of $\mu_r/\mu_0$ $\text{Length}_{iron}$=combined path length of magnetic core sections; meters $A_{core}$=cross sectional area of the core [102]; (meters$^2$)

Assuming that the permeability of the material occupying the "air" gap has a magnetic permeability very close to that of "space" which is $\mu_0$. The combined magnetic reluctance of all air gap sections can be calculated as follows.

$$R_{GAP} = \frac{\text{Length}_{GAP}}{\mu_0 \times A_{core}} \{(\text{Ampere} * \text{turns})/\text{Weber}\} \qquad \text{eq. 8.10}$$

Where $R_{GAP}$=combined reluctance of all air GAP sections; (Amp*turns)/Weber $\mu_0$=magnetic permeability of space, $4\pi \times 10^{-7}$; (henrys per meter)

$\text{Length}_{GAP}$=magnetic path length of air GAP sections combined; (meters)

$A_{core}$=cross sectional area of the core [102]; (meter$^2$)

The total combined magnetic reluctance of the gapped core 102 can then be calculated as follows.

$$R_{GAPPEDcore} = R_{iron} + R_{GAP} \{(\text{Ampere}*\text{turns})/\text{Weber}\} \qquad \text{eq.8.11}$$

Where $R_{GAPPEDcore}$=total reluctance of GAPPED core; (Ampere*turns)/Weber $R_{iron}$=combined reluctance of magnetic sections; (Amp*turns)/Weber $R_{GAP}$=combined reluctance of air GAP sections; (Ampere*turns)/Weber After the core has been gapped, the core reluctance has increased above that of the un-gapped core. Equation 8.2 determines what the minimum cross-section area of the un-gapped core 102 is needed to carry the desired flux level dictated by equation 8.1 without increasing the flux density level ($B_{Pk}$). After gapping the core 102 requires re-evaluating the size of the cross-section area of the core 102 in order to carry the flux level ($\Phi_{Pk}$) accumulated within the core 102 during normal operation per eq. 8.1. The flux level limit that the gapped core will allow to flow (through the air gaps) can be calculated as follows.

$$\Phi_{LIMIT} = \frac{N_{RES} \times I_{RESpk}}{R_{GAPPEDcore}} \text{Webers} \qquad \text{eq. 8.12}$$

Where $\Phi_{LIMIT}$=flux limit imposed by the GAPPED core reluctance; Webers $N_{RES}$=number of wire turns in resonant winding $W_{RES}$ [104]; (turns)

$I_{RESpk}$=peak resonant current ($I_{RES}$ [160]×√2); (Amperes Peak)

$R_{GAPPEDcore}$=total reluctance of GAPPED core; (Ampere*turns)/Weber

If the flux limit ($\Phi_{LIMIT}$) is lower than the operating resonant flux level ($\Phi_{Pk}$) as calculated by eq. 8.1, then the peak operating current level of $I_{RES}$ 160 will not be allowed to flow, thus preventing the desired resonant power level of $P_{RES}$ from being achieved. Therefore, the cross-section area the of the core ($A_{core}$) would need to be increased. The following equation determines what the new cross-section area ($A_{core}$) needs to be to accommodate the higher reluctance of the magnetic core which yielded $\mu_{eff}$.

$$A_{core} = \frac{MPL}{\mu_0 \times \mu_{eff} \times N_{RES}^2 \times I_{RESpk} \times \Phi_{Pk}} \text{meters}^2 \qquad \text{eq. 8.13}$$

Where $A_{core}$=cross sectional area of the core [102]; (meters$^2$)

MPL=magnetic path length that flux travels through the core (meters)

$\mu_0$=magnetic permeability of space, $4\pi \times 10^{-7}$; (henrys per meter)

$\mu_{reff}$=effective relative permeability of gapped core; ratio $\mu_{eff}/\mu_0$ $N_{RES}$=number of wire turns in resonant winding $W_{RES}$ [104]; (turns)

$I_{RESpk}$=peak resonant current ($I_{RES}$ [160]×√2); (Amperes Peak)

$\Phi_{Pk}$=peak operating flux level per eq.8.1; (Webers)

A new value for $A_{core}$ may adversely affect the value of $L_{RES}$ and consequently, the value of $L_{RES}$ should be re-evaluated by using eq. 8.6. If $L_{RES}$ has changed enough to cause problems, then the number of turns ($N_{RES}$) in the resonant winding 104 or the combined air gap distance may need to be changed. As $N_{RES}$ changes, so does the operating voltage level of $V_{RES}$ 170 change, which the FFC 114 may or may not be able to compensate by changing the VBRG 622 power supply level. This then needs to be re-evaluated as well.

Often, the effective permeability of a core ($\mu_{eff}$) is specified by an "AL value" which denotes the resulting inductance of a coil wound around the core 102 per turn squared. The AL value can be calculated by $$AL_{VALUE} = \frac{L_{RES}}{N_{RES}^2} \text{Henries/turn}^2 \qquad \text{eq. 8.14}$$

Where $AL_{VALUE}$=resulting inductance of winding turns onto core; henrys/turn] ^2

$L_{RES}$=desired $L_{RES}$ inductance of resonant winding $W_{RES}$ [104]; (henrys)

$N_{RES}$=number of wires turns in resonant winding $W_{RES}$ [104]; (turns)

Core manufacturers test the resulting AL value by winding a specified number of turns around a core being constructed (while being gapped), and then measuring the resulting inductance. Often the number of turns wound around the core will be a simple number of turns to apply manually, such as ten turns. This allows a test technician to remove the winding, make adjustments to the air gap(s) and then manually rewind the test winding with each iteration until the resulting inductance falls within the agreed upon tolerance. If the manufacturer specifies $N_{TEST}$ number of turns, then the inductance measured should yield an inductance as follows.

$$L_{TEST} = AL_{VALUE} \times N_{TEST}^2 \text{ henrys} \qquad \text{eq.8.15}$$

Where $L_{TEST}$=target inductance value specified for testing (henrys)

$AL_{VALUE}$=resulting inductance of winding turns onto core; henrys/turn$^2$ $N_{TEST}$=number of wire turns specified for testing (turns)

The magnetic permeability of the materials used to manufacture the magnetic core 102 can vary by as much as 25% unless the core manufacturer agrees to commit to a more accurate value. This commitment will only apply to the gapped core with the specified number of test-turns applied. Since the number turns ($N_{RES}$) is likely to be many more turns than the simple test winding, flux fringing due to air gaps may cause an additional series leakage inductance to add to the desired $L_{RES}$ inductance value. This uncertainty causes a similar uncertainty in the $L_{RES}$ value of the $W_{RES}$ winding 104.

If $L_{RES}$ varies by ±25%, then $XL_{RES}$ varies by +25% which in turn causes $I_{RES}$ 160 to vary by ±25%. The natural resonant frequency of the LC tank 104, 106, 108 and 110 must be adjusted (calibrated) to compensate for any variance of $L_{RES}$ from the intended value of $L_{RES}$ by adjusting $C_{RES}$ 106 so that the resonant frequency of the LC tank circuit 104, 106, 108 and 110 matches the desired $F_{RES}$ frequency. When the resonant frequency of the LC tank 104, 106, 108 and 110 has been adjusted to the desired $F_{RES}$ frequency, the inductive reactance $XL_{RES}$ of the inductor $W_{RES}$ 104 matches the capacitive reactance $XC_{RES}$ of the $C_{RES}$ 106 capacitor. The $C_{RES}$ 106 capacitor must have enough adjustment range to accommodate the ±25% tolerance of the $L_{RES}$ value.

If $L_{RES}$ is not equal to the intended design value, then $C_{RES}$ 106 value after adjusting for the correct $F_{RES}$ value also no longer matches the intended design's $C_{RES}$ 106 capacitance value. Therefore, the reactance of $XL_{RES}$ and $XC_{RES}$ no longer match their intended design values after $C_{RES}$ 106 has been adjusted. Since the $I_{RES}$ 160 current level is controlled by $XL_{RES}$ versus $V_{RES}$ 170, then $I_{RES}$ 160 no longer matches its intended value. The product of $V_{RES} \times I_{RES}$ determines the resonant power $P_{RES}$. In order to achieve the desired resonant power level $P_{RES}$, the FFC 114 adjusts $V_{RES}$ 170 until $V_{RES} \times I_{RES}$ equals the desired resonant operating power level $P_{RES}$. Because $I_{RES}$ 160 can vary by ±25% then the wire size used in $W_{RES}$ 104 winding must accommodate an extra 25% current.

In RCPS applications to drive large loads requiring kilowatts of power, the $V_{RES}$ 170 voltage may be as much as several thousand volts. High peak voltage levels of $V_{RES}$ 170 stress wire insulation, the breakdown voltage of the dielectric material used in the $C_{RES}$ 106 and $C_{SERIES}$ 108 capacitors and various electrical insulating covers.

The "creep" distance between $V_{RES}$ 170 connections and chassis ground must be sufficient to avoid arc "flash-over" caused by the atmospheric breakdown voltage of air. There is no absolute consistent "breakdown" voltage rating of air. Some references claim that dry air ionizes around 17 kV per cm, therefore, a voltage potential of 10,000 Vpk requires a minimum spacing (creep distance) of 0.588 cm between connections, otherwise the air ionizes and allows the voltage to arc between connections. As air becomes moist with humidity, this break down voltage drops as low as 12 kV/cm, thus requiring that a 10,000 Vpk circuit requires at least 0.833 cm of creep distance. To compound this, if any exposed contact has a sharp pointed projection, such as a wire's solder-tail protruding from a printed circuit board connection, then a phenomenon called "arc-spray" increases the ability to ionize the air at a much lower voltage. Some sources claim high voltage arc flashes through air occur at 25V per mil (25V/0.0254 mm).

Safety regulations specified by UL and other agencies dictate a minimum creep distance depending upon the voltage level. These creep distances are quite large with the intent to error on the side of safety since unknown conditions such as humidity, air density due atmospheric conditions, altitude, and sharp contact surface contours can adversely affect breakdown voltage. Imbedding these high voltage connections with a thick layer of high voltage rated potting compound or liquid insulating oil may reduce such arc-over threats. Often high voltage transformers are completely imbedded in potting compound. The potting compound must be compliant enough to allow the core to expand as it heats up during operation, otherwise a stiff (hard) potting compound may cause the core to crack under compression as it expands. In applications using liquid oil insulation, pressure relief valves should be installed to avoid bursting due to overheating.

Insulation materials used for wire insulation are rated by volts per mil of thickness, thus a high voltage rated wire will require having much thicker insulation than the typical 600 VAC rated wire. Thicker insulation increases the wire's jacket diameter, which reduces the number of turns of wire per inch that can be wrapped around the core. This may impact the number of turns ($N_{RES}$) that can physically fit around the core 102 for the $W_{RES}$ 104 winding without increasing the size of the core 102 to accommodate a certain number of turns due to mechanical limitations.

The thickness of the dielectric material used for building the $C_{RES}$ 106 capacitor needs to have a minimum thickness based upon the breakdown voltage rating of the particular dielectric material used. As the dielectric thickness increases, the lower the resulting capacitance of the capacitor will be for a certain plate area. This may require larger plate area or more plate pairs in order to achieve the desired capacitance value. When more plate pairs are added, more dielectric material layers must also be added. Usually, the dielectric material is the most expensive part of building a high voltage capacitor. As the dielectric material thickness increases, the price of the material also increases.

After the FFC 114 adjusts the VBRG 622 voltage level by ±25% compensation to achieve the desired $P_{RES}$ level due to the $L_{RES}$ tolerance, then the operating flux level also changes by ±25%. Since $V_{RES}$ 170 can vary by ±25%, all of the circuitry and insulation involved with $V_{RES}$ 170 must be able to survive having the nominal $V_{RES}$ 170 operating voltage being adjusted above the intended design level in addition to any potential load surge induced voltage spikes along with some extra safety margin. The items affected by high $V_{RES}$ 170 voltage levels are as follows.

1) Wire insulation used in $W_{RES}$ winding 104 and any associated wire leads.
2) $C_{RES}$ 106 dielectric material breakdown voltage rating and dielectric material thickness used.
3) Breakdown voltage rating of materials used for safety insulating components such as plastic covers.
4) "Creepage" distances between $V_{RES}$ 170 and GND (chassis) connections.
5) Isolation voltage rating of current sensor 112.
6) Voltage rating of $C_{SERIES}$ 108 and $C_{SENSE}$ 110 that form AC voltage divider.
7) Insulating tape used to separate windings wound around the core 102.
8) Components in the bridge rectifiers 142 and 152 and PFC circuits 144 and 154 due to voltages across load windings 140 and 150 changing relative to the $V_{RES}$ 170 level.
9) Insulation voltage ratings and current capacity of wires used in load windings 140 and 150.

9. Selecting System Parameters

When selecting the basic parameters for designing an RCPS, several initial decisions must be considered, which will affect a majority of parameters selected later on. This section outlines a sequence of calculations that establish maximum and minimum limitations of the RCPS being implemented.

A careful study of the intended load must be made to decide upon how much power is consumed by the load, if there will be repetitious current surges, then how large and at what repetition rate.

The power consumed by the intended load, Watts.
The nature of the load in terms of anticipated peak current surges or peak voltage spikes if any as far as peak values and repetition rates.
A constant speed cooling fan or a well pump are likely to present a relatively consistent load. However, a laundry washing machine might be run with a heavy wash load or a light wash load, dictating a maximum and minimum nominal current consumption. A balanced load or an un-balanced load may cause peak current surges as an unbalanced wash load thumps back and forth on each tub revolution. The nature of the oscillating washtub agitation occurs at one or more different repetition rates and rotation speeds depending upon the selected setting and the cycle of operation such as wash, rinse, spin-dry etc. causing different repetition rates at various peak current surges.

A large manually operated engine lathe where a machinist with a heavy hand may jam the cutting tool into the workpiece causing an unexpected heavy current load and then suddenly retracting the tool quickly, causing a large back EMF voltage spike while a large massive rotating workpiece continues to spin. The machinist will change the spindle speed setting in accordance to workpiece diameter in order the accommodate cutting tool feed rates, which affects the repetition rate of current surges caused by discontinuous cuts or non-concentric workpieces.

The nature of the intended load in terms of anticipated repetitious peak current surges as far as peak load values and repetition rates affects the amount of power supplied by each EDC unit 120, 12 and 124 and the number of EDC units required to operate in tandem in order to recharge $P_{RES}$ in between peak power fluctuations caused by the load. For example, feeding a large AC inverter circuit will cause two peak current surges on every cycle at the inverter's output frequency if the inverter has a single-phase output whereas an inverter having a three-phase output will cause six current peaks per output cycle.

An example of a less predictable load surge repletion rate is to feed a large air compressor which causes a consistent current surge rate on each compression stroke of each cylinder based upon the motor's RPM. However, a peak current surge occurs each time the compressor turns on as the minimum reservoir tank pressure set point is triggered. How often this occurs depends upon the volume of air being drawn by the compressor's load.

The above parameters affect aspects of the specific RCPS design implementation. By knowing the maximum and minimum current load peaks aids in deciding what the nominal resonant operating power level should be. By knowing what the peak voltage of anticipated voltage spikes aids design of voltage spike suppression.

By knowing what the repetition rate between current surges aids in determining the following.

What the minimum resonant frequency should be. This determines the $L_{RES}$ and $C_{RES}$ values. The $L_{RES}$ inductance value determines the magnetic core geometry, magnetic material used and if the core needs to be gapped. The magnetic core material affects both the minimum and the maximum resonant frequency. Knowing the resonant frequency ($F_{RES}$) determines the skin depth which dictates the maximum useful wire size to be used and if multiple wires are needed or multiple PFC units, and if multiple EDC units are needed.

What the in-rush current level setting of each EDC unit 120, 122 and 124 should be and the minimum number of EDC units to be used in tandem. The in-rush current limit setting determines the wire size to use in the excitation windings 130, 132 and 134.

The acceptable $V_{RES}$ 170 peak voltage limit determines the minimum wire insulation thickness used for the resonant winding $W_{RES}$ 104 along with all connecting lead wires. The maximum allowed peak $V_{RES}$ 170 voltage determines the minimum safe thickness of the $C_{RES}$ 106 and $C_{SERIES}$ 108 dielectric material used. The minimum "creep" distance between contacts is also determined by the maximum peak voltage level of $V_{RES}$ 170.

The insulation thickness determines the wire insulation jacket diameter which dictates how many adjacent turns of wire can be wound per inch in the $W_{RES}$ 104 winding. This affects the maximum number of turns per layer wound in the resonant winding $W_{RES}$ 104. The number of layers needed to achieve the desired number of turns ($N_{RES}$) in the resonant $W_{RES}$ 104 winding may affect the decision between reducing the total number of turns to use for $N_{RES}$ versus increasing the physical size of the magnetic core 102 in order to mechanically accommodate more turns per layer.

10. Adjustable Resonant Capacitor

The minimum $L_{RES}$ inductane value due to the permeability tolerance of the core 102 determines the minimum $XL_{RES}$ value. The minimum $XL_{RES}$ value along with the maximum $V_{RES}$ 170 level determines the maximum $P_{RES}$ level that can be achieved. The product of the maximum RMS $I_{RES}$ 160 level along with the maximum RMS voltage level of $V_{RES}$ 170 provides insight as to whether or not the desired $P_{RES}$ level can be achieved. The maximum RMS current level of $I_{RES}$ 160 must be lower than the maximum current carrying capacity of the wire gauge being used for $W_{RES}$ 104 while taking into account skin-effect caused by $F_{RES}$.

The $C_{RES}$ 106 adjustable capacitor is made by implementing two capacitors in parallel, an adjustable capacitor ($C_{ADJ}$) in parallel with a fixed capacitor ($C_{FIXED}$). The maximum $L_{RES}$ inductane value due to the permeability tolerance of the core 102 determines the minimum $C_{RES}$ 106 adjustment value, $C_{RESmin}$. Mechanical limits of the adjustable CAD portion may cause a minimum setting limit due to the adjusting plates (vanes) having a small overlap. This overlap $C_{OVERLAP}$ causes an additional fixed capacitance amount being added to the minimum capacitance setting of $C_{RES}$ 106 as follows.

$$C_{RESmin} = \frac{1}{(2\pi \times F_{RES})^2 \times L_{RESmax}} + C_{OVERLAP}; \text{Farads} \qquad \text{eq. 10.1}$$

Where
$C_{RESmin}$=minimum value of $C_{RES}$ [106]; Farads
$F_{RES}$=natural resonant frequency of LC tank [104,106,108 and 110]; Hz
$L_{RESmax}$=inductance value of $W_{RES}$ [104] at maximum tolerance; henrys
$C_{OVERLAP}$=minimum setting value of $C_{ADJ}$ due to overlap; Farads The fixed capacitor is intentionally set to 5% smaller than the minimum $C_{RES}$ 106 adjusted value ($C_{RESmin}$ calculated by eq. 10.1).

$$C_{FIXED}=0.95 \times (C_{RESmin}-C_{OVERLAP}) \text{Farads} \qquad \text{eq. 10.2}$$

Where
$C_{FIXED}$=value of fixed portion of $C_{RES}$ [106]; Farads
$C_{RESmin}$=minimum value of $C_{RES}$ calculated by eq.10.1; Farads
$C_{OVERLAP}$=minimum setting value of $C_{ADJ}$ due to overlap; Farads The maximum adjustment setting of $C_{RES}$ 106 is determined by the minimum value of $L_{RES}$ as follows.

$$C_{RESmax} = \frac{1}{(2\pi \times F_{RES})^2 \times L_{RESmin}} \text{Farads} \qquad \text{eq. 10.3}$$

Where $C_{RESmax}$=maximum adjustment setting value of $C_{RES}$ [106]; Farads $F_{RES}$=natural resonant frequency of LC tank [104,106,108 and 110]; Hz $L_{RESmin}$=minimum value of $L_{RES}$ at minimum tolerance value; henrys The maximum adjustment range of $C_{RES}$ 106 is determined by the maximum value of the fixed portion ($C_{FIXED}$) of $C_{RES}$ 106 being the minimum adjustment value $C_{RESmin}$ while the maximum value of $C_{RES}$ 106 $C_{RESmax}$ is the combined capacitance of the fixed portion ($C_{FIXED}$) and the adjustable portion ($C_{ADJ}$) of $C_{RES}$ 106;

$$C_{ADJmax}=1.1 \times (C_{RESmax}-C_{FIXED}) \text{Farads} \qquad \text{eq.10.4}$$

Where $C_{ADJmax}$=maximum value of $C_{ADJ}$ portion of C_RES [106]; Farads $C_{RESmax}$=maximum value of $C_{RES}$ [106] calculated by eq.10.3; Farads $C_{FIXED}$=value of fixed portion of $C_{RES}$ [106] calculated by eq.10.2; Farads The result of this combination yields an adjustment range covering the full range needed by $C_{RES}$ 106 but with an extra 5% of adjustment range on either end. The extra 5% of adjustment allows setting $C_{RES}$ 106 to the calculated maximum or minimum values without reaching the mechanical limits of the capacitor.

Equations 10.1 through eq. 10.4 allows $C_{RES}$ 106 to be adjusted across the following range.

$$0.95 \times C_{RESmin} \leq C_{RES} \leq 1.05 \times C_{RESmax} \qquad \text{eq.10.5}$$

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the above described exemplary embodiments, but should be defined only in accordance with the following claims and equivalents thereof.

What is claimed is:

1. A resonant core power supply comprising:
   a core having magnetic properties and a controller;
   excitation, resonant, and load windings on the core;
   the resonant winding galvanically isolated from the load winding;
   the excitation winding receiving an excitation signal to cause an excitation flux flow;
   the resonant winding connected to a resonant capacitor to form a tank circuit having a constant resonant frequency $F_{RES}$ that equals an excitation signal frequency;
   the excitation flux flow passes through the resonant winding to induce a voltage therein;
   the excited resonant winding causes a resonant flux flow which resonates with the tank circuit;
   the resonant flux flow passes through the load winding to induce a voltage therein and to power an electrical load; and,
   sensors including ones that a) sense current through the resonant winding and b) sense voltage across the resonant capacitor;
   wherein a) the sensors provide controller feedback to influence phase, amplitude, and waveform of the excitation signal to maintain phase, amplitude, and waveform of the resonant flux flow and b) the core does not saturate.

2. The resonant core power supply of claim 1 operated to accumulate core flux, core flux being accumulated by advancing the phase of the excitation signal with respect to the phase of the core flux such that there is compensation for hysteresis delay of the core.

3. The resonant core power supply of claim 2 wherein the phase of the excitation signal is determined by the zero crossing of the waveform of the core flux.

4. The resonant core power supply of claim 1 operated to decrease flux flowing in the core, a) the phase of the excitation signal with respect to a core flux phase being advanced and b) the excitation signal being shifted by 180 degrees such that the excitation flux flow is out of phase with the existing resonant flux flowing the core.

5. The resonant core power supply of claim 4 operated such that the phase of the excitation signal is determined at least in part by the zero crossing of the waveform of the core flux.

6. The resonant core power supply of claim 1 further comprising:
   the controller with facilities detecting remanent DC core flux; and,
   the controller with facilities adjusting a duty cycle of an excitation signal waveform to decrease the remanent DC core flux;
   wherein the excitation signal is not from an inverter and a repetitive excitation voltage waveform between 0 and 360 degrees has a 180 degree zero crossing and the duty cycle of the waveform is modulated to compensate for remanent DC core flux.

7. The resonant core power supply of claim 6 wherein a portion of the waveform between 0 and 180 degrees is centered at 90 degrees.

8. The resonant core power supply of claim 7 wherein the portion of the waveform between 180 and 360 degrees is centered at 270 degrees.

9. The resonant core power supply of claim 1 further comprising:
   an excitation drive circuit (EDC) driving the excitation winding having provision to limit its output current; and,
   when a tank circuit inrush current exceeds an EDC current limit setting, the EDC operative to limit inrush current such that tank circuit capacitor charge rate is limited until tank circuit current demand does not exceed the EDC current setting.

10. The resonant core power supply of claim 9 wherein an EDC current supply to the tank circuit utilizes H bridge circuits to switch an EDC excitation voltage polarity.

11. The resonant core power supply of claim 10 wherein inrush current to the tank circuit is limited by a reference voltage from the controller.

12. The resonant core power supply of claim 11 wherein the reference voltage determines a tank circuit current limit and drives an op amp in a servo loop to control a MOSFET interconnecting an H bridge return, an excitation current sink having a current sense resistor such that the voltage across the current sense resistor tends to match the reference voltage.

13. The resonant core power supply of claim 1 further comprising:
    the controller with facilities detecting positive remanent DC core flux;

the controller with facilities adjusting a duty cycle of an excitation signal waveform to decrease a positive remanent DC core flux; and, the waveform modulated to compensate for remanent flux;

wherein the waveform a) is non-sinusoidal and approximates a square wave between 0 and 360 degrees with a 180 degree zero crossing, b) between 0 and 180 degrees is at 0 volts or positive voltages, c) between 180 and 360 degrees is at 0 volts or negative voltages, and d) between 0 and 180 degrees is narrow as compared to the waveform between 180 and 360 degrees.

14. The resonant power supply of claim 11 wherein the portion of the waveform between 0 and 180 degrees is centered at 90 degrees.

15. The resonant power supply of claim 12 wherein the portion of the waveform between 180 and 360 degrees is centered at 270 degrees.

16. The resonant power supply of claim 1 further comprising:

the controller with facilities detecting negative remanent DC core flux; and, the controller with facilities adjusting the duty cycle of an excitation signal waveform to decrease a negative remanent DC core flux;

wherein an excitation voltage waveform approximates a square wave between 0 and 360 degrees with a 180 degree zero crossing, the portion of the wave between 0 and 180 degrees at 0 volts or positive voltages being wide as compared to the portion of the wave at 0 volts or negative voltages between 180 and 360 degrees.

17. The resonant power supply of claim 14 wherein the portion of the waveform between 0 and 180 degrees is centered at 90 degrees.

18. The resonant power supply of claim 15 wherein the portion of the waveform between 180 and 360 degrees is centered at 270 degrees.

19. A resonant core power supply comprising:

a core having magnetic properties and a controller;

excitation, resonant, and load windings on the core;

the excitation winding receiving an excitation signal to cause an excitation flux flow;

the resonant winding connected to a resonant capacitor to form a tank circuit having a resonant frequency $F_{RES}$ that equals an excitation signal frequency;

the excitation flux flow passes through the resonant winding to induce a voltage therein;

the excited resonant winding causes a resonant flux flow which resonates with the tank circuit;

the resonant flux flow passes through the load winding to induce a voltage therein and to power an electrical load; and, sensors including ones that a) sense current through the resonant winding and b) sense voltage across the resonant capacitor;

wherein a) the sensors provide controller feedback to influence phase, amplitude, and waveform of the excitation signal to maintain phase, amplitude, and waveform of the resonant flux flow, b) an inrush current to the tank circuit is limited by a reference voltage from the controller, c) the reference voltage determines a tank circuit current limit and drives an op amp in a servo loop to control a MOSFET interconnecting an H bridge return, d) an excitation current sink having a current sense resistor such that the voltage across the current sense resistor tends to match the reference voltage, and e) the core does not saturate.

* * * * *